US006861698B2

(12) United States Patent
Wang

(10) Patent No.: US 6,861,698 B2
(45) Date of Patent: Mar. 1, 2005

(54) ARRAY OF FLOATING GATE MEMORY CELLS HAVING STRAP REGIONS AND A PERIPHERAL LOGIC DEVICE REGION

(75) Inventor: Chih Hsin Wang, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 61 days.

(21) Appl. No.: 10/192,291

(22) Filed: Jul. 9, 2002

(65) Prior Publication Data

US 2003/0139010 A1 Jul. 24, 2003

Related U.S. Application Data

(60) Provisional application No. 60/360,293, filed on Feb. 26, 2002, and provisional application No. 60/351,744, filed on Jan. 24, 2002.

(51) Int. Cl.$^7$ .............................................. H01L 29/788
(52) U.S. Cl. ................................................... 257/316
(58) Field of Search ............................... 257/315–324, 257/316–321; 438/257–267

(56) References Cited

U.S. PATENT DOCUMENTS

| | | |
|---|---|---|
| 4,757,360 A | 7/1988 | Farone |
| 4,794,565 A | 12/1988 | Wu et al. |
| 4,882,707 A | 11/1989 | Mizutani |
| 4,931,847 A | 6/1990 | Corda |
| 4,947,221 A | 8/1990 | Stewart et al. |
| 5,021,848 A | 6/1991 | Chiu |
| 5,029,130 A | 7/1991 | Yeh |
| 5,041,886 A | 8/1991 | Lee |

(List continued on next page.)

FOREIGN PATENT DOCUMENTS

EP      0 389 721 A2    10/1990

OTHER PUBLICATIONS

S. Ogura, A. Hori, J. Kato et al., "Low Voltage, Low Current, High Speed Program Step Split Gate Cell with Ballistic Direct Injection for EEPROM/Flash", 0–7803–4777, IEEE, Mar. 1998.

C.–P. Chang, H.–H Vuong et al., "SALVO Process for Sub–50 nm Low–$V_T$ Replacement Gate CMOS with KrF Lithography", 0–7803–6441, IEEE, Apr. 2000.

A. Yagishita, S. Tomohiro et al., "Reduction of Threshold Voltage Deviation in Damascene Metal Gate MOSFETs", 0–7803–5413, IEEE, 3/99.

S. Ogura, A. Hori, J. Kato et al., "Low Voltage, Low Current, High Speed Program Step Split Gate Cell with Ballistic Direct Injection for EEPROM/Flash", 0–7803–4777, IEEE, Mar. 1998.

C.–P. Chang, H.–H. Vuong et al., "SALVO Process for Sub–50 nm Low–$V_r$ Replacement Gate CMOS with KrF Lithography", 0–7803–6441, IEEE, Mar. 2000.

A Yagishita, S. Tomohiro et al., "Reduction of Threshold Voltage Deviation in Damascene Meta Gate MOSFETs", 0–7803–5413, IEEE, Mar. 1999.

*Primary Examiner*—Richard A. Booth
(74) *Attorney, Agent, or Firm*—Gray Cary Ware & Freidenrich LLP

(57) ABSTRACT

A self aligned method of forming a semiconductor memory array of floating gate memory cells in a semiconductor substrate having a plurality of spaced apart isolation regions and active regions on the substrate substantially parallel to one another in the column direction, and an apparatus formed thereby. Floating gates are formed in each of the active regions. In the row direction, trenches are formed that are filled with a conducting material such as metal or metalized polysilicon to form blocks of the conducting material that constitute source lines. Each source line extends over and is electrically connected to one of the source regions in each of the active regions.

13 Claims, 44 Drawing Sheets

U.S. PATENT DOCUMENTS

| | | | |
|---|---|---|---|
| 5,101,250 A | 3/1992 | Arima et al. | |
| 5,268,319 A | 12/1993 | Harari | |
| 5,429,965 A | 7/1995 | Shimoji | |
| 5,544,103 A | 8/1996 | Lambertson | |
| 5,572,054 A | 11/1996 | Wang et al. | |
| 5,741,719 A * | 4/1998 | Kim | 438/257 |
| 5,780,341 A | 7/1998 | Ogura | |
| 5,780,892 A | 7/1998 | Chen | |
| 5,783,471 A * | 7/1998 | Chu | 438/257 |
| 5,783,473 A * | 7/1998 | Sung | 438/265 |
| 5,789,293 A | 8/1998 | Cho et al. | |
| 5,796,139 A | 8/1998 | Fukase | |
| 5,808,328 A | 9/1998 | Nishizawa | |
| 5,811,853 A | 9/1998 | Wang | |
| 5,814,853 A | 9/1998 | Chen | |
| 5,994,184 A * | 11/1999 | Fukumoto | 438/257 |
| 6,037,228 A * | 3/2000 | Hsu | 438/279 |
| 6,071,802 A | 6/2000 | Ban et al. | |
| 6,091,104 A | 7/2000 | Chen | |
| 6,103,573 A | 8/2000 | Harari et al. | |
| 6,140,182 A | 10/2000 | Chen | |
| 6,222,227 B1 | 4/2001 | Chen | |
| 6,255,164 B1 * | 7/2001 | Liu et al. | 438/257 |

* cited by examiner

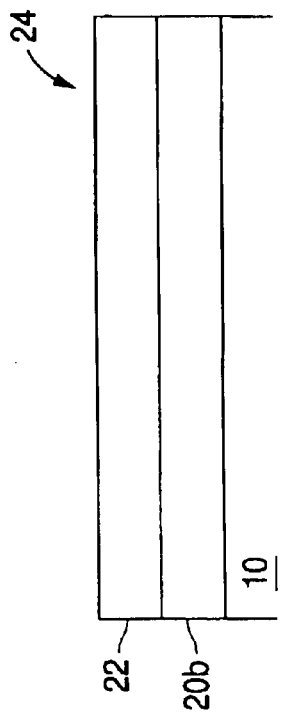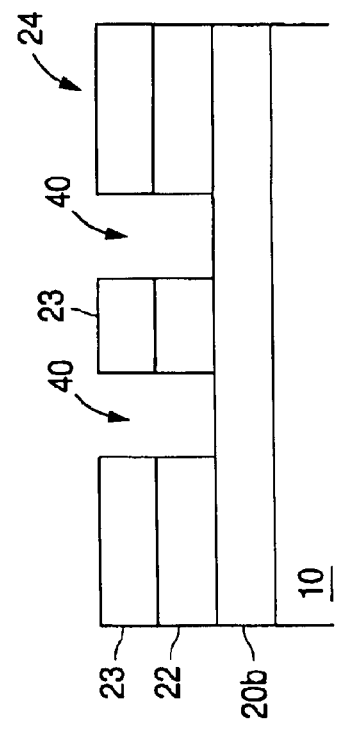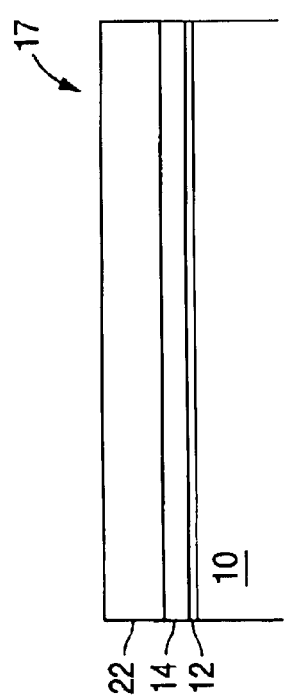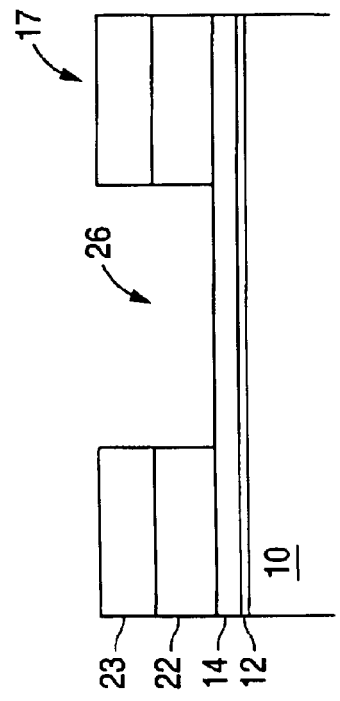

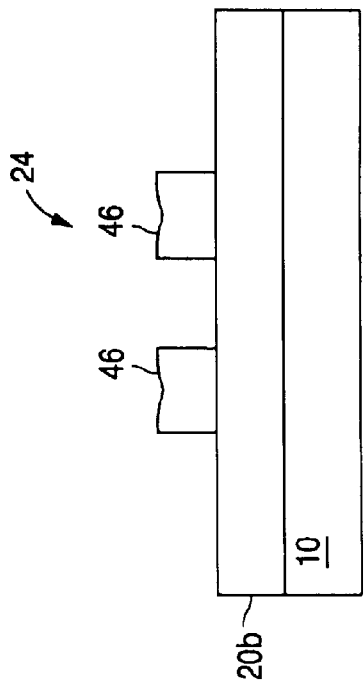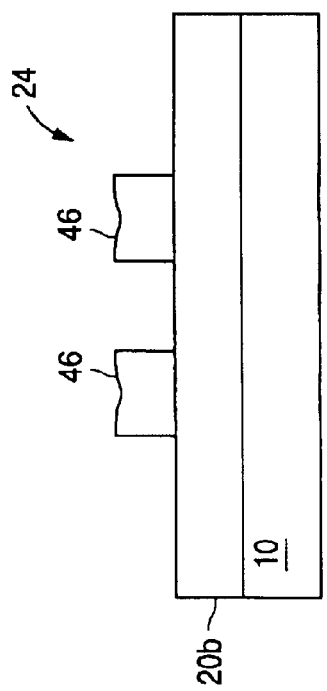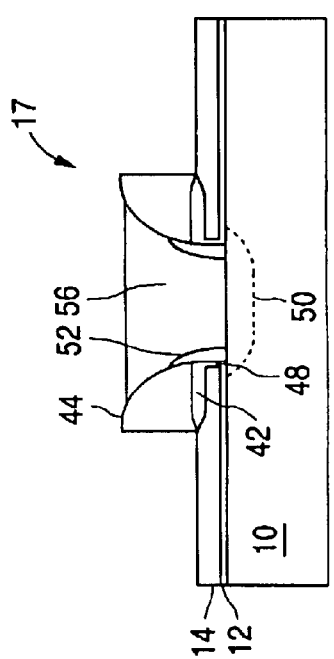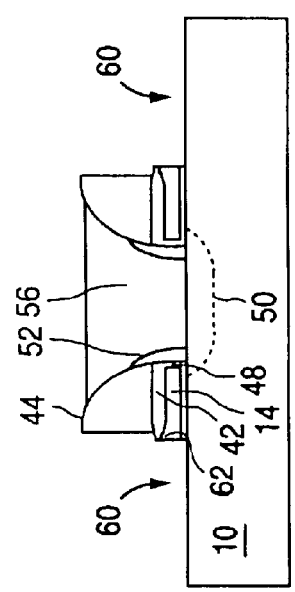

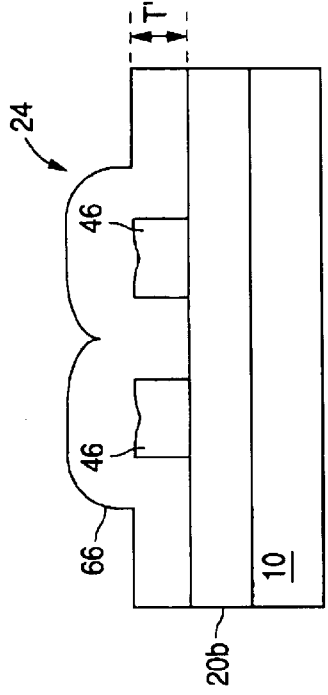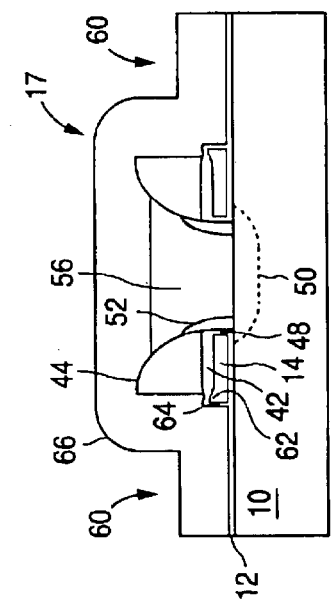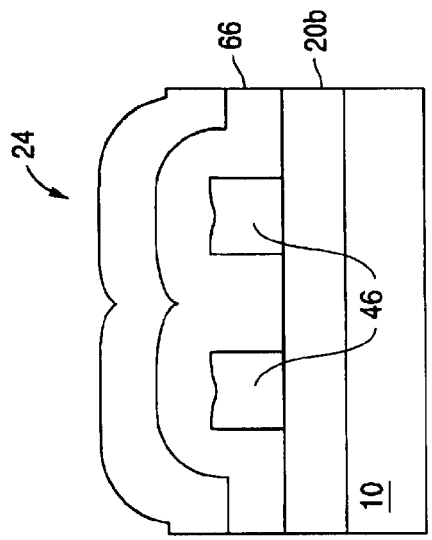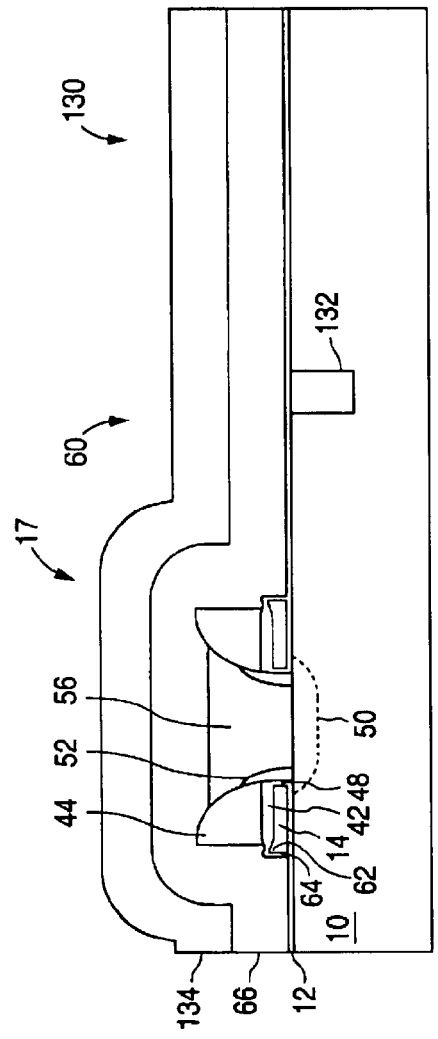

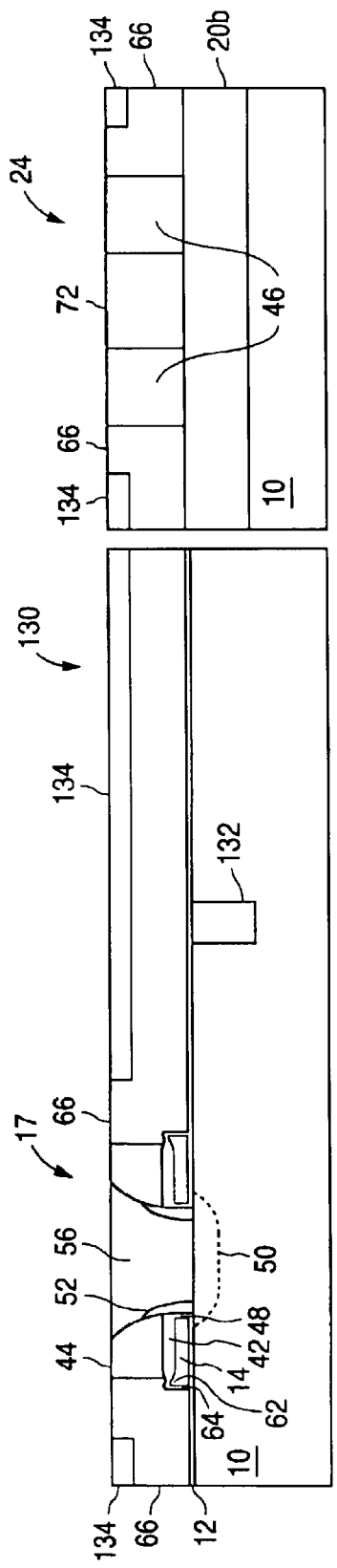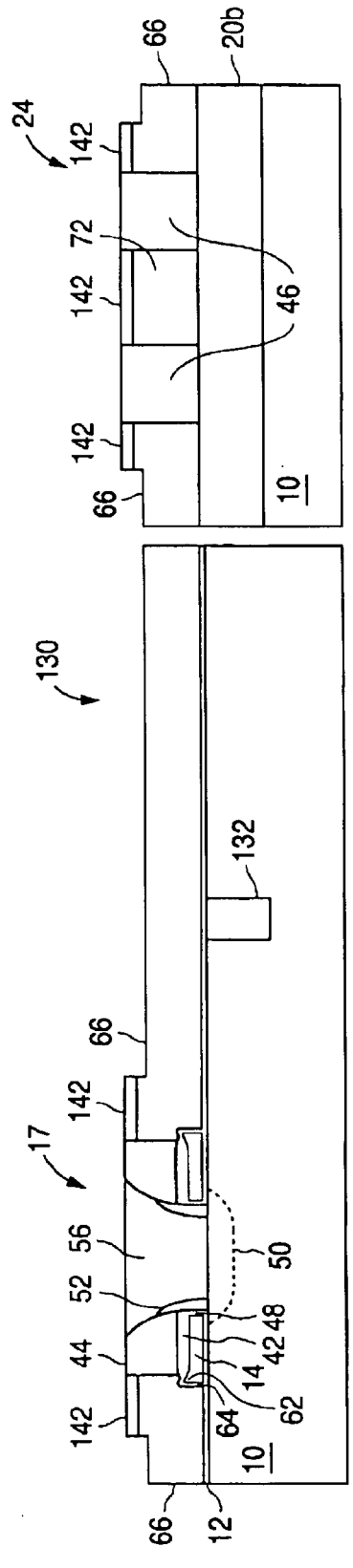

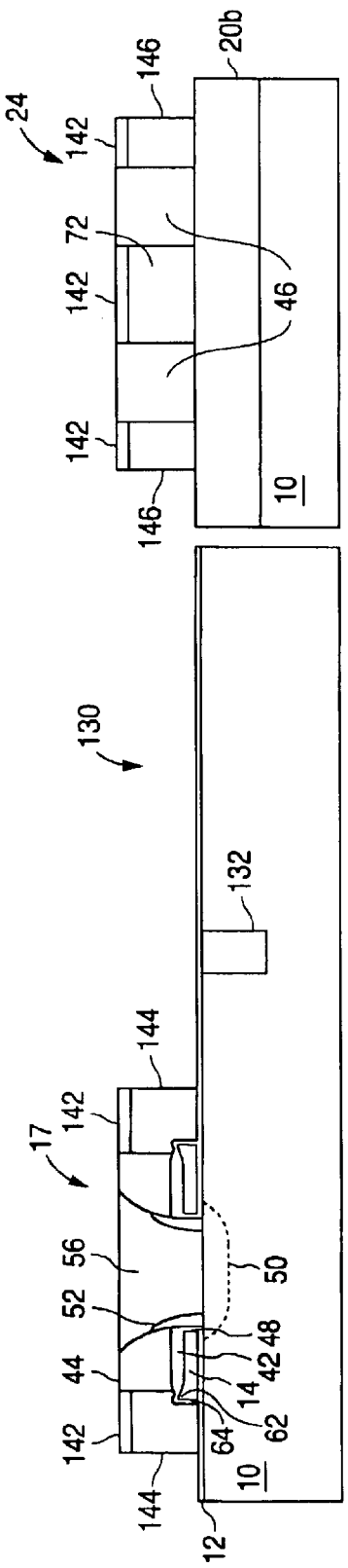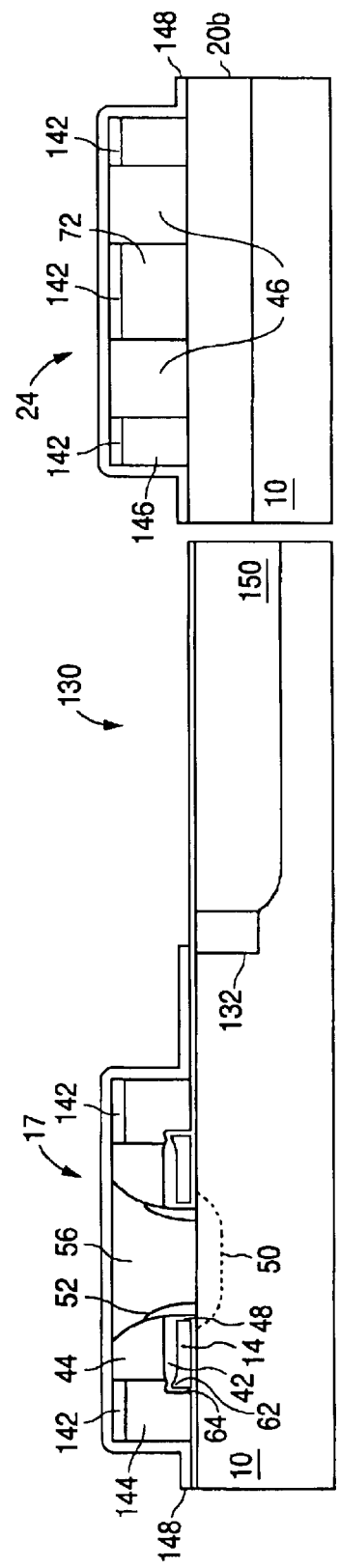

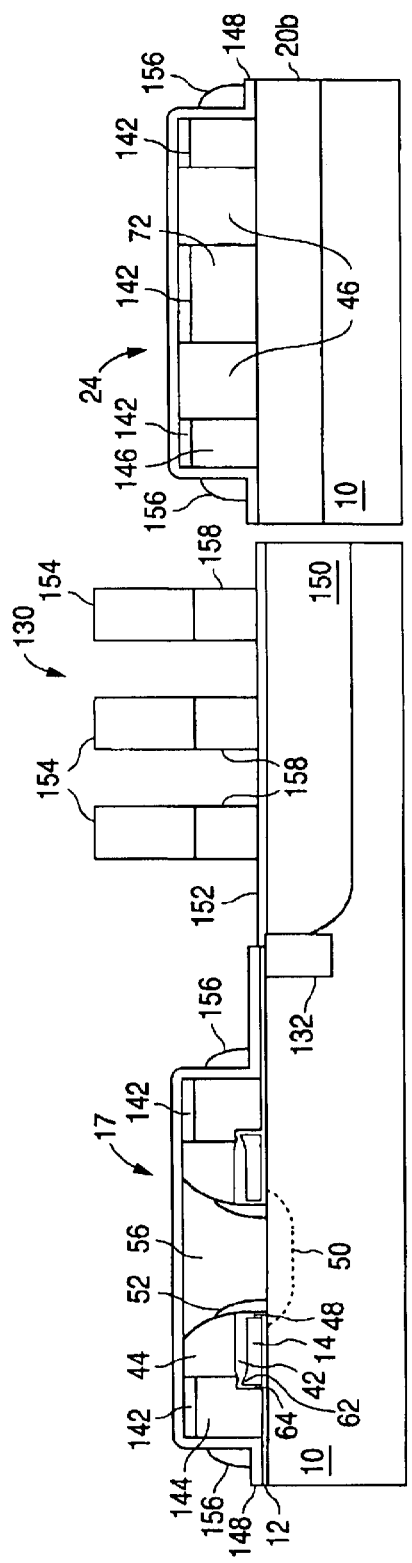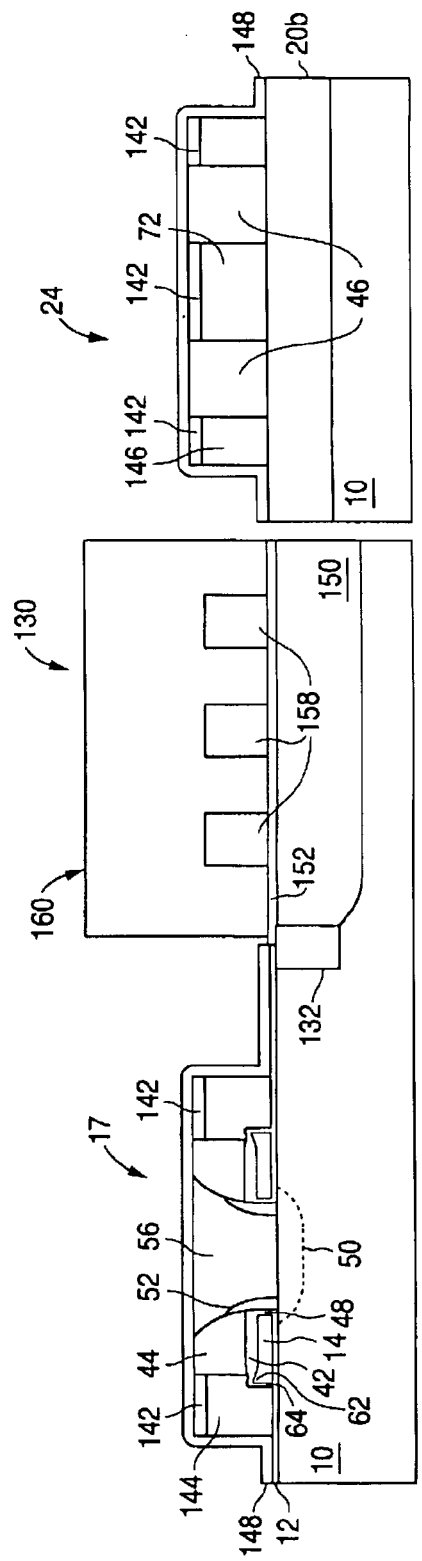

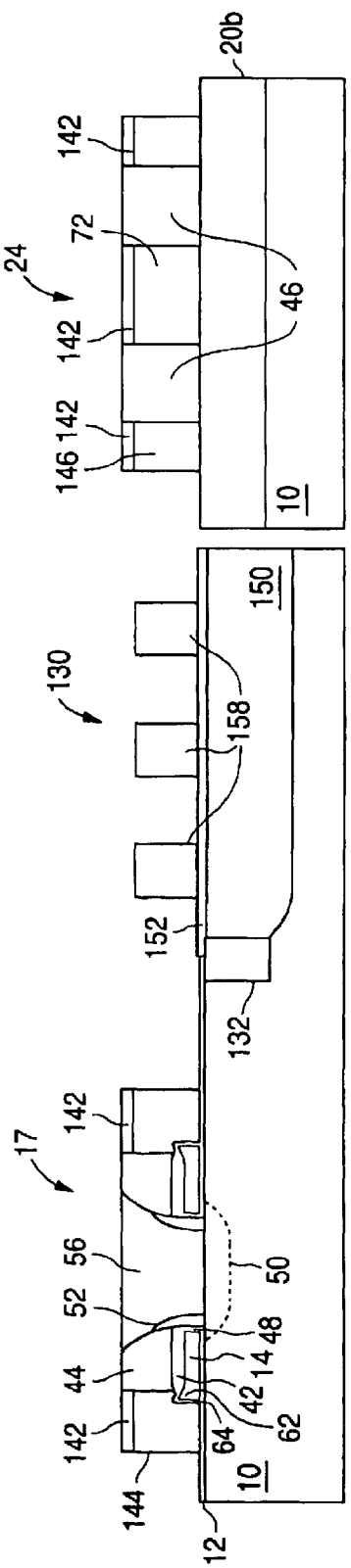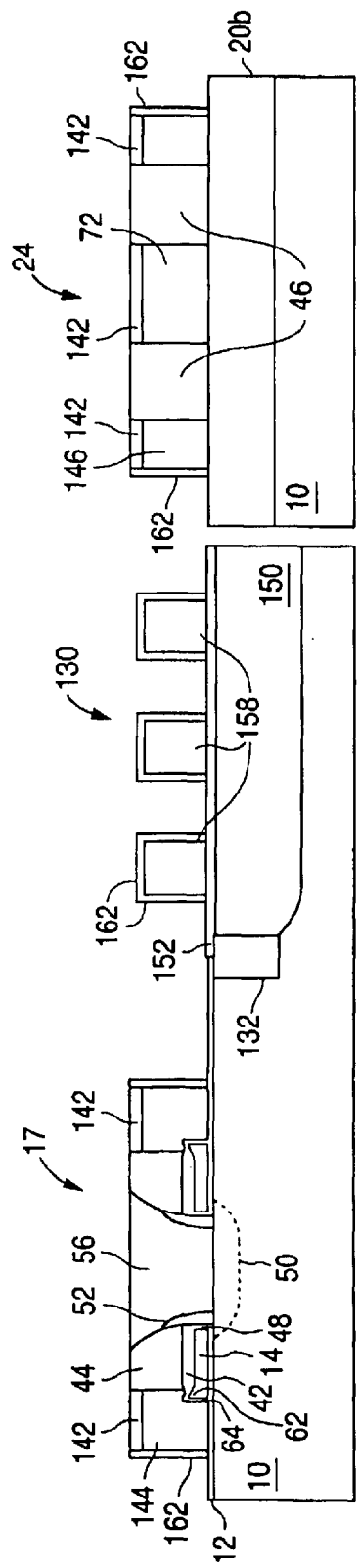

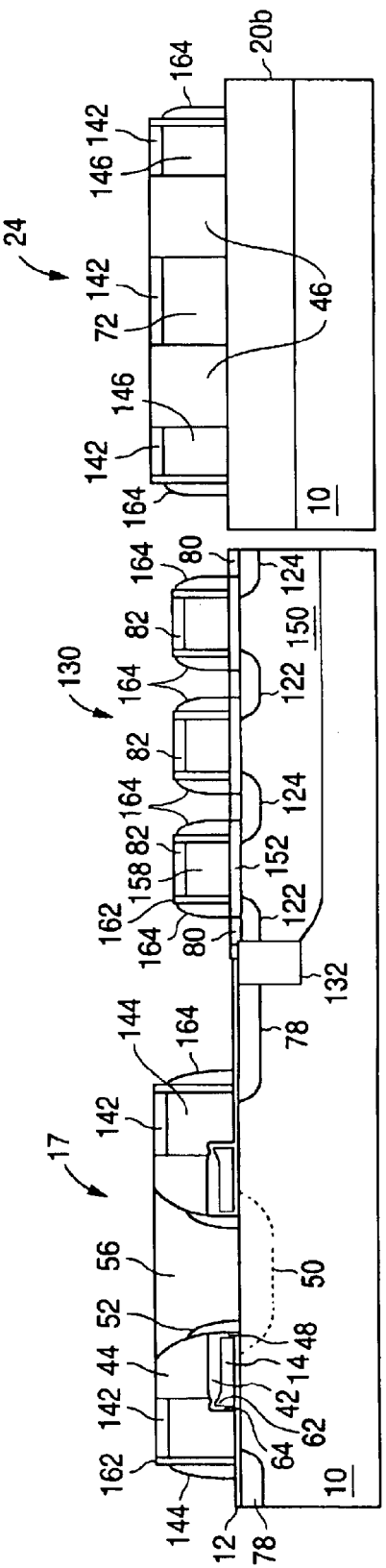
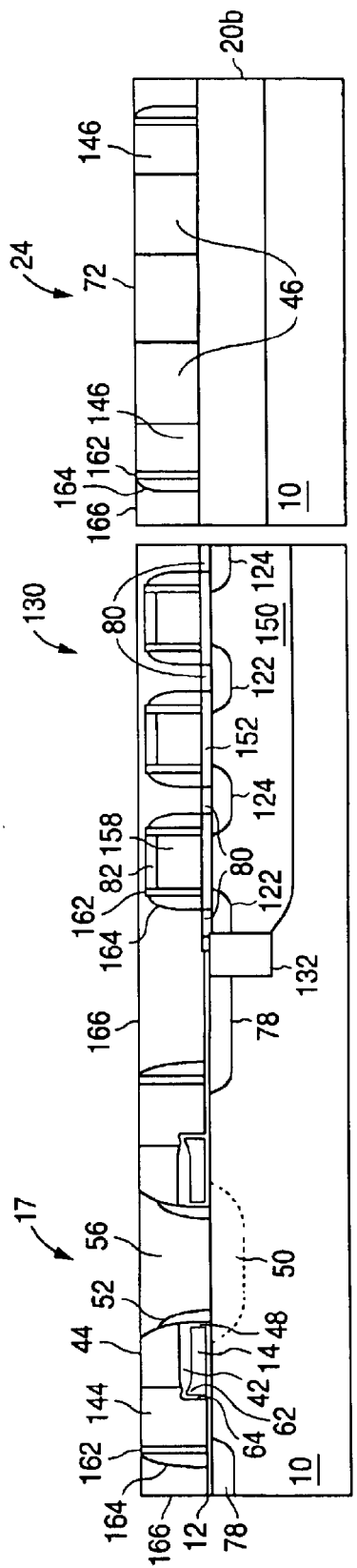
FIG. 3U
FIG. 4U
FIG. 3V
FIG. 4V

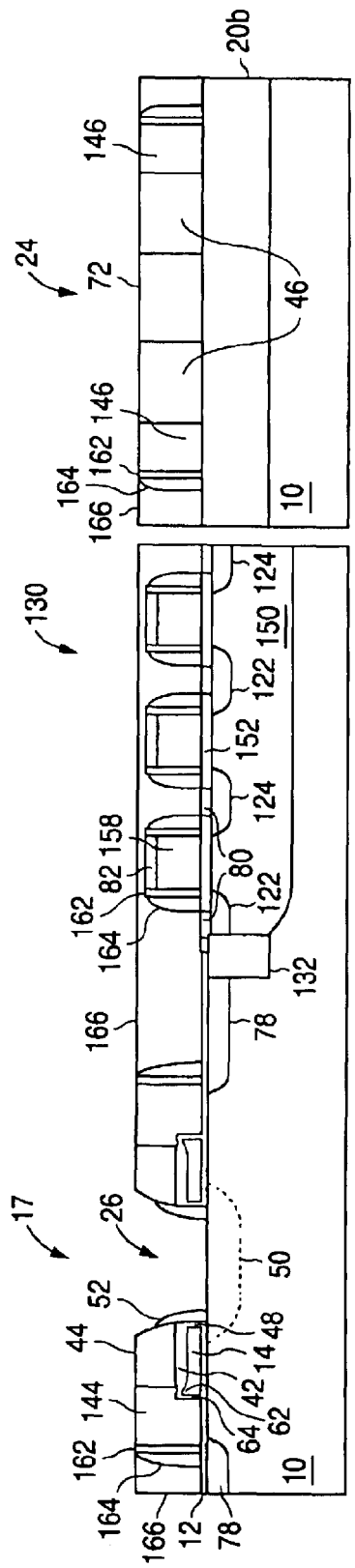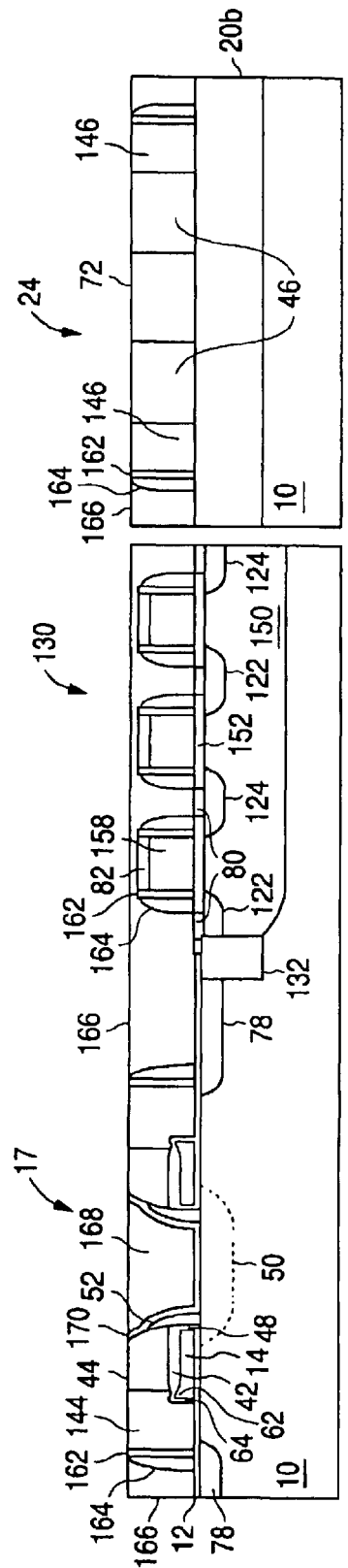
FIG. 3W  FIG. 4W  FIG. 3X  FIG. 4X

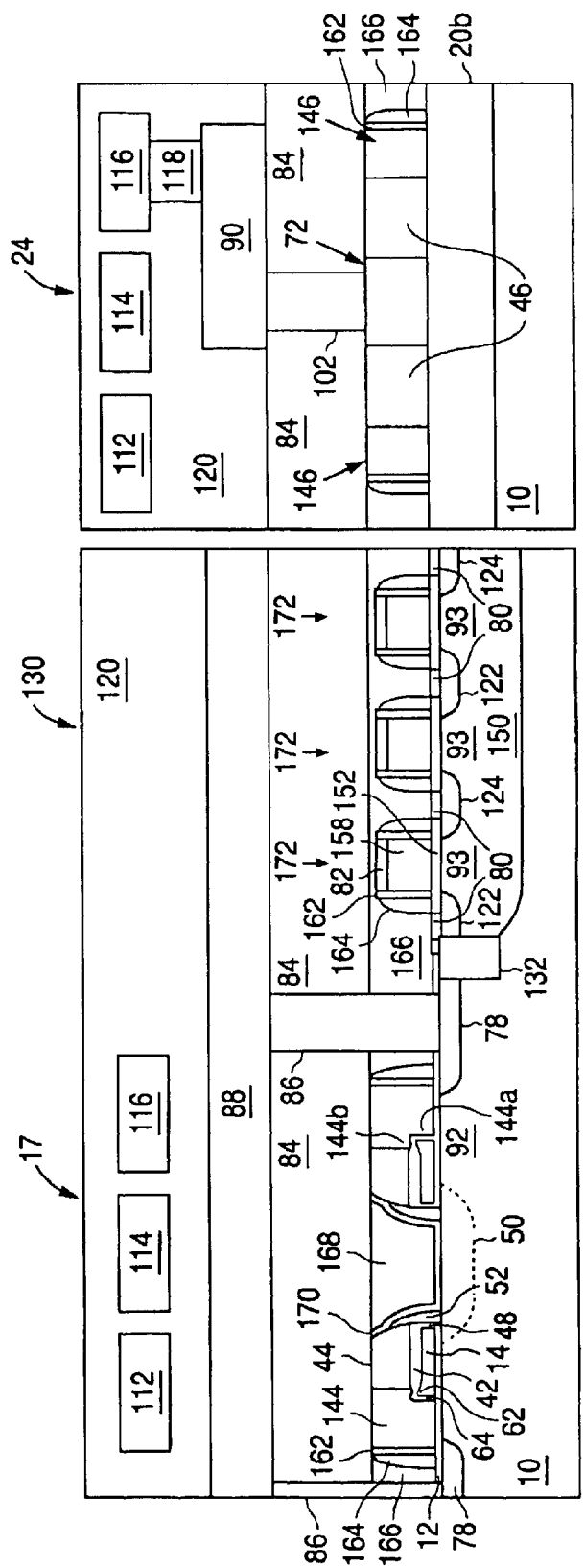

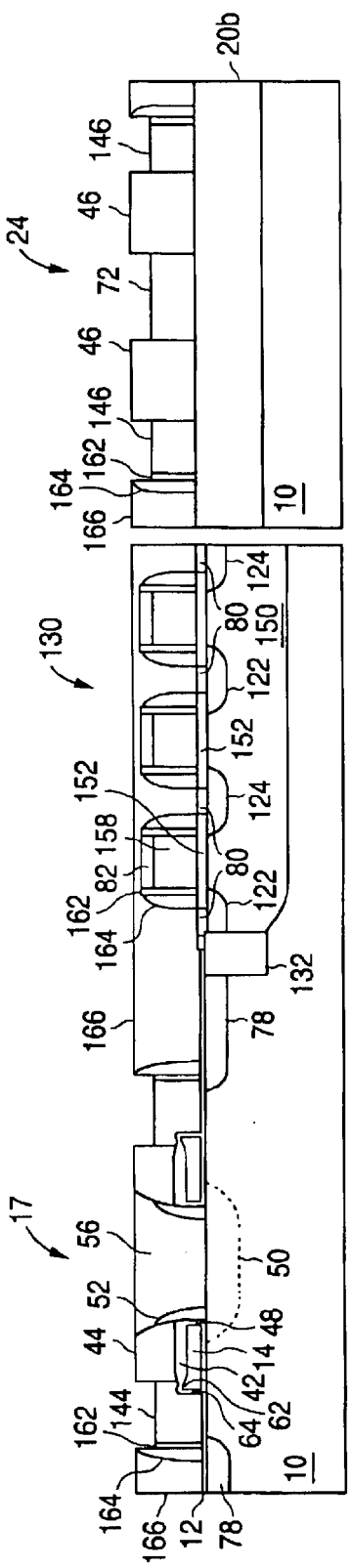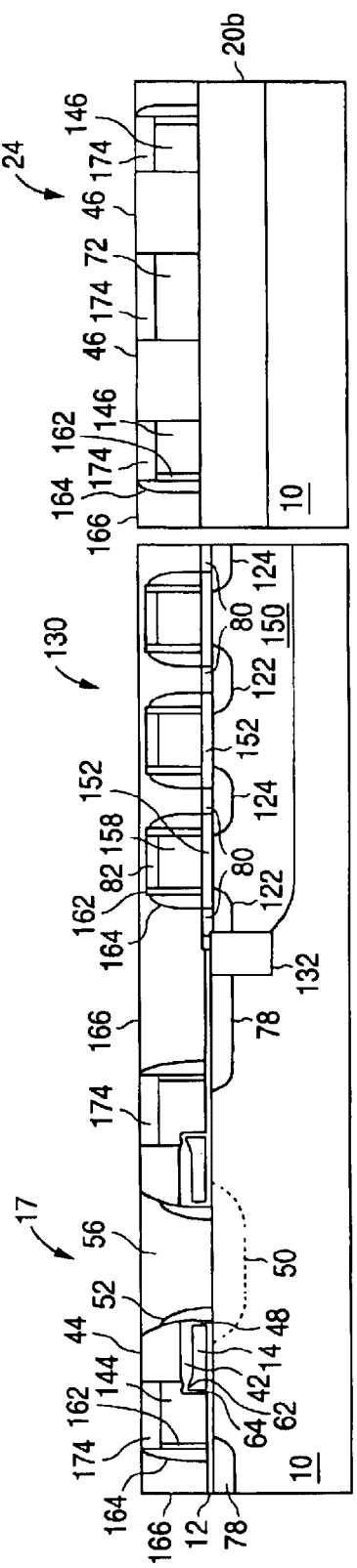

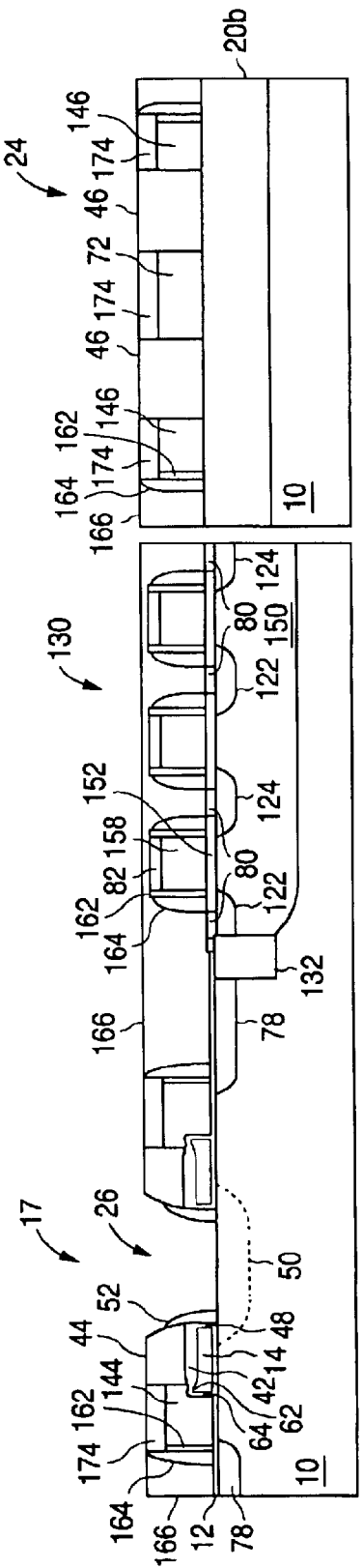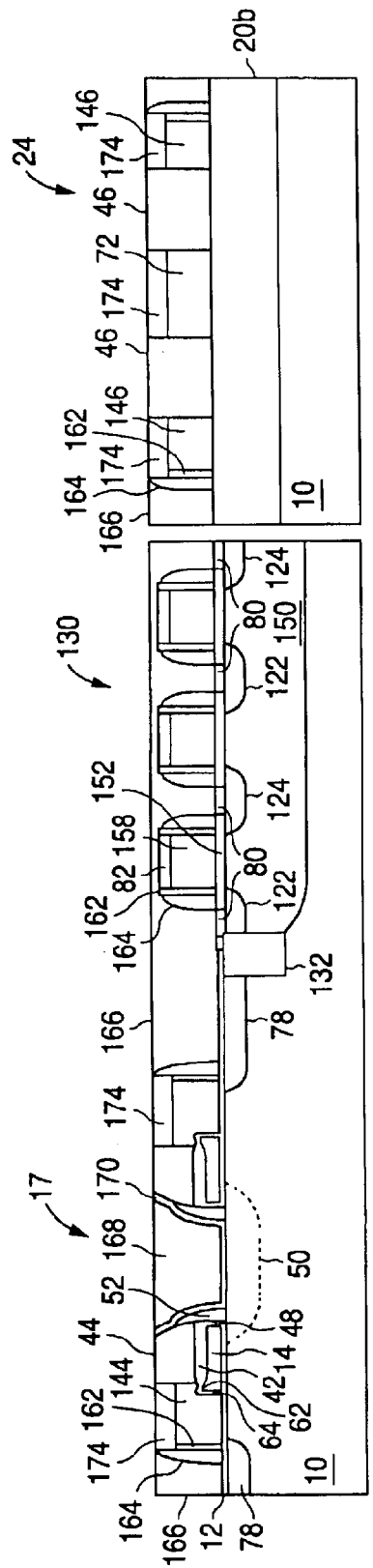

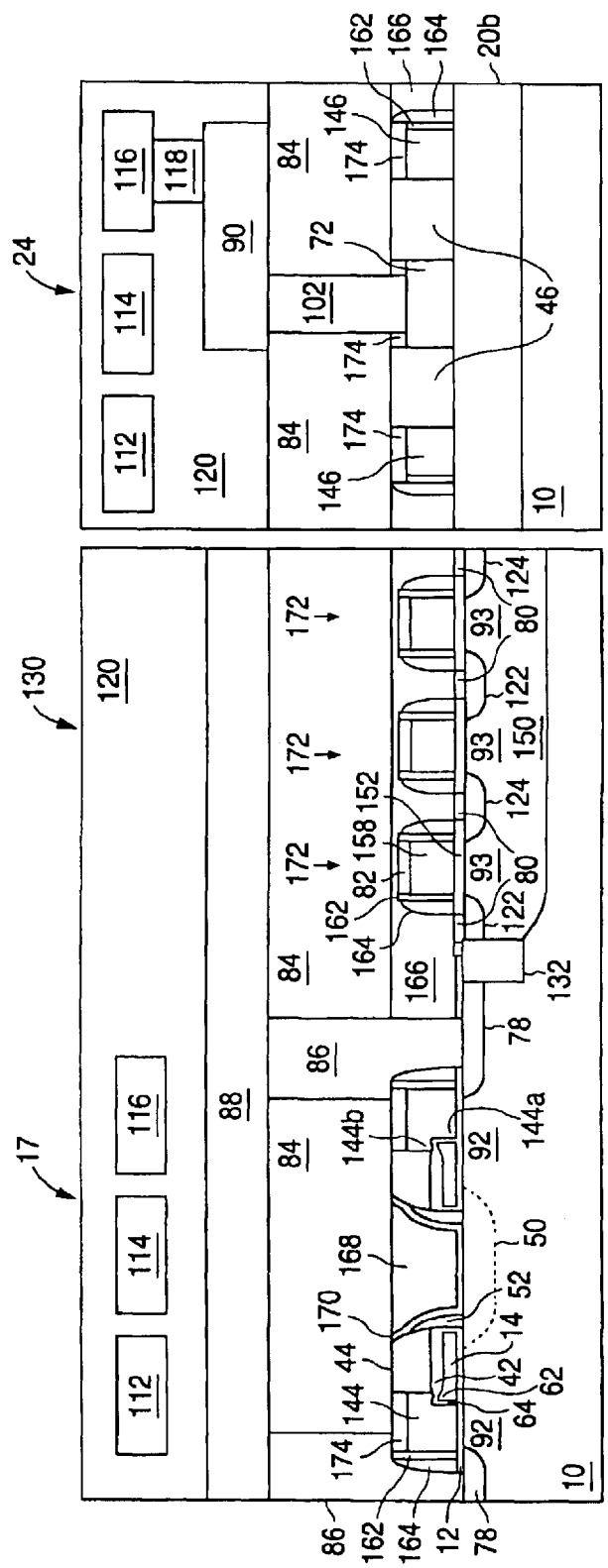

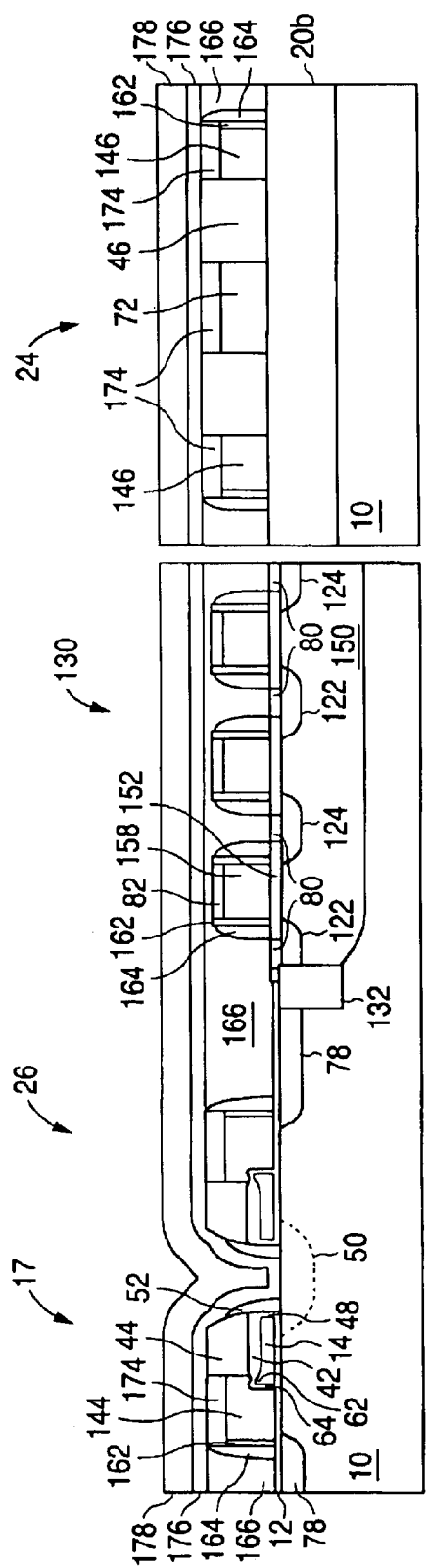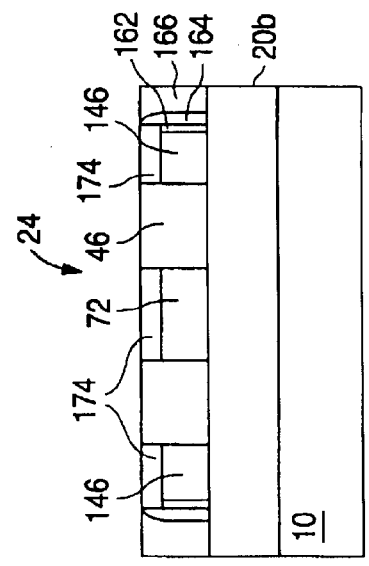
FIG. 15A
FIG. 16A
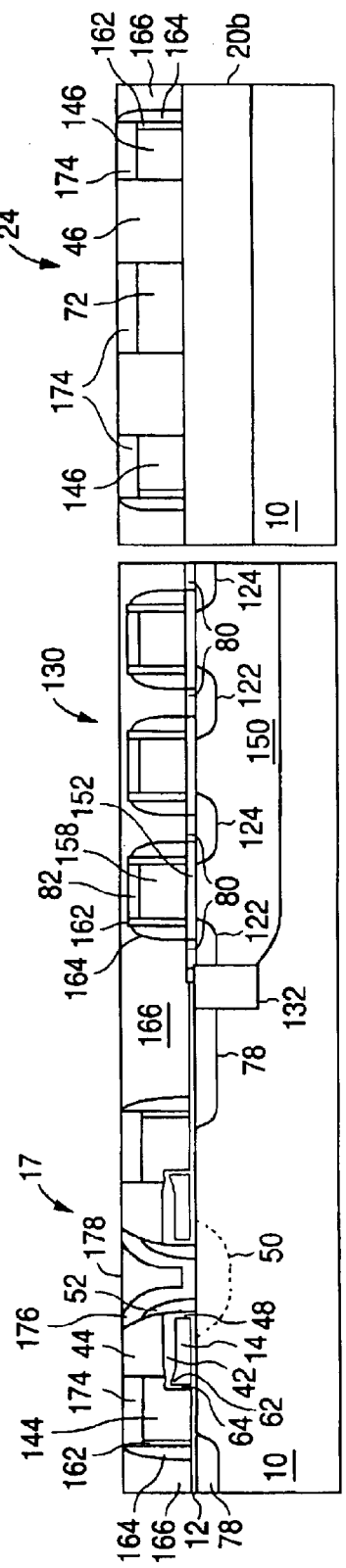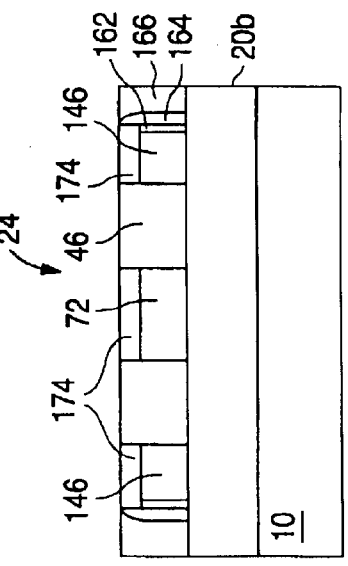
FIG. 15B
FIG. 16B

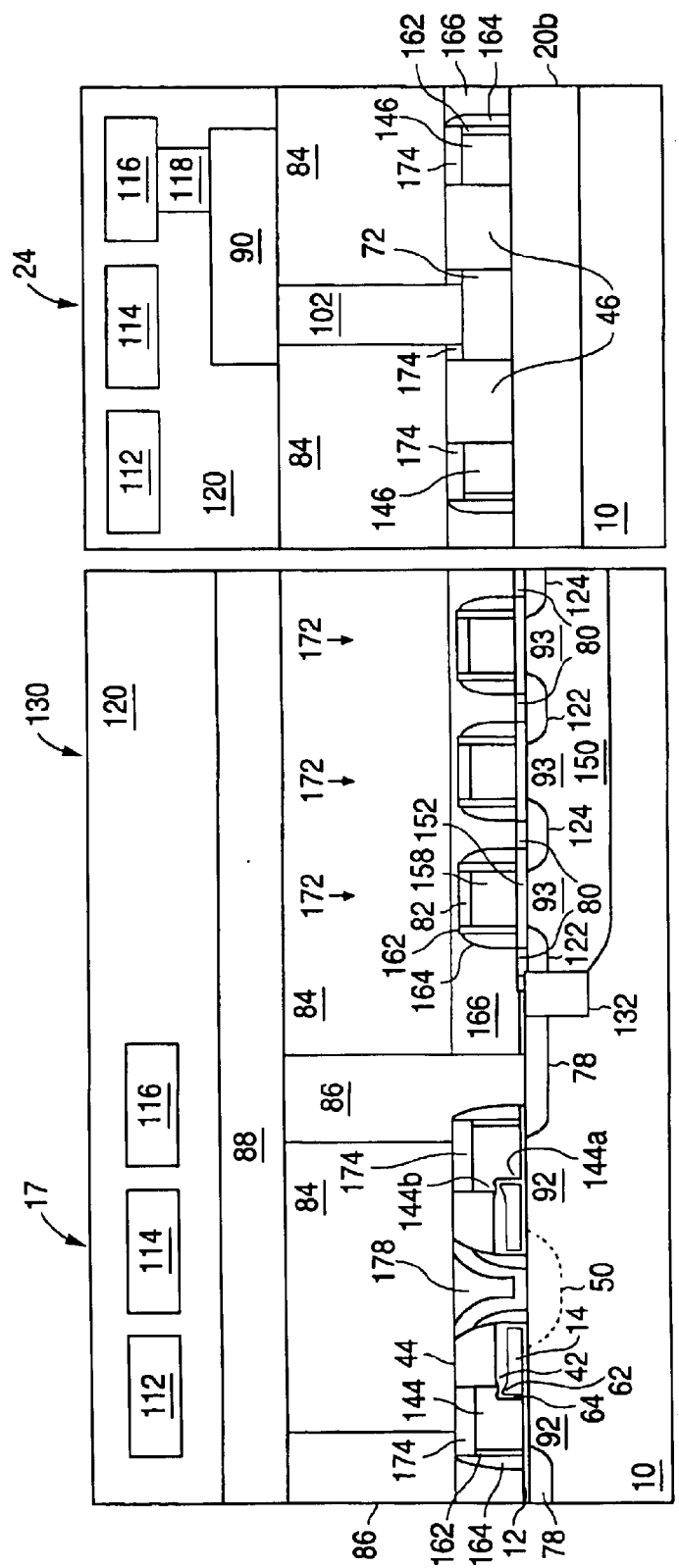

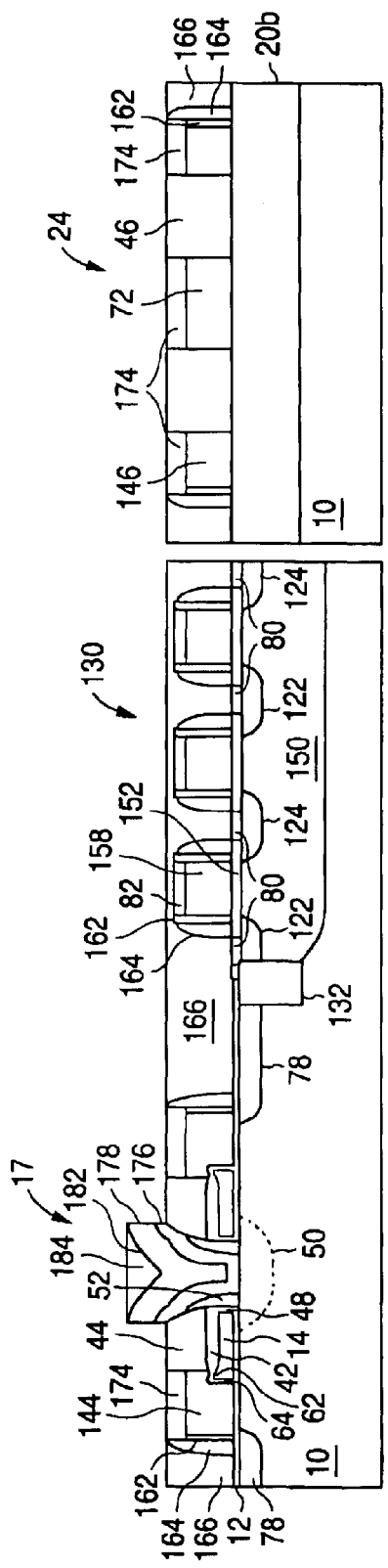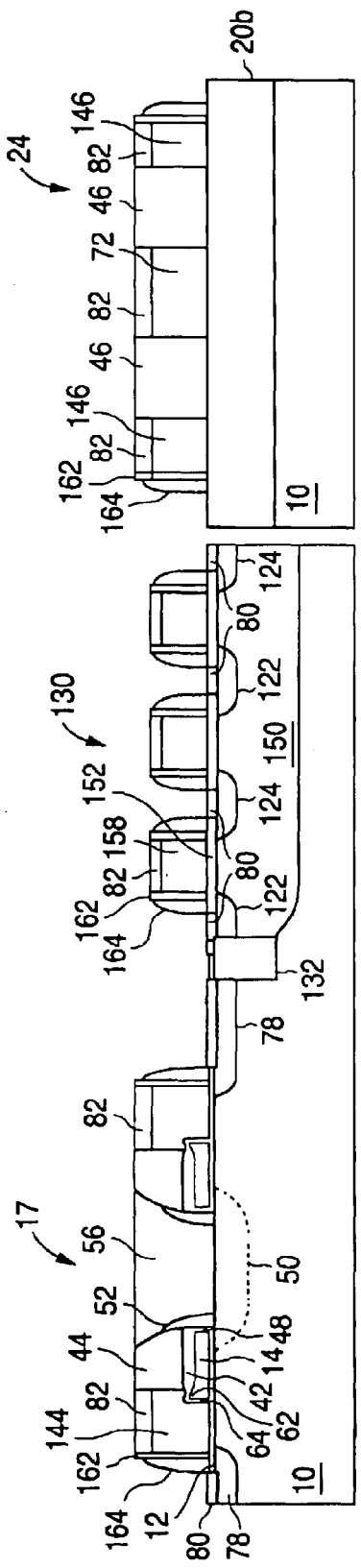

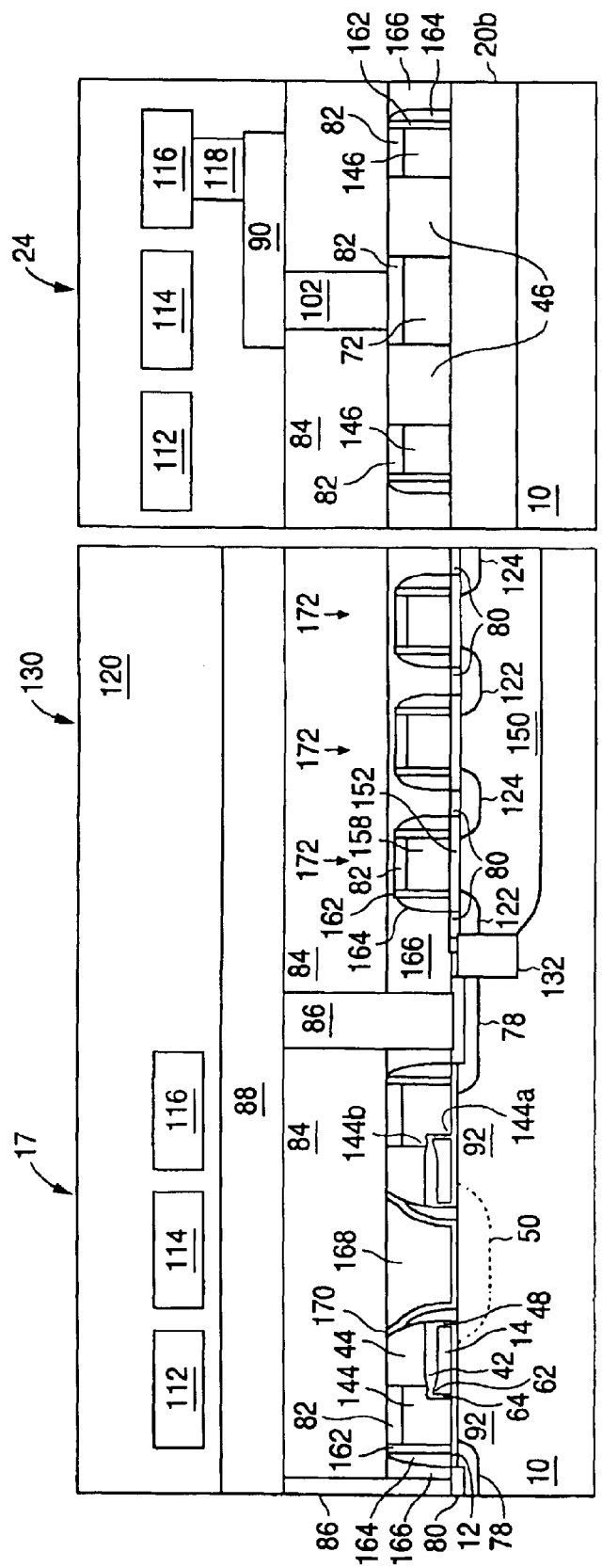

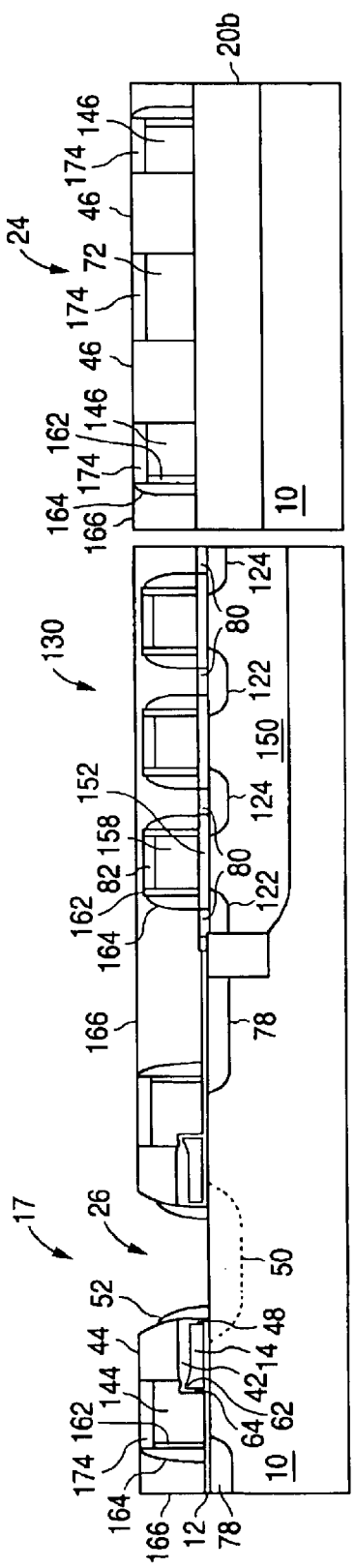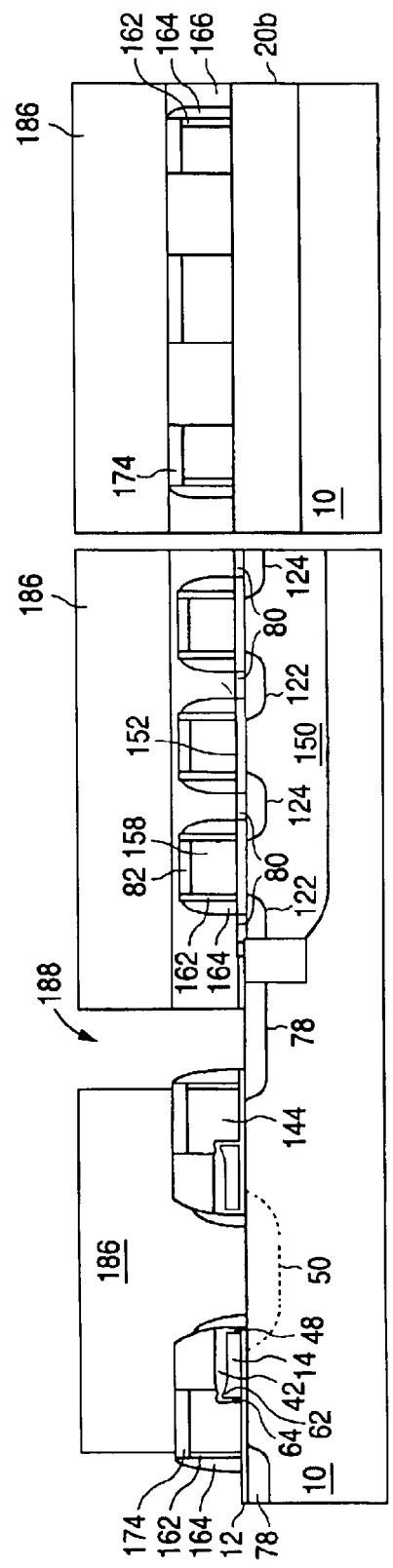

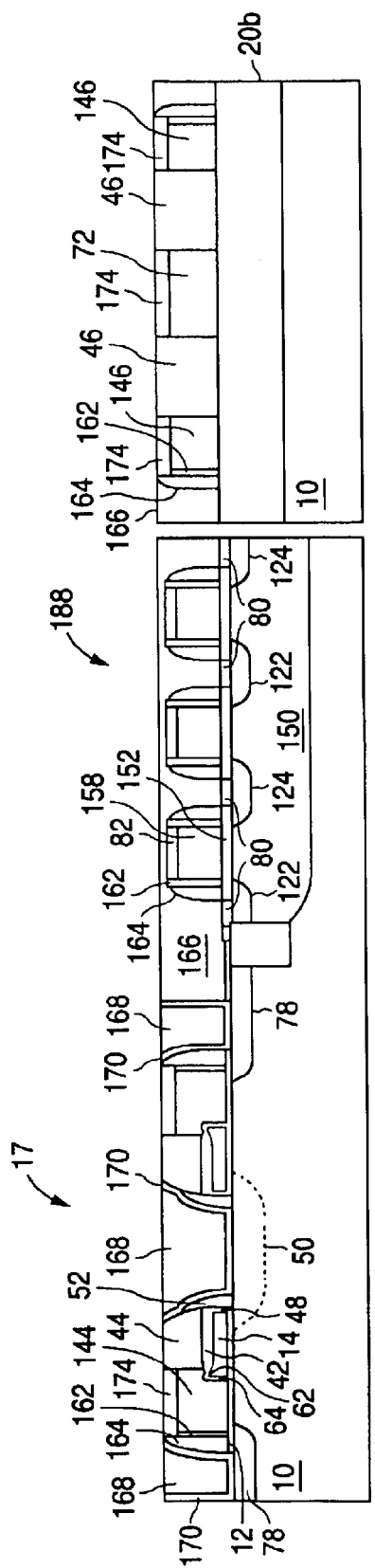

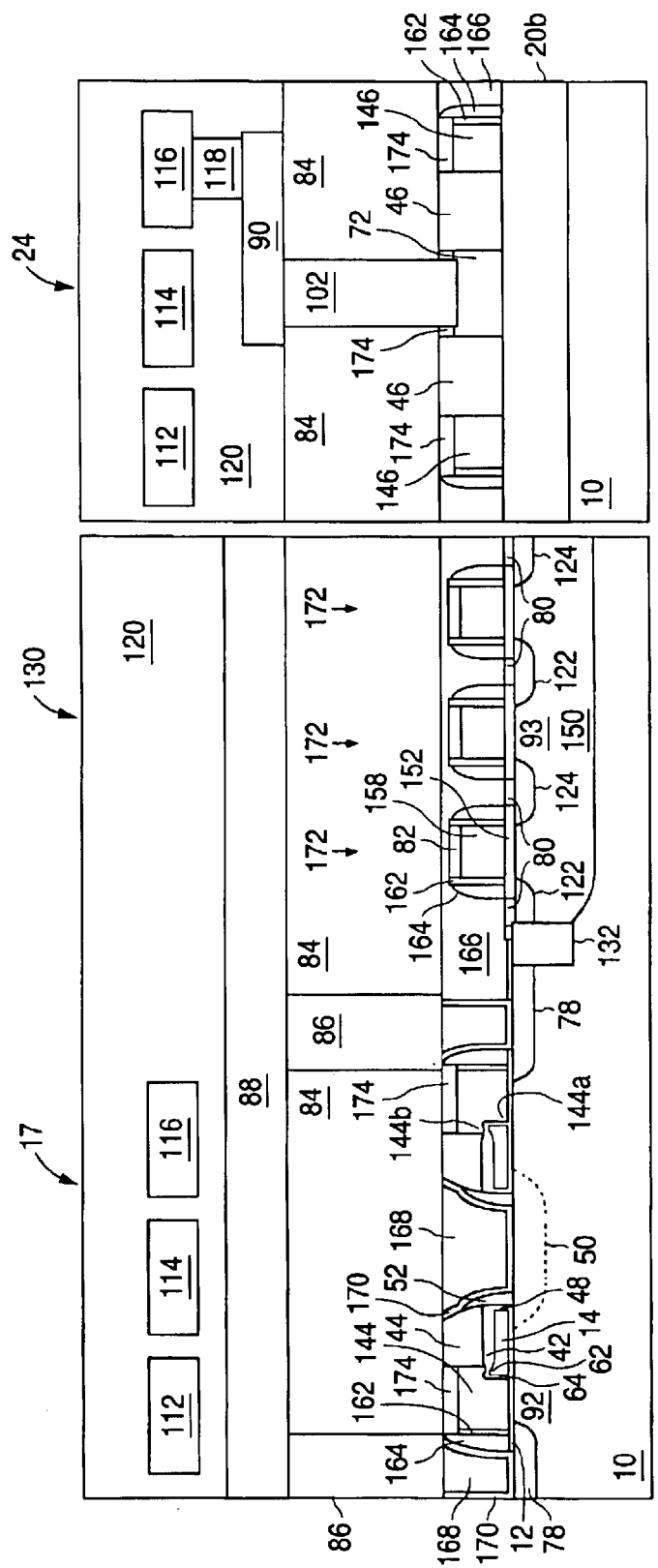

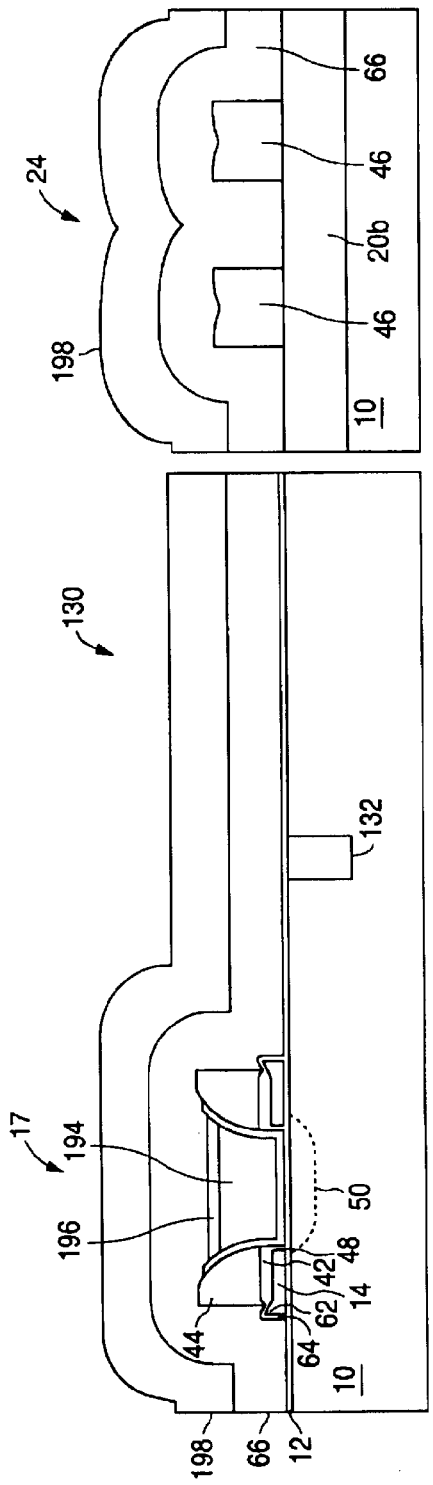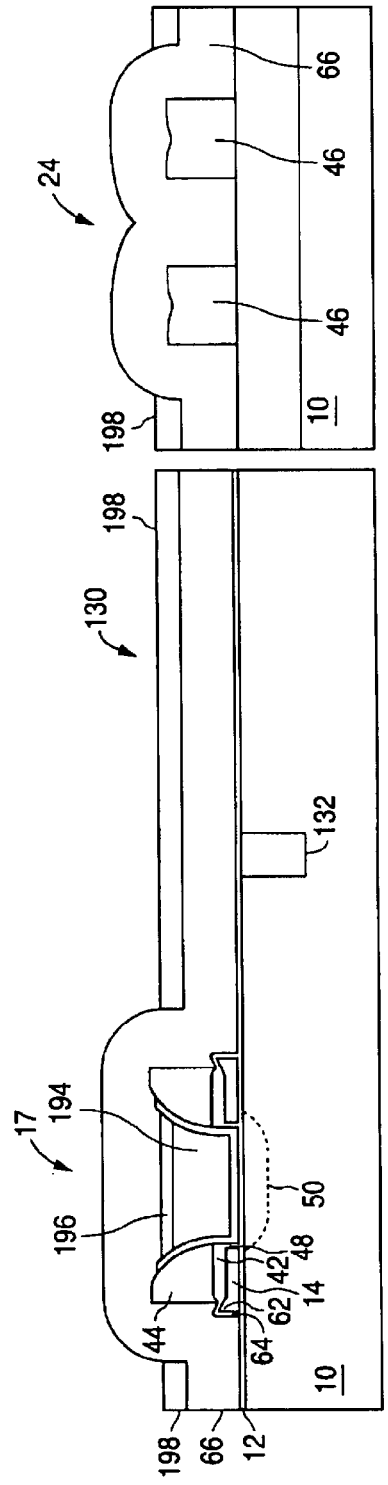

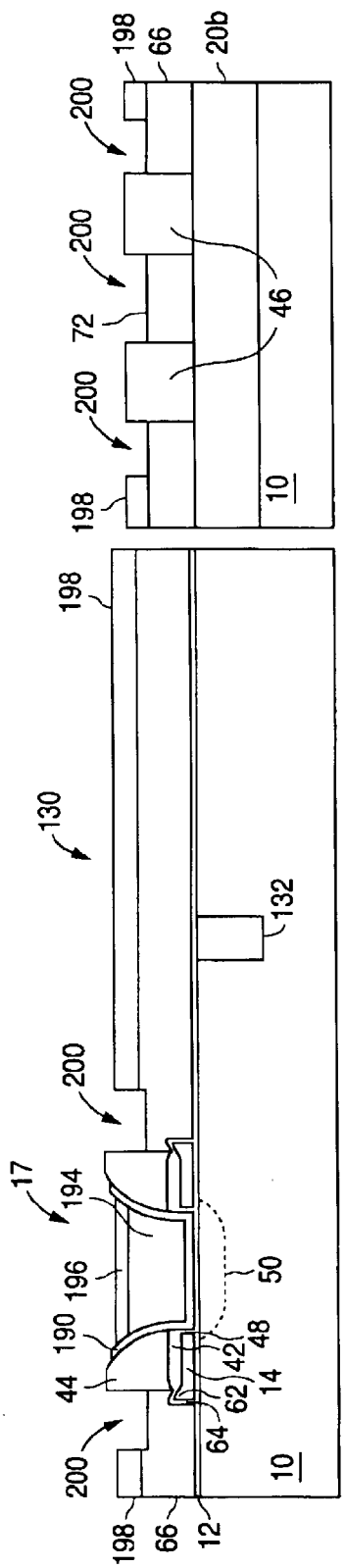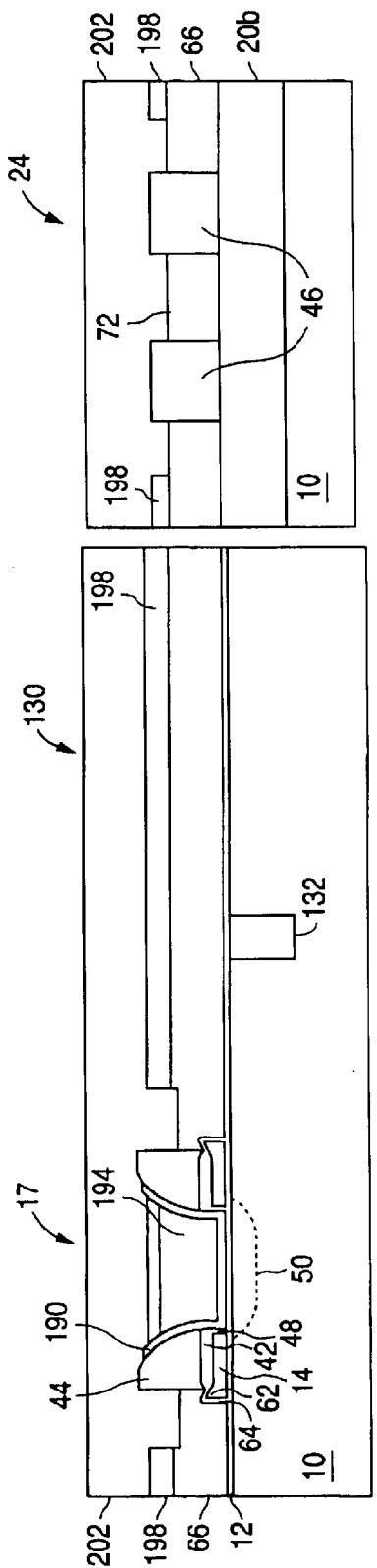

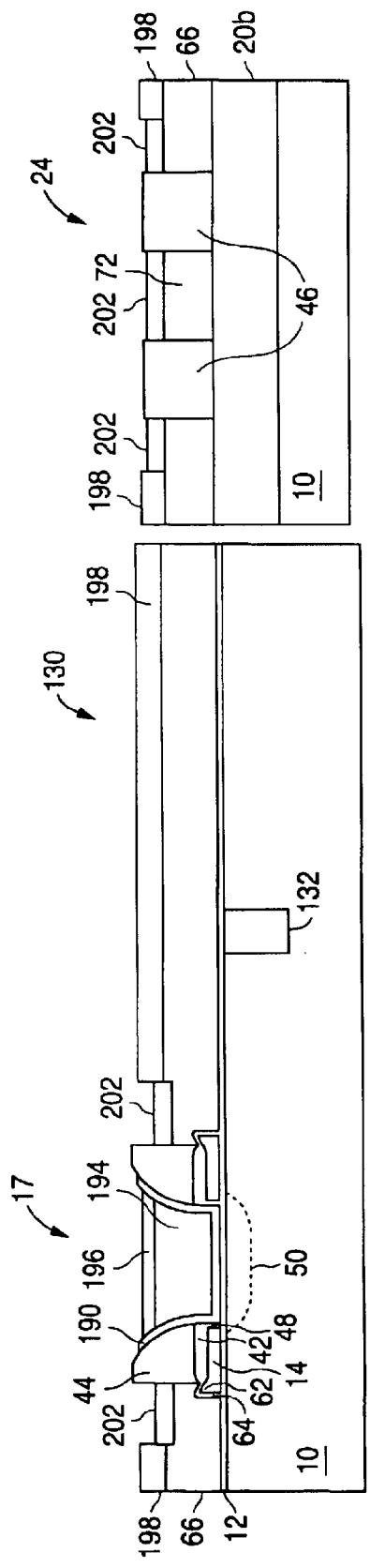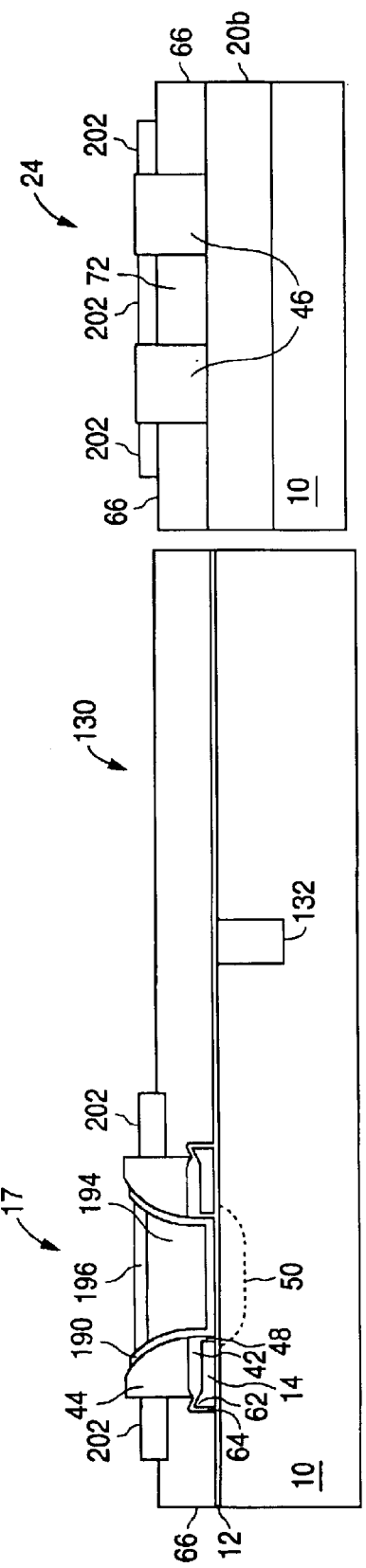

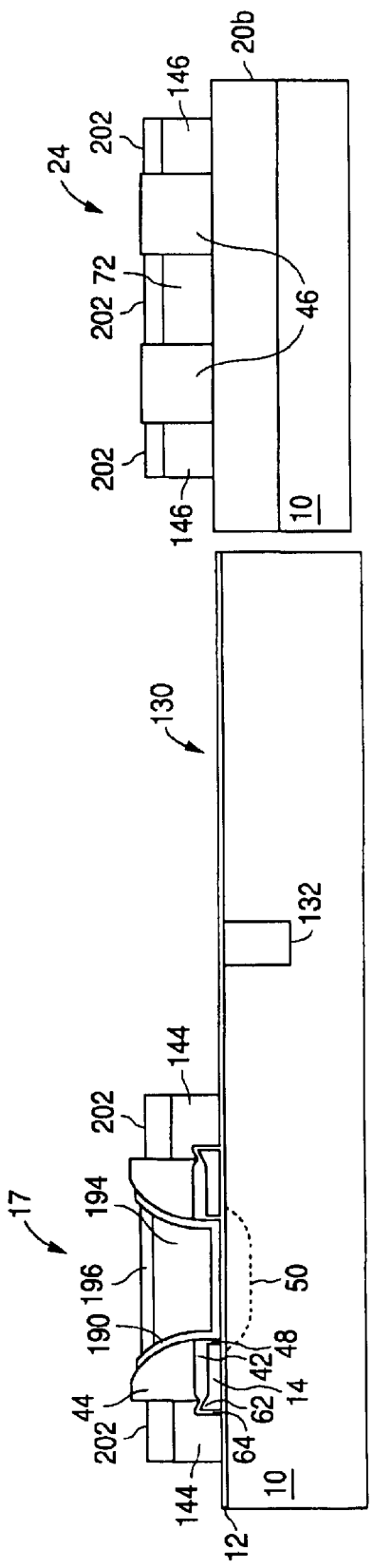
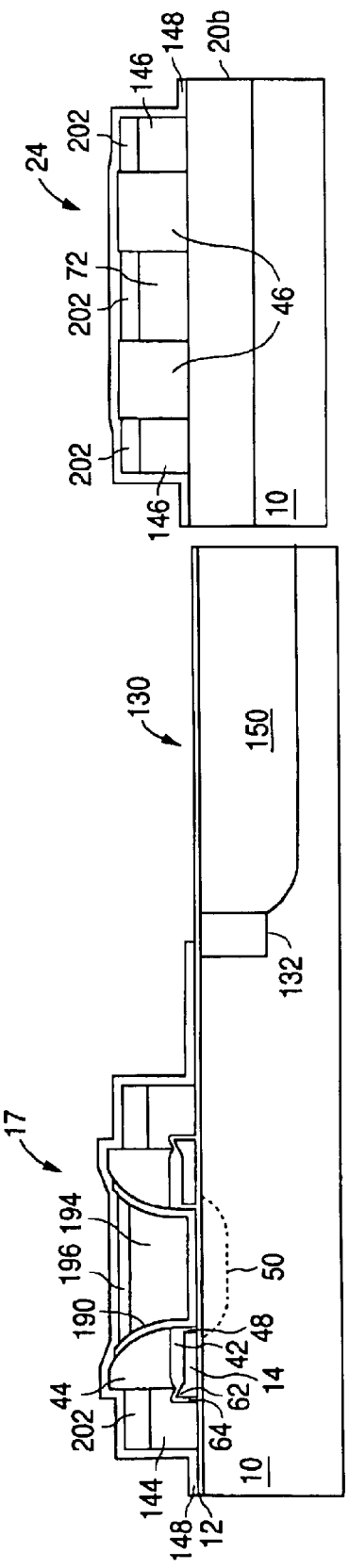

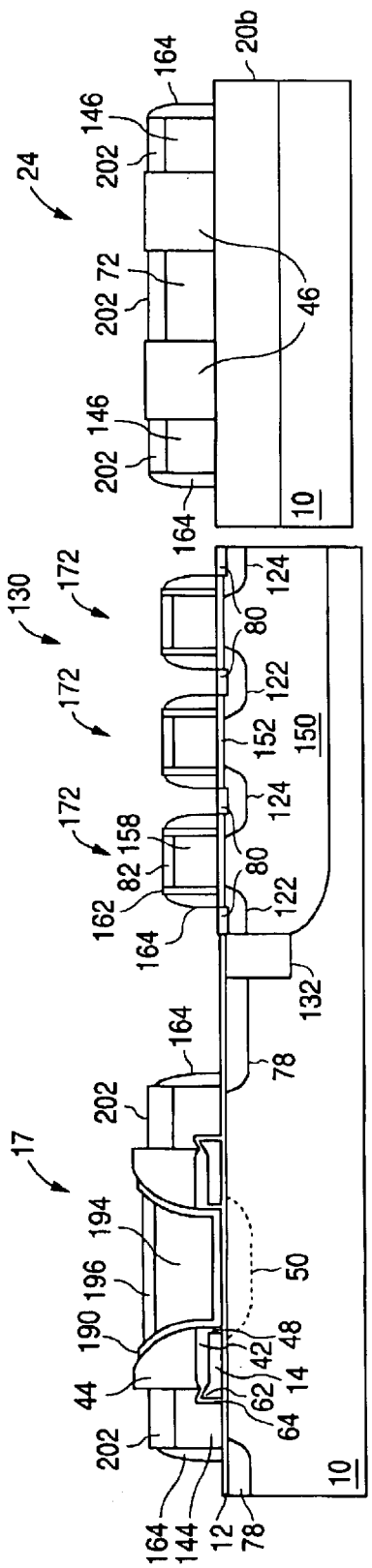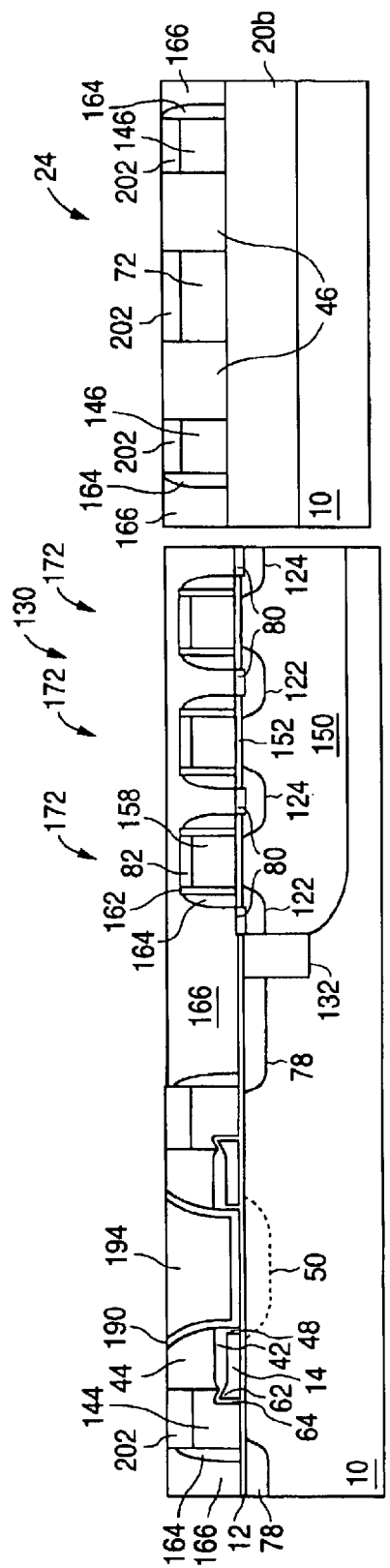

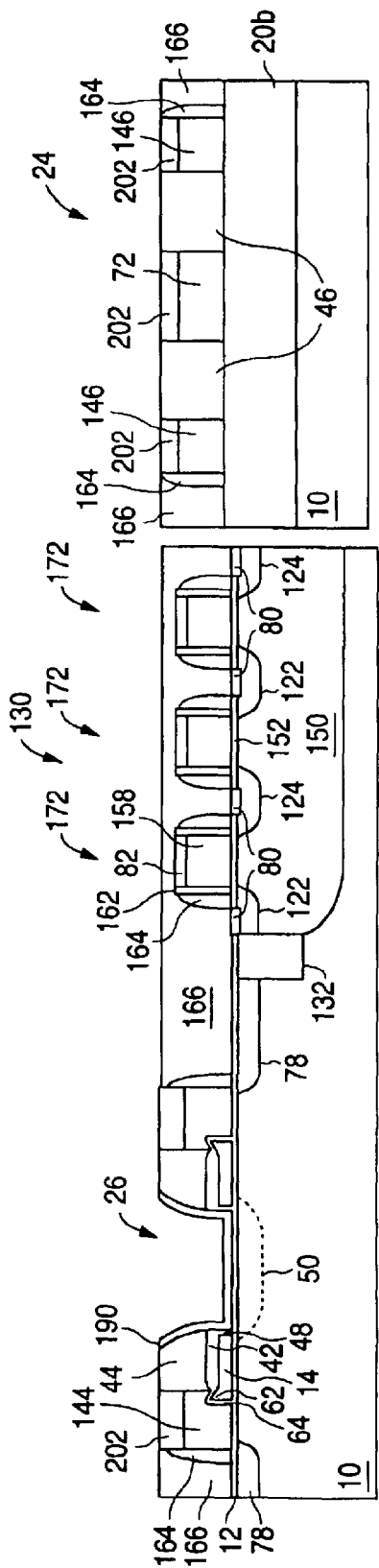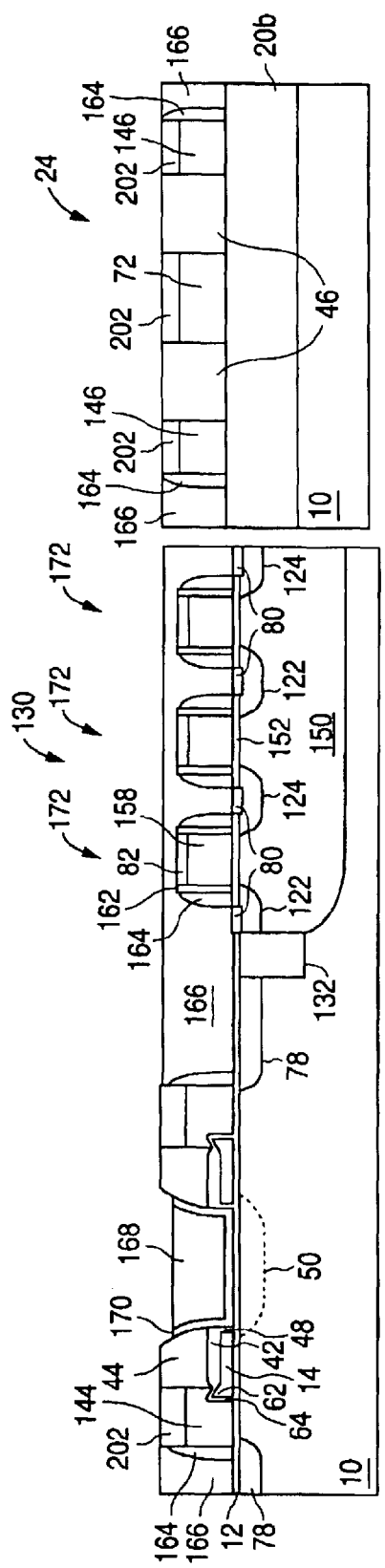

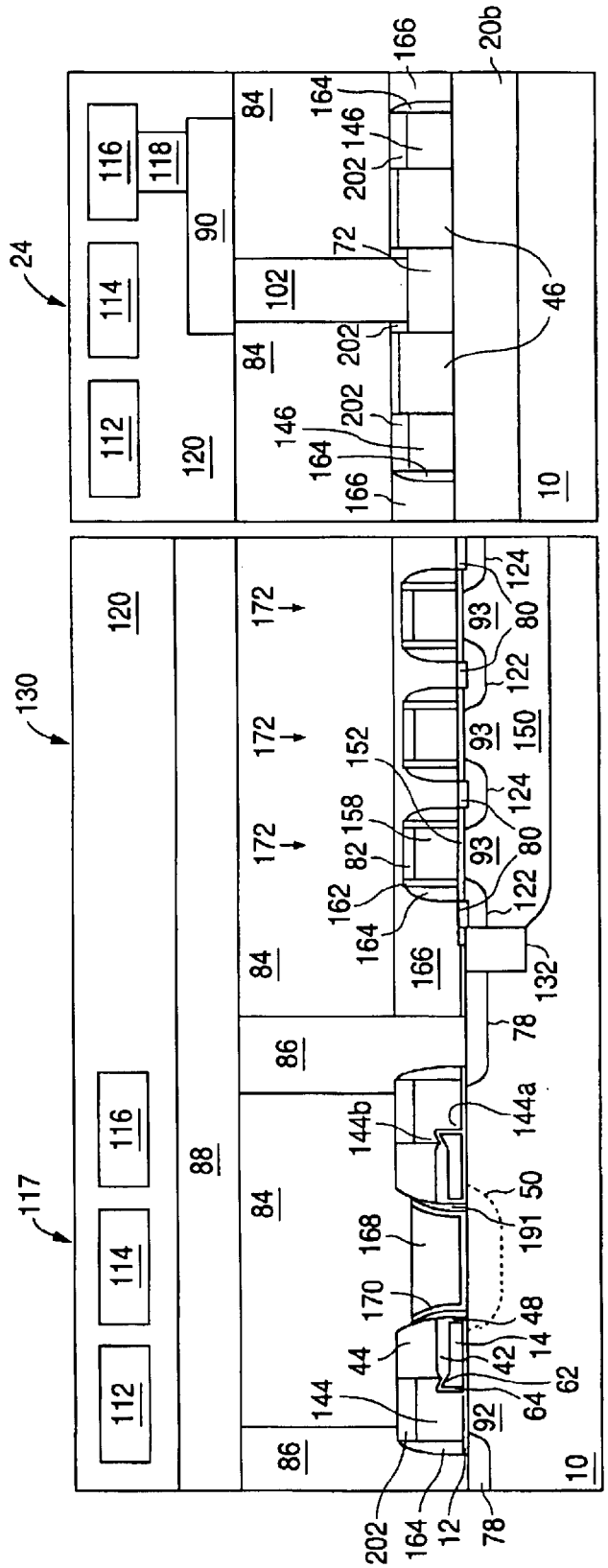

ARRAY OF FLOATING GATE MEMORY CELLS HAVING STRAP REGIONS AND A PERIPHERAL LOGIC DEVICE REGION

This application claims the benefit of U.S. Provisional Application No. 60/351,744, filed Jan. 24, 2002, and entitled Metal-SL Super-FLASH Cell—A Self-Aligned FLASH E2PROM Cell With Low Source Resistance, and of U.S. Provisional Application No. 60/360,293, filed Feb. 26, 2002, and entitled Metal-SL Super-FLASH Cell—A Self-Aligned FLASH E2PROM Cell With Low Source Resistance.

TECHNICAL FIELD

The present invention relates to a method of forming an array of semiconductor non-volatile memory cells on a semiconductor substrate, whereby voltage variations along the source-line are minimized by forming strap regions and metal source-line blocks.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type, or a combination thereof.

One of the problems facing the manufacturability of semiconductor floating gate memory cell arrays has been the alignment of the various components such as source, drain, control gate, and floating gate. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, self alignment minimizes the number of masking steps necessary to form memory cell structures, and enhances the ability to scale such structures down to smaller dimensions.

In the manufacture of memory cell arrays, it is also known to form cell elements that extend across the entire array of memory cells. For example, with an array having interlaced columns of isolation and active regions, with a plurality of memory cells in each active region, memory cell elements such as control gates, source regions, drain regions etc. can be formed to continuously extend across an entire row or column of memory cells. In order to ensure an equalized voltage on such elements for all the memory cells in the target row/column, strap regions have been used to provide multiple electrical connections along the length of continuously formed memory cell elements, so that uniform voltages are applied to all the memory cells in the affected row/column.

FIG. 1 illustrates a known strap region design. Strap region 1 is formed along side a memory cell array 2. The memory cell array 2 includes columns of active regions 3 interlaced with columns of isolation regions 4. Rows of memory cell pairs 5 are formed with word lines 6 and source lines 7 extending along the memory cell rows, with each pair of memory cells having two word lines 6 and sharing a single source line 7. (Those of skill in the art will recognize that the term source and drain may be interchanged. Further, the word line is connected to the control gate of the floating gate memory cell. Thus, the term control gate or control gate line may also be used interchangeably with the term word line). Typically, the word line and the source lines are made of polysilicon or polysilicide or salicide material. Thus, pure metal lines are used to strap these lines. Strap cells 8 are formed on the control gates 6 and source lines 7 as they traverse the strap region 1. Electrical contacts 9a and 9b are then formed onto the control gate (word) lines 6 and source lines 7 respectively by metal lines (not shown) traversing in the word line direction positioned above the array shown in FIG. 1 and electrically insulated therefrom for supplying the desired voltages to the various rows of control gates 6 and source lines 7.

Ideally, for larger memory arrays, a plurality of strap regions are interlaced within the memory cell array (e.g. one strap region for every 128 cells in the word line direction). Preferably, the strap regions are formed simultaneously with the process steps used to make the memory cell array.

As device geometries get smaller, it is increasingly difficult to reliably form electrical connections to the strap regions 8. The word lines 6 are very close to the source lines 7, and get even closer with smaller device geometries. As the distance between the control gate lines 6 and source line 7 shrinks, it becomes more difficult to form contacts 9a and 9b properly. For example, just a small shift of one of the control gate line 6 contacts toward an adjacent source line 7 would result in the contact being formed over both a word line 6 and a source line 7, thus shorting the two together. Further, there is simply no room to enlarge and separate the strap cells to increase the tolerance of the contact formation steps.

One or more logic or peripheral regions are also formed on the substrate as the memory cells and strap regions are formed. Peripheral regions are typically formed adjacent to the memory cell array on the same silicon substrate. Logic devices (i.e. MOS FET's, etc.) are formed in these regions to operate the memory cell array or perform logic functions related to the memory cell array. In order to form such logic devices along side the memory cell array, the memory cells, the logic devices and the strap regions are formed using some of the same processing steps. For example, certain elements (e.g. poly gates) of the logic devices and memory cells are often formed with the same processing steps, thus coupling the formation of these elements together. This can make it difficult to optimize elements of the logic devices without adversely affecting elements of the memory cells, and vice versa.

For multi-level cell designs, the source-line resistance plays a crucial role on programming a selected bit cell, in terms of stored charges, to a desired level. Low source-line resistance is often dictated by the required array efficiency as well as by the design tolerance for the multi-level cell. One way to reduce source-line resistance is to interlace a greater number of strap cells spaced closer together among the array of memory cells. However, the more strap cells used, the less space on the substrate that is available for memory cells, and thus the greater chip size needed to contain any given number of memory cells. The need for lower source-line resistance become even more acute as the total number of levels in the multi-level cell design is increased. Another way of reducing source-line resistance is by forming conductive polycide on the source-line poly using silicide technology that forms silicide on other regions (such as the source and drain). However, as the source lines are scaled down near the 0.1 $\mu$m regime, advanced suicide technologies of choice (such as Cobalt silicide) are not always available as a module for full process integration (e.g. due to FAB constraints). Even with CoSi, the $R_{sheet}$ is typically 4 ohms/square, which is far above the 1 ohms/square often deemed necessary for multi-level cell designs.

Thus, there is a need for a manufacturing method that efficiently forms the memory cells, the logic devices and the strap cells using the same processing steps, where these devices can be scaled down to very small device geometries and still provide a low source line resistance.

SUMMARY OF THE INVENTION

The present invention provides an improved memory cell, logic device and strap cell fabrication method that is scalable and exhibits a low source line resistance.

In one aspect of the present invention, a method of forming an array of semiconductor memory cells includes the steps of forming a plurality of spaced apart isolation regions on the substrate of a first conductivity type which are substantially parallel to one another and extend in a first direction, with an active region between each pair of adjacent isolation regions, the active regions each comprising a first layer of insulation material on the semiconductor substrate and a first layer of conductive material on the first layer of insulation material, forming a plurality of spaced apart first trenches across the active regions and isolation regions which are substantially parallel to one another and extend in a second direction that is substantially perpendicular to the first direction, forming a plurality of spaced apart first and second regions in the substrate in each of the active regions that have a second conductivity type, wherein each of the first regions are formed underneath one of the first trenches, and filling each of the first trenches with a conductive metal material to form source line blocks each extending across the active regions and isolation regions in the second direction, wherein each of the source line blocks extends over and is electrically connected to one of the first regions in each of the active regions.

In another aspect of the present invention, a method of forming an array of semiconductor memory cells includes the steps of forming a plurality of spaced apart isolation regions on the substrate of a first conductivity type which are substantially parallel to one another and extend in a first direction, with an active region between each pair of adjacent isolation regions, the active regions each comprising a first layer of insulation material on the semiconductor substrate and a first layer of conductive material on the first layer of insulation material, forming a plurality of spaced apart first trenches across the active regions and isolation regions which are substantially parallel to one another and extend in a second direction that is substantially perpendicular to the first direction, forming a plurality of spaced apart first and second regions in the substrate in each of the active regions that have a second conductivity type, wherein each of the first regions are formed underneath one of the first trenches, and filling each of the first trenches with a conductive material to form source line blocks each extending across the active regions and isolation regions in the second direction. Each of the source line blocks extends over and is electrically connected to one of the first regions in each of the active regions, and comprises a polysilicon layer of material and a metalized polysilicon layer of material.

In yet another aspect of the present invention, a method of forming an array of electrically programmable and erasable memory devices includes the steps of forming spaced apart isolation regions on a substrate of semiconductor material of a first conductivity type which are substantially parallel to one another and extend in a first direction, with an active region between each pair of adjacent isolation regions, forming a plurality of pairs of memory cells in each of the active regions, and forming a plurality of source line blocks of metal material each extending across the active regions and isolation regions in a second direction substantially perpendicular to the first direction. The formation of each of the memory cell pairs includes the steps of forming a first region and a pair of second regions spaced apart in the substrate having a second conductivity type, with channel regions defined in the substrate between the first region and the second regions, forming a pair of electrically conductive floating gates each disposed over and insulated from a portion of one of the channel regions, and forming a pair of electrically conductive control gates each disposed over and insulated from a portion of one of the channel regions. Each of the source line blocks extends over and is electrically connected to one of the first regions in each of the active regions.

In still another aspect of the present invention, a method of forming an array of semiconductor memory cells includes the steps of forming spaced apart isolation regions on a substrate of semiconductor material of a first conductivity type which are substantially parallel to one another and extend in a first direction, with an active region between each pair of adjacent isolation regions, forming a plurality of pairs of memory cells in each of the active regions, and forming a plurality of source line blocks of material each extending across the active regions and isolation regions in a second direction substantially perpendicular to the first direction. The formation of each of the memory cell pairs includes the steps of forming a first region and a pair of second regions spaced apart in the substrate having a second conductivity type, with channel regions defined in the substrate between the first region and the second regions, forming a pair of electrically conductive floating gates each disposed over and insulated from a portion of one of the channel regions, and forming a pair of electrically conductive control gates each disposed over and insulated from a portion of one of the channel regions. Each of the source line blocks extends over and is electrically connected to one of the first regions in each of the active regions, and comprises a polysilicon layer of material and a metalized polysilicon layer of material.

Another aspect of the invention is an array of electrically programmable and erasable memory devices that includes a substrate of semiconductor material of a first conductivity type, spaced apart isolation regions formed on the substrate which are substantially parallel to one another and extend in a first direction, with an active region between each pair of adjacent isolation regions, and a plurality of source line blocks of metal material each extending across the active regions and isolation regions in a second direction substantially perpendicular to the first direction. Each of the active regions include a plurality of memory cells, with each of the memory cells including first and second spaced apart regions in the substrate having a second conductivity type, with a channel region defined in the substrate therebetween, an electrically conductive floating gate disposed over and insulated from a portion of the channel region, and an electrically conductive control gate disposed over and insulated from a portion of the channel region. Each of the source line blocks extends over and is electrically connected to one of the first regions in each of the active regions.

Another aspect of the present invention includes an array of electrically programmable and erasable memory devices that comprises a substrate of semiconductor material of a first conductivity type, spaced apart isolation regions formed on the substrate which are substantially parallel to one another and extend in a first direction, with an active region between each pair of adjacent isolation regions, and a plurality of source line blocks of conductive material each extending across the active regions and isolation regions in a second direction substantially perpendicular to the first direction. Each of the active regions includes a plurality of memory cells, with each of the memory cells including first and second spaced apart regions in the substrate having a second conductivity type, with a channel region defined in the substrate therebetween, an electrically conductive floating gate disposed over and insulated from a portion of the channel region, and an electrically conductive control gate disposed over and insulated from a portion of the channel region. Each of the source line blocks extends over and is electrically connected to one of the first regions in each of the active regions, and comprises a polysilicon layer of material and a metalized polysilicon layer of material.

A further aspect of the present invention includes an array of electrically programmable and erasable memory devices comprising a substrate of semiconductor material of a first conductivity type, spaced apart isolation regions formed on the substrate which are substantially parallel to one another and extend in a first direction, with an active region between each pair of adjacent isolation regions; and a plurality of source line blocks of metal material each extending across the active regions and isolation regions in a second direction substantially perpendicular to the first direction. Each of the active regions includes a plurality of pairs of memory cells, with each of the memory cell pairs including a first region and a pair of second regions spaced apart in the substrate having a second conductivity type, with channel regions defined in the substrate between the first region and the second regions, a pair of electrically conductive floating gates each disposed over and insulated from a portion of one of the channel regions, and a pair of electrically conductive control gates each disposed over and insulated from a portion of one of the channel regions. Each of the source line blocks extends over and is electrically connected to one of the first regions in each of the active regions.

In one last aspect of the present invention, an array of electrically programmable and erasable memory devices includes a substrate of semiconductor material of a first conductivity type, spaced apart isolation regions formed on the substrate which are substantially parallel to one another and extend in a first direction, with an active region between each pair of adjacent isolation regions, and a plurality of source line blocks of material each extending across the active regions and isolation regions in a second direction substantially perpendicular to the first direction. Each of the active regions including a plurality of pairs of memory cells, with each of the memory cell pairs including a first region and a pair of second regions spaced apart in the substrate having a second conductivity type, with channel regions defined in the substrate between the first region and the second regions, a pair of electrically conductive floating gates each disposed over and insulated from a portion of one of the channel regions, and a pair of electrically conductive control gates each disposed over and insulated from a portion of one of the channel regions. Each of the source line blocks extends over and is electrically connected to one of the first regions in each of the active regions, and comprises a polysilicon layer of material and a metalized polysilicon layer of material.

Other objects and features of the present invention will become apparent by a review of the specification, claims and appended figures.

BRIEF DESCRIPTION OF THE DRAWINGS

FIGS. 13A–13E are cross sectional views taken along the line 2—2 illustrating in sequence the steps in a first alternate processing of the structure shown in FIG. 3V to form the active and peripheral regions of the non volatile memory cell array of the present invention.

FIGS. 14A–14E are cross sectional views illustrating in sequence the steps in the first alternate processing of the structure shown in FIG. 4V to form the strap regions of the non volatile memory cell array of the present invention FIGS. 15A–15C are cross sectional views taken along the line 2—2 illustrating in sequence the steps in a second alternate processing of the structure shown in FIG. 3V to form the active and peripheral regions of the non volatile memory cell array of the present invention.

FIGS. 16A–16C are cross sectional views illustrating in sequence the steps in the second alternate processing of the structure shown in FIG. 4V to form the strap regions of the non volatile memory cell array of the present invention FIGS. 17A–17D are cross sectional views taken along the line 2—2 illustrating in sequence the steps in a third alternate processing of the structure shown in FIG. 15A to form the active and peripheral regions of the non volatile memory cell array of the present invention.

FIGS. 18A–18D are cross sectional views illustrating in sequence the steps in the third alternate processing of the structure shown in FIG. 16A to form the strap regions of the non volatile memory cell array of the present invention FIGS. 19A–19B are cross sectional views taken along the line 2—2 illustrating in sequence the steps in a fourth alternate processing of the structure shown in FIG. 3T to form the active and peripheral regions of the non volatile memory cell array of the present invention.

FIGS. 20A–20B are cross sectional views illustrating in sequence the steps in the fourth alternate processing of the structure shown in FIG. 4T to form the strap regions of the non volatile memory cell array of the present invention FIGS. 21A–21D are cross sectional views taken along the line 2—2 illustrating in sequence the steps in a fifth alternate processing of the structure shown in FIG. 13C to form the active and peripheral regions of the non volatile memory cell array of the present invention.

FIGS. 22A–22D are cross sectional views illustrating in sequence the steps in the fifth alternate processing of the structure shown in FIG. 14C to form the strap regions of the non volatile memory cell array of the present invention

DETAILED DESCRIPTION OF THE PREFERRED EMBODIMENTS

The present invention is a self aligned method of manufacturing an array of non-volatile memory cells, together with strap cells in a strap cell region and logic devices in a peripheral region, with metal source lines for improved conductivity. The strap cells are formed using the same processing steps that are used to form the array of memory cells. The strap cell regions containing the strap cells are interlaced among an array of non-volatile memory cells having word lines and source lines that extend across rows of memory cells. Logic devices formed in a logic/peripheral region adjacent to the memory cell array are formed in a decoupled manner so that the poly elements of the logic devices and the memory cells can be separately optimized.

Isolation Region Formation

Figure 2A:
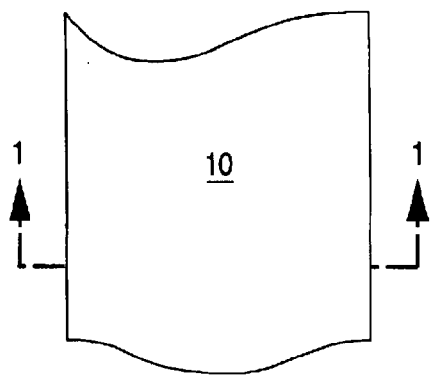
FIG. 2A is a top view of a semiconductor substrate used in the first step of the method of present invention to form isolation regions.
Figure 2B:
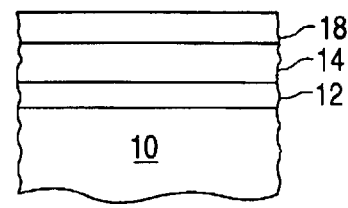
FIG. 2B is a cross sectional view of the structure taken along the line 1—1 showing the initial processing steps of the present invention.

Referring to FIG. 2A there is shown a top plan view of a semiconductor substrate 10 (or a semiconductor well), which is preferably of P type and is well known in the art. A first layer of insulation material 12, such as silicon dioxide (oxide), is deposited thereon as shown in FIG. 2B. The first insulation layer 12 is formed on the substrate 10 by well known techniques such as oxidation or deposition (e.g. chemical vapor deposition or CVD), forming a layer of oxide preferably 80 Å thick. A first layer of polysilicon 14 (hereinafter "poly") is deposited on top of the first layer of insulation material 12 (e.g. 700 to 800 Å thick). The deposition and formation of the first polysilicon layer 14 on the first insulation layer 12 can be made by a well known process such as Low Pressure CVD or LPCVD. A silicon nitride layer 18 (hereinafter "nitride") is deposited over the polysilicon layer 14, preferably by CVD (e.g. 1000 Å thick). This nitride layer 18 is used to define the active regions during isolation formation. Of course, all of the forgoing described parameters and the parameters described hereinafter, depend upon the design rules and the process technology generation. What is described herein is for the 0.18 micron process. However, it will be understood by those skilled in the art that the present invention is not limited to any specific process technology generation, nor to any specific value in any of the process parameters described hereinafter.

Figure 2C:
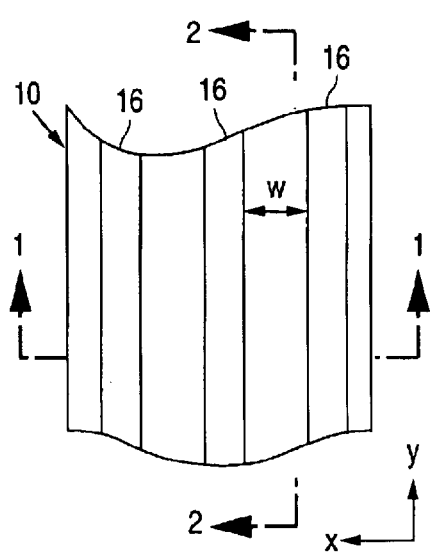
FIG. 2C is a top view of the structure showing the next step in the processing of the structure of FIG. 2B, in which isolation regions are formed.
Figure 2D:
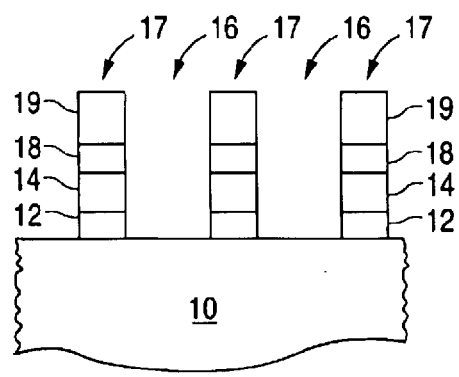
FIG. 2D is a cross sectional view of the structure in FIG. 2C taken along the line 1—1 showing the trenches to be formed as isolation stripes in the structure.

Once the first insulation layer 12, the first polysilicon layer 14, and the silicon nitride 18 have been formed, suitable photo-resistant material 19 is applied on the silicon nitride layer 18 and a masking step is performed to selectively remove the photo-resistant material from certain regions (stripes 16). Where the photo-resist material 19 is removed, the silicon nitride 18, the polysilicon 14 and the underlying insulation material 12 are etched away in stripes 16 formed in the Y or column direction, as shown in FIG. 2C, using standard etching techniques (i.e. anisotropic etch processes). The distance W between adjacent stripes 16 can be as small as the smallest lithographic feature of the process used. Where the photo resist 19 is not removed, the silicon nitride 18, the first polysilicon region 14 and the underlying insulation region 12 are maintained. The resulting structure is illustrated in FIG. 2D, with active regions 17 interlaced with isolation regions 16. As will be described, there are two embodiments in the formation of the isolation regions: LOCOS and STI. In the STI embodiment, the etching continues into the substrate 10 to a predetermined depth.

The structure is further processed to remove the remaining photo resist 19. Then, an isolation material 20a or 20b, such as silicon dioxide, is formed in the regions or "grooves" 16. The nitride layer 18 is then selectively removed to form the structure shown in FIG. 2E. The isolation can be formed via the well known LOCOS process resulting in the local field oxide 20a (e.g. by oxidizing the exposed substrate), or it can be formed via a shallow trench process (STI) resulting in silicon-dioxide being formed in the region 20b (e.g. by depositing an oxide layer, followed by a Chemical-Mechanical-Polishing or CMP etch). It should be noted that during the LOCOS formation, a spacer may be necessary to protect the side walls of poly layer 14 during the formation of the local field oxide.

Figure 2E:
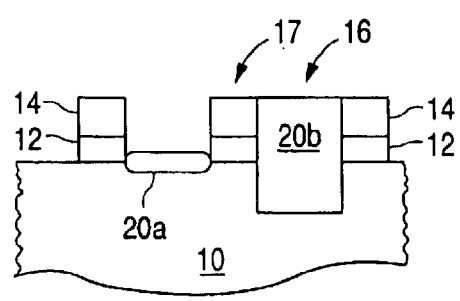
FIG. 2E is a cross sectional view of the structure in FIG. 2C taken along the line 1—1 showing the two types of isolation regions that can be formed in the semiconductor substrate: LOCOS or shallow trench.

The remaining first polysilicon layer 14 and the underlying first insulation material 12 form the active regions. Thus, at this point, the substrate 10 has alternating stripes of active regions and isolation regions with the isolation regions being formed of either LOCOS insulation material 20a or shallow trench insulation material 20b. Although FIG. 2E shows the formation of both a LOCOS region 20a and a shallow trench region 20b, only one of the LOCOS process (20a) or the shallow trench process (20b) will be used. In the preferred embodiment, the shallow trench 20b will be formed. Shallow trench 20b is preferable because it can be more precisely formed at smaller design rules.

The structure in FIG. 2E represents a self aligned structure, which is more compact than a structure formed by a non self-aligned method. A non self-aligned method of forming the structure shown in FIG. 2E, which is well known and is conventional, is as follows. Regions of isolation 20 are first formed in the substrate 10. This can be done by depositing a layer of silicon nitride on the substrate 10, depositing photo-resist, patterning the silicon nitride using a first masking step to expose selective portions of the substrate 10, and then oxidizing the exposed substrate 10 using either the LOCOS process or the STI process where silicon trench formation and trench fill are involved. Thereafter, the silicon nitride is removed, and a first layer of silicon dioxide 12 (to form the gate oxide) is deposited over the substrate 10. A first layer of polysilicon 14 is deposited over the gate oxide 12. The first layer of polysilicon 14 is then patterned using a second masking step and selective portions removed. Thus, the polysilicon 14 is not self aligned with the regions of isolation 20, and a second masking step is required. Further, the additional masking step requires that the dimensions of the polysilicon 14 have an alignment tolerance with respect to the regions of isolation 20. It should be noted that the non self-aligned method does not utilize nitride layer 18.

Figure 4C:
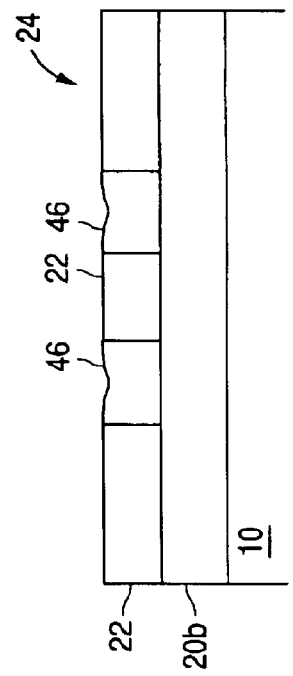
FIGS. 4A–4Y are cross sectional views of the strap regions showing in sequence the next step(s) in the processing of the strap region structure imaged by the line 4B—4B portion of the mask of FIG. 5.

In the above processing steps, one or more isolation regions are designated as strap regions 24 (see description of FIG. 4A below), in which strap cells for the word lines and source lines will be formed. The width of the strap regions 24 is preferably wider than the width of the isolation regions 16 to accommodate the formation of the strap cells therein. Thus, the resulting structure includes sets of interlaced columns of active and isolation regions, with columns of strap regions 24 interlaced between the sets of active/isolation regions. In the preferred embodiment, a strap region column is formed between every set of 128 or 256 active and isolation regions 17/16.

Memory Array Formation

With the structure shown in FIG. 2E made using either the self aligned method or the non self-aligned method, the structure is further processed as follows. FIGS. 3A to 3T show the cross section of the active region structure 17 from a view orthogonal to that of FIGS. 2B and 2E, and FIGS. 4A to 4T show the cross section of the strap region structure 24 from the same orthogonal view, as the next steps in the process of the present invention are performed concurrently on both regions. It should be appreciated that while only a single active region 17 and single 24 strap region are shown, the processing steps illustrated below form an array of such regions.

An insulation layer 22 is first formed on the structure. Specifically, a nitride layer 22 is deposited across the entire surface of the structure (e.g. 3000 Å thick). The resulting active region structure is shown in FIG. 3A, and the resulting strap region structure is shown in FIG. 4A.

Figure 5:
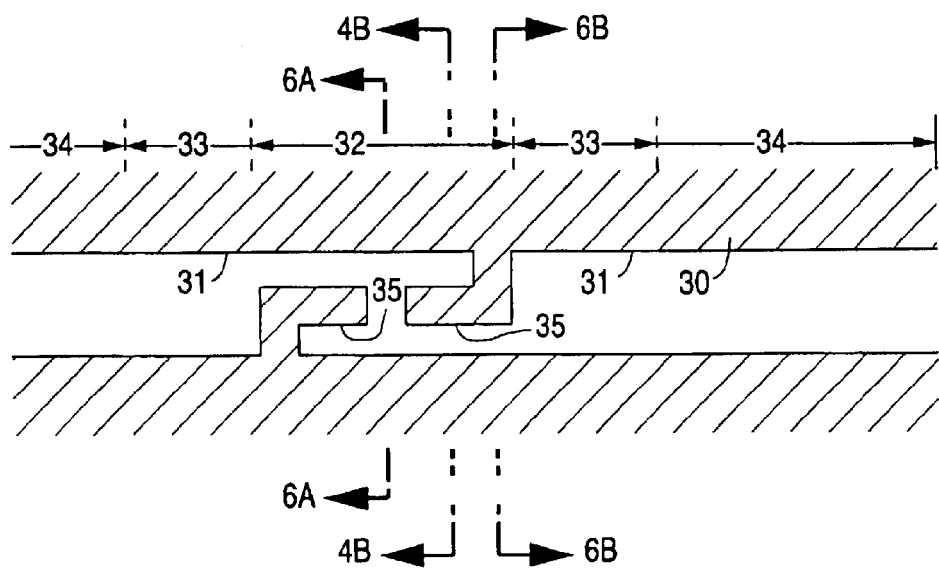
FIG. 5 is a top view of a portion of the mask used to form the first trenches in the active regions and the 'H' shaped strap cells in the strap regions.

A masking operation is performed on both the active/isolation regions 17/16 and the strap region 24, by first applying photo-resist 23 on top of the nitride layer 22. A masking step is applied to the structure using a mask 30, as illustrated in FIG. 5. Mask 30 is formed of an opaque masking material (such as metal) that contains a patterned aperture 31 for defining masking regions on the structure from which material is to be removed. Mask 30 includes a first mask region 32 (for defining the word line (WL) strap cells), a second mask region 33 (for defining the source line (SL) strap cells), and a third mask region 34 (for forming the memory cell array). The mask 30 shown in FIG. 5 is used to define a single strap region row and single row of memory cells. Thus, a mask having an array of geometries 30 is used to define the memory cell array including the strap regions of the present invention.

The mask regions 34 include single linear apertures for defining parallel stripe masking regions over the active and isolation regions 17/16, which extend in the X or the row direction. The distance between adjacent stripes can be a size determined by the needs of the device to be fabricated. After mask regions 34 are imaged onto the active regions 17 (shown in FIG. 3A), the photo resist 23 in the exposed masking regions is removed (i.e. stripes in the row direction), leaving rows of the nitride layer 22 exposed. The exposed nitride layer portions are removed using a nitride anisotropic etch process until the poly layer 14 is observed, which acts as an etch stop. The portions of layers 12, 14 and 22 still underneath the remaining photo resist 23 are unaffected by this etch process. It will become evident from the following description that the process of the present invention creates columns of multiple pairs of mirror memory cells. For each such pair of memory cells, this nitride etch process results in the formation of a single first trench 26 that extends down to polysilicon layer 14, as shown in FIG. 3B.

The mask regions 32 each include a single transparent linear aperture into which a pair of opaque L shaped members 35 protrude. Members 35 extend out from opposing sides of aperture 31, and bend toward each other, to form an 'H' shaped aperture (the shape in the form of the letter 'H' can be seen by rotating FIG. 5 by 90 degrees). Mask regions 32 are used to define WL strap cells in the strap regions 24 that are each aligned to one of the rows of memory cells in the array. The mask regions 32 are imaged onto the strap regions 24, where an 'H' shaped trench pattern is formed in each row of the strap regions 24 by the nitride anisotropic etch step. FIG. 4B illustrates the cross section view of the strap regions 24 after the nitride etch step, that are imaged by the line 4B—4B portion of the 'H' shaped mask pattern of FIG. 5. The two parallel portions of the 'H' shaped pattern result in the formation of a pair of trenches 40 in the strap regions 24, as shown in FIG. 4B.

The mask regions 33 each include a single linear aperture for forming the SL strap cells in the strap regions 24. Each SL strap cell is aligned to one of the rows of memory cells in the array. The mask regions 33 are each imaged down onto the structure between one of the 'H' shaped trench patterns and one of the rows of memory cells, as later described and illustrated.

Figure 3C:
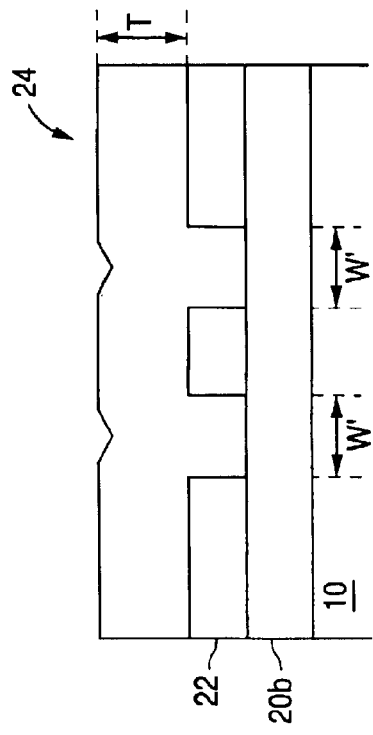
FIGS. 3A–3Y are cross sectional views taken along the line 2—2 of FIG. 2C showing in sequence the next step(s) in the processing of the structure shown in FIG. 2E, in the formation of a non volatile memory array of floating memory cells of the present invention.
Figure 3D:
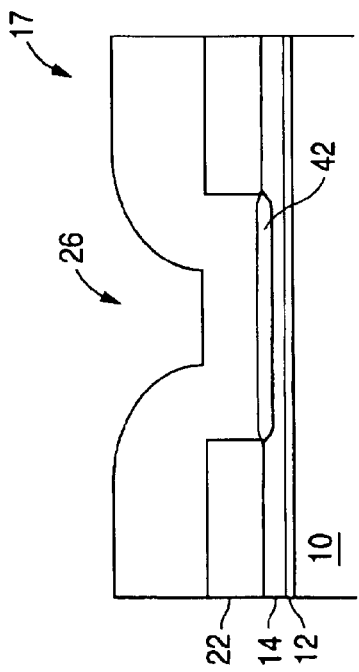

The residual photo-resist 23 is removed from the structure, which is followed by an optional oxidation process. For the active region 17, this oxidation process oxidizes the exposed portions of poly layer 14 inside of trenches 26 to form a lens shaped oxide layer 42 over poly layer 14 (see FIG. 3C). While not shown, an optional poly etch process can be performed before the formation of layer 42. This optional customized anisotropic poly etch process etches away a portion of the top surface of poly layer 14, but leaves a taper shape in that top surface in the area next to the remaining nitride layer 22. Oxide spacers 44 are then formed inside trenches 26. The formation of spacers is well known in the art, and includes depositing a material over the contour of a structure (as shown in FIG. 3C), followed by an anisotropic etch process (e.g. RIE), whereby the material is removed from horizontal surfaces of the structure, while the material remains largely intact on vertically oriented surfaces of the structure. To form oxide spacers 44, a thick layer of oxide is deposited over the structure, followed by an anisotropic oxide etch, which removes the deposited oxide except for spacers 44 inside trenches 26. This oxide etch step also removes the center portion of oxide layer 42 from each of the trenches 26 to expose poly layer 14. The oxide etch step uses the nitride layer 22 as the etch stop. The resulting structure in the active region 17 is shown in FIG. 3D.

Figure 4D:
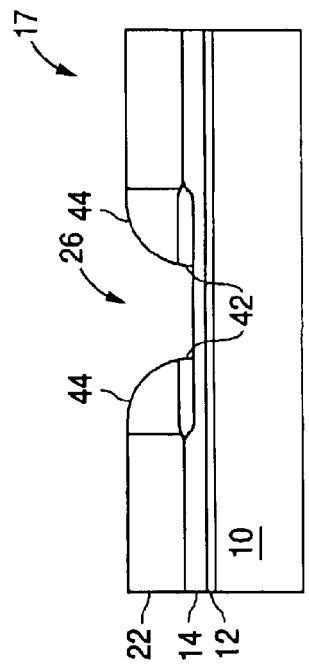

For the strap region 24, the oxidation process used to form oxide layer 42 in the active region 17 has no effect. The oxide deposition and etch steps used to form spacers 44 in the active region end up filling trenches 40 in the strap region 24 with oxide to form oxide blocks 46. Specifically, the oxide deposition completely fills trenches 40 (see FIG. 4C) and the oxide etch removes the oxide outside of trenches 40 (see FIG. 4D). Trenches 40 are filled solid with oxide instead of with oxide spacers along their sidewalls so long as trenches 40 have a sufficiently narrow width W'. For example, in many applications, if the width W' of each trench 40 is no greater than approximately twice the thickness T of the deposited oxide, then the trenches 40 will remain filled with oxide to form oxide blocks 46. Therefore, for the preferred embodiment, the width of the trenches in the trench pattern formed by imaging patterned aperture onto the strap region 24 is narrow enough to ensure that the trench pattern is filled with oxide by the oxide deposition/etch steps.

Figure 3E:
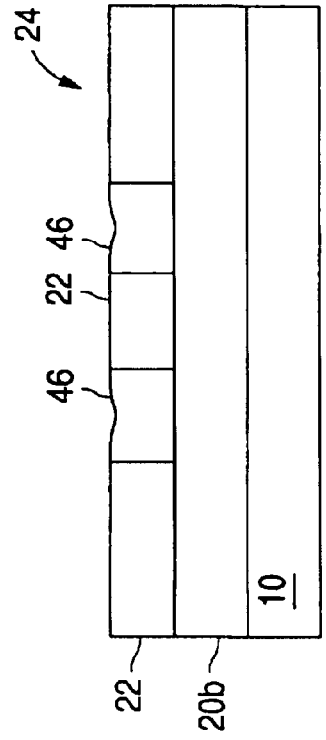
Figure 4E:
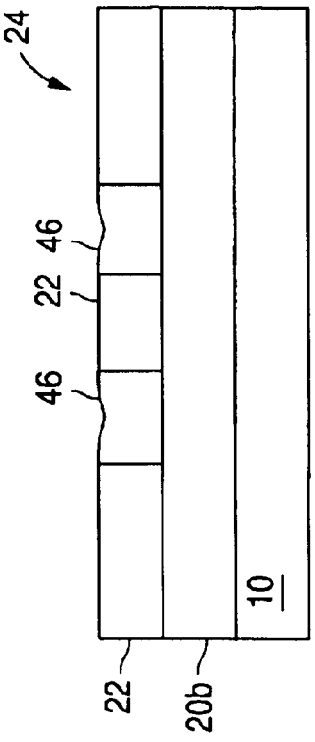

An anisotropic poly etch process is then performed on the structure. For the active region 17, this etch removes portions of the poly layer 14 that are exposed between the opposing insulation spacers 44 at the bottom of trenches 26. The oxide layer 12 acts as an etch stop. This poly etch has no effect on the strap region. A thin oxide etch is then performed, which removes the exposed portions of thin oxide layer 12 between spacers 44 at the bottom of trenches 26 to expose substrate 10. The use of spacers 44 allows the formation of trenches 26 having a width at the poly layer 14 that is less than the width of the masking step used to initially define the tops of trenches 26. The resulting active region structure is illustrated in FIG. 3E. The oxide etch removes a negligible amount of the oxide blocks 46 in strap region 24, as shown in FIG. 4E.

Figure 3F:
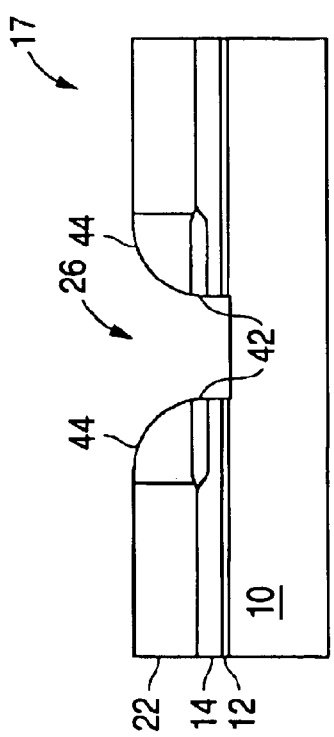
Figure 4F:
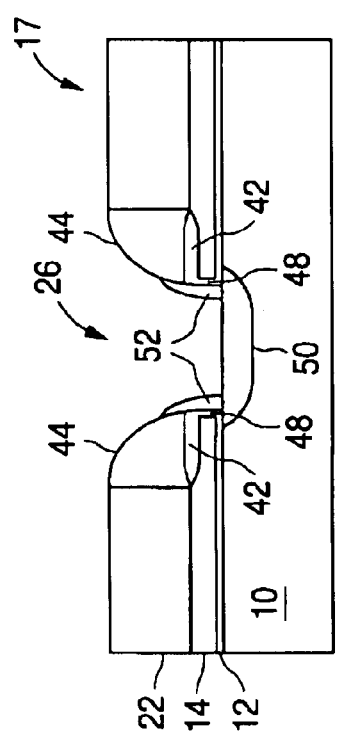

An oxidation step is then performed, where in the active region 17, the sides of polysilicon layer 14 and the substrate surface that are exposed inside trenches 26 are oxidized to form oxide side walls 48 on the sides of poly layer 14 and to reform oxide layer 12 over the substrate 10 exposed inside trenches 26. Suitable ion implantation is then made across the entire surface of the structure. Where the ions have sufficient energy to penetrate the oxide layer 12 in trenches 26, they then form a first region (i.e. source region) 50 in the substrate 10. In all other regions, the ions are absorbed by the existing structure, where they have no effect. Insulation (e.g. oxide) spacers 52 are then formed inside trenches 26 by depositing a layer of oxide, followed by an anisotropic oxide etch, which removes the deposited oxide except for spacers 52. This oxide etch step also removes the center portion of oxide layer 12 from each of the trenches 30 to re-expose the substrate 10. The resulting active region structure is shown in FIG. 3F. The above described oxidation, ion implantation, and oxide deposition/etch steps have no appreciable net affect on the strap region structure 24, as shown in FIG. 4F.

Figure 4G:
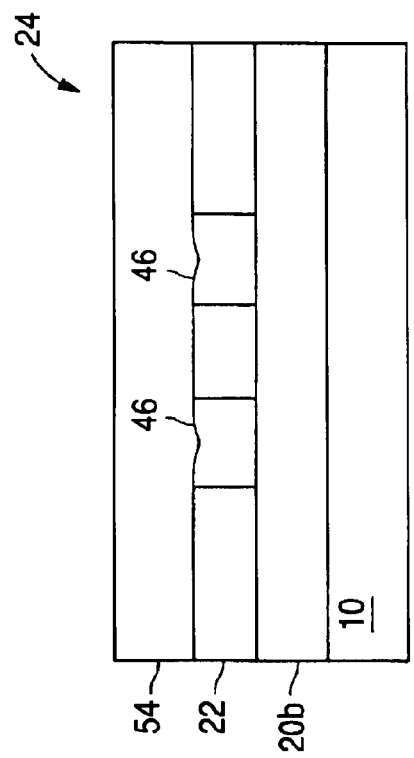
Figure 3G:
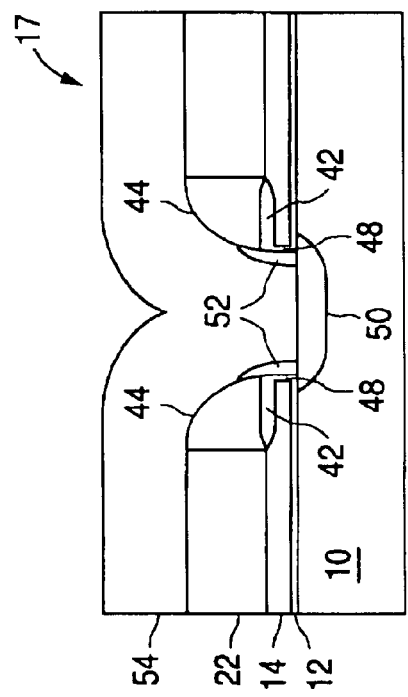

A thick dummy dielectric deposition step is then performed, leaving a thick layer 54 of a (dummy) dielectric material over the active region 17 and strap region 24, as shown in FIGS. 3G and 4G, respectively. The dielectric material selected for the preferred embodiment is BSG, but can be any other dielectric material having a high etching selectivity to both nitride and oxide. Layer 54 could also be formed using composite layers (e.g. a nitride layer followed by BSG).

Figure 4H:
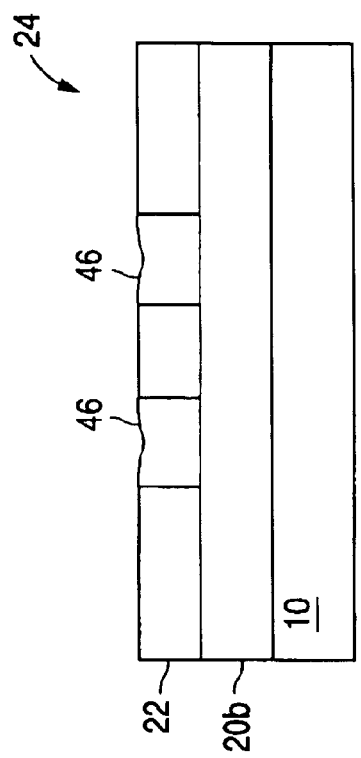
Figure 3H:
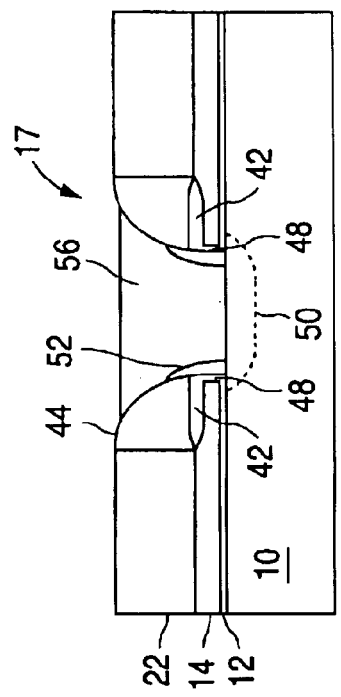

A BSG planarization step follows (preferably CMP), which etches the BSG layer 54 down even with nitride layer 22 and oxide spacers 44, and leaves BSG blocks 56 in first trenches 26 (in the active region 17). An optional BSG etch-back step follows if necessary to clear any BSG residue on nitride layer 22. The resulting active region structure is shown in FIG. 3H, and the resulting strap region structure is shown in FIG. 4H.

A nitride etch is then performed to remove nitride layer 22 from both the active region 17 and the strap region 24, as shown in FIGS. 3I and 4I. If a composite dummy layer 54 was used, this nitride etch would remove that extra nitride layer outside of first trench 26. An anisotropic poly etch follows to remove the portion of poly layer 14 not covered by oxide spacers 44 in the active region 17 (FIG. 3J). The poly etch has no affect on the strap region 24 (FIG. 4J). The nitride and poly etch steps effectively create second trenches 60, one on either side of the mirror pair of memory cells in the active region 17, as well as upwardly projecting sharp edges 62 on side edges of poly layer 14. A controlled isotropic oxide etch is then performed, to remove exposed portions of oxide layer 12, and to remove a small portion of spacers 44 directly over the sharp edges 62. This oxide etch has a negligible effect on the strap region 24. The resulting structure is shown in FIGS. 3J and 4J.

The next step is a thermal oxidation process, which forms an oxide layer 64 on the exposed ends of poly layer 14 (strap region 24 unaffected). Oxide layer 64 joins with oxide layer 42 in forming an insulation layer that is disposed laterally adjacent to and over the polysilicon layer 14. The sharp edges 62 and the thickness of the insulation layer formed by oxide layers 64/42, permit Fowler-Nordheim tunneling of charges therethrough. The oxidation process also re-forms oxide layer 12 over the exposed portions of the substrate 10. The deposition of a thick poly layer 66 over the active region and strap region structure follows, as illustrated in FIGS. 3K and 4K.

While not shown in the above figures, at least one peripheral region 130 of the substrate 10 is disposed adjacent to the memory cell array. Logic devices, such as low or high voltage MOS FET's, are formed in the peripheral region that relate to the operation of the memory cell array. As shown starting with FIG. 3L, the peripheral region 130 is preferably separated from one of the active regions 17 by an isolation region 132 (such as STI isolation as described above) formed in the substrate 10. Poly layer 66 formed over the active region 17 extends over the peripheral region 130. FIG. 4L illustrates the same strap region 24 as shown in FIG. 4K.

A relatively thick (~1500 Å) nitride layer 134 is formed over poly layer 66, as shown in FIGS. 3L and 4L. The entire structure is then planarized preferably employing a chemical-mechanical polishing (CMP) process using oxide blocks 46 as a polishing stopper, as shown in FIGS. 3M and 4M. As shown in FIG. 3M, the oxide spacers 44, poly layer 66, nitride layer 134, and BSG block 56 in the active and peripheral regions 17/130 are polished down so that they have exposed top surfaces that are substantially co-planar with each other, leaving nitride layer 134 covering poly layer 66 in the peripheral region 130 and partially covering poly layer 66 in active region 17. As shown in FIG. 4M, the oxide blocks 46, poly layer 66 and nitride layer 134 are polished down with top surfaces substantially co-planar with each other in the strap region 24, resulting in a poly block 72 disposed between oxide blocks 46, and nitride layer 134 partially covering poly layer 66 on either side of the oxide blocks 46.

An oxidation process is performed to form a layer of oxide 142 on all exposed surfaces of poly layer 66 (i.e. adjacent oxide spacers 44 in the active region 17 and adjacent oxide blocks 46 in strap region 24) and poly block 72 (in strap region 24). A nitride etch process is used to remove all remaining portions of nitride layer 134, as shown in FIGS. 3N and 4N. A dry (anisotropic) poly etch follows to remove all exposed portions of poly layer 66 which are not protected by oxide layer 142, leaving poly blocks 144 adjacent the oxide blocks 44 (in active region 17) and poly blocks 146 adjacent oxide blocks 46 (in strap region 24), as shown in FIGS. 3O and 4O. This poly etch has a good process window that permits a sufficient over-etching to clean up poly residues throughout the area without losing the control dimension of poly blocks 144/146.

A nitride layer 148 is formed over the active, peripheral and strap regions 17/130/24. A masking step is used to protect active and strap regions 17/24 while a nitride etch is used to remove nitride layer 148 from the peripheral region 130 only (as shown in FIGS. 3P and 4P). Once the masking material is removed, a well region 150 is formed in the peripheral region 130 of substrate 10 by masking the structure except for the peripheral region 130, and performing suitable ion implantation through oxide layer 12 (i.e. well implant, punch through implant and $V_t$ implant) to form one or more well regions 150 as shown in FIG. 3P. The well region 150 is N type, for P-channel MOSFET transistors. Similar masking steps can be performed to form other types of wells (e.g. P type) for N-channel MOSFET transistors through conventional IC practice that well known in the art.

After the masking material is removed, an oxide etch is used to remove the exposed portion of oxide layer 12 from the peripheral region 130 (using the substrate 10 as an etch stop). A gate oxide layer 152 is then formed on the exposed surface of the substrate 10 using a thermal oxide process, with a thickness that is appropriate for the voltage requirements of the logic devices formed in the peripheral region 130. A layer of polysilicon is next deposited over the structure, following by photo resist 154 formed over the polysilicon layer. A masking step is then used to remove the photo resist 154 except for locations under which transistor (logic) gates are to be formed in the peripheral region 130. A dry poly etch process is then used to remove the deposited poly layer except for residual poly spacers 156 adjacent planar portions of nitride layer 148, and poly blocks 158 underneath the remaining portions of photo resist 154. Residual poly spacers 156 should be removed to prevent electrical shorts in the device, and poly blocks 158 form the logic (transistor) gates of the logic devices formed in the peripheral region 130. The resulting structure is shown in FIGS. 3Q and 4Q.

The remaining photo resist 154 is removed. New photo resist 160 is formed over the structure. A masking step is used to remove the photo resist 160 except for over the peripheral region 130. A poly etch process is then used to remove any polysilicon residue, including residual poly spacers 156 from the active and strap regions 17/24, as shown in FIGS. 3R and 4R. After photo resist 160 is removed, a nitride etch process is performed to remove nitride layer 148, as illustrated in FIGS. 3S and 4S. A thermal oxidation step follows to form an oxide layer 162 on any exposed portions of poly blocks 144/158/146, which encapsulates these poly blocks. The resulting structure is shown in FIGS. 3T and 4T.

The active region 17 is then masked with photo resist while ion implantation is used to form source and drain regions (third and fourth regions) 122/124 for MOSFETs in the well region 150 in a similar manner as the first region 50 was formed, as shown in FIG. 3U. Nitride is then deposited over the structure, followed by an anisotropic nitride etch (such as RIE dry etch) to remove all the deposited nitride except for spacers 164 formed against planar portions of oxide layer 162 (adjacent poly blocks 144 in the active region 17, poly blocks 158 in the peripheral region 130, and poly blocks 146 in the strap region 24). The PFETs in the peripheral region 130 are then masked with photo resist while ion implantation (e.g. N+ region formed by arsenic implant) is then used to form the second regions (i.e. drain regions) 78 in the active region substrate 10, as shown in FIG. 3U. The same implant can be optionally used to form source and drain regions for N type MOSFETs (not shown) that are well known in the art. The first and second regions 50/78 have a conductivity type (e.g. N type) that is different from that of the surrounding substrate 10 (e.g. P type). Likewise, third and fourth regions 122/124 have a conductivity type (e.g. P type) that is different from that of the surrounding well region 150 (e.g. N type). These ion implantations have no effect on the strap region 24.

The active and strap regions 17/24 are masked, and a thin anisotropic oxide etch is performed to remove exposed portions of oxide layer 152 over the substrate 10 in the peripheral region 130 (adjacent nitride spacers 164). A metal deposition step is then performed, to deposit a metal (e.g. tungsten, cobalt, titanium, nickel, platinum, or molybdenum) over the peripheral region structure, which is then annealed to permit the hot metal to flow and to seep into the exposed top portions of the substrate 10 to form a conductive layer of metalized silicon 80 (silicide) on the substrate next to side wall spacers 164. Metalized silicon regions 80 can be called self aligned silicide (i.e. salicide), because they are self aligned to the third/fourth regions 122/124 by spacers 164. The hot metal also forms a conductive layer of metalized polysilicon 82 (polycide) on the exposed top portions of poly blocks 158 in peripheral region 130. The rest of the metal deposited on the remaining structure is removed by a metal etch process, as well as the masking material, to result in the structure shown in FIGS. 3U and 4U.

A thick oxide layer 166 (e.g. PECVD oxide) is deposited over the structure. An oxide planarization step follows (preferably CMP), which etches the oxide layer 166 down even with the top surfaces of poly blocks 144/146/72, and exposes BSG block 56, as shown in FIGS. 3V and 4V. This oxide planarization step also removes oxide layer 142 in the active and strap regions 17/24.

The BSG dummy blocks of material 56 are then removed from first trenches 26 using a BSG etch process, as shown in FIG. 3W. If a composite material is used in making dummy blocks 56, then multiple etch steps may be necessary to entirely remove dummy blocks of material 56. The first trenches 26 are then filled with blocks 168 of metal material in the following manner. A layer of TiN material 170 is preferably deposited over the structure, followed by the deposition of a thick layer of conductive metal such as aluminum or tungsten. First, a metal planarization step follows (e.g. CMP), which etches the metal layer down even with the top of the first trenches 26, leaving blocks 168 of conductive metal in first trenches 26. The strap regions 24 remain essentially unaffected. The resulting structure is shown in FIGS. 3X and 4X.

An insulating material, such as oxide 84 (e.g. BP TEOS), is used to cover the structure. A masking step is performed to define etching areas over the second regions 78 (in active region 17) and the poly block 72 (in strap region 24). The oxide 84 is selectively etched in the etching areas to create contact openings that are ideally centered over the second regions 78 and poly block 72. The contact openings are then filled with conductor metal contacts 86 and 102 by metal deposition and planarizing etch-back. In each of the active regions 17, a bit line 88 is added by metal masking over the oxide 84 to connect together the contacts 86 in the active regions. In the strap region, strap jumper 90 is added by metal masking over the oxide 84 to connect to contact 102.

A metal source line strap 112 and a pair of metal word line straps 114 and 116 are formed over, and extend parallel to, each row of memory cells preferably by a similar metal masking process used to form bit lines 88. In the strap region 24, a metal via 118 is formed to connect the strap jumper 90 with the appropriate strap 112/114/116. The metal via 118 shown in FIG. 4Y connects the strap jumper 90 with the word line strap 116. Metal straps 112/114/116, jumpers 90 and metal via's 118 are surrounded by an appropriate insulation material 120, such as oxide. The final active region memory cell structure is illustrated in FIG. 3Y, and the final strap region structure is illustrated in FIG. 4Y.

As shown in FIG. 3Y, first and second regions 50/78 form the source and drain for each memory cell (those skilled in the art know that source and drain can be switched during operation). A channel region 92 for each cell is the portion of the substrate that is in-between the source and drain 50/78. Poly blocks 144 constitute the control gates, and poly layer 14 constitutes the floating gate for the memory cells. The control gates 144 have a lower first portion 144a that is disposed laterally adjacent the floating gate 14 (insulated therefrom by oxide layer 64), and an upper second portion 144b that protrudes over the sharp edge 62 of floating gate 14. Floating gate 14, which is disposed over part of the channel region 92, is partially overlapped at one end by the control gate 144, and partially overlaps the first region 50 with its other end. The process of the present invention forms pairs of memory cells that mirror each other, where each pair of memory cells shares a single source region 50. Metal blocks 168 and control gates 144 are formed to continuously extend across the isolation and active regions 16/17, and thus electrically connect all the sources 50 together and all the control gates 144 together for each row of paired memory cells. The non-volatile memory cells are of the split gate type having floating gate to control gate tunneling all as described in U.S. Pat. No. 5,572,054, whose disclosure is incorporated herein by reference with regard to the operation of such a non-volatile memory cell and an array formed thereby.

Also shown in FIG. 3Y are logic devices 172 formed in the peripheral region 130. The logic devices 172 include poly gates 158 disposed over the well region 150 and insulated therefrom by the gate oxide layer 152. The poly gates 158 selectively activate (i.e. turn on) channel regions 93 of well region 150 of the substrate 10 disposed between third and fourth regions 122/124. Logic devices 172 are low voltage (e.g. ~3V) or high voltage (e.g. ~12V) MOS FET's, where the thickness of the oxide layer 152 and the implantation depth and concentration of the third and fourth regions 122/124 dictate the breakdown voltage of the logic devices 172.

The foregoing method and memory cell array formed thereby have several advantages. First, the source line resistance is significantly reduced by forming the source line blocks 168, which are in electrical contact with the source regions 50, using a highly conductive metal. This lower source line resistance allows the use of fewer strap regions and makes it easier to scale down the size of the memory cell array. Second, the control gates 144 have a vertically oriented (planar) back wall to more easily form spacers 164. The self-aligned oxide layers 142 covering only part of the poly layer 66, combined with an anisotropic poly etch, make it possible to form the vertically oriented back walls of control gates 144 without having to worry about over etching. Thus, the poly etch that forms these vertical back walls can be used to extensively clean the structure of residual polysilicon (including poly stringers) without compromising the final structure. Third, the logic device gate poly's 158 (and logic gate oxide layer 152) are formed separately from memory cell control gate poly's 144 (and poly gate oxide layer 12) so that their respective thicknesses are decoupled and can be optimized separately. Finally, the memory structure of the present invention is formed by using a relatively low number of masking steps.

Strap Regions

Figure 6A:
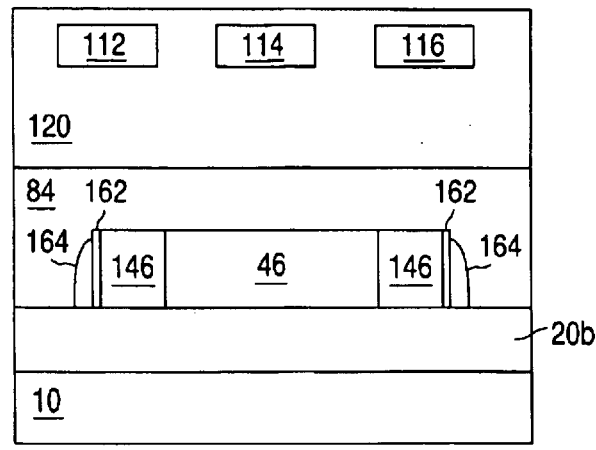
FIG. 6A is a cross sectional view of the completed strap region structure imaged by the line 6A—6A portion of the mask of FIG. 5.
Figure 6B:
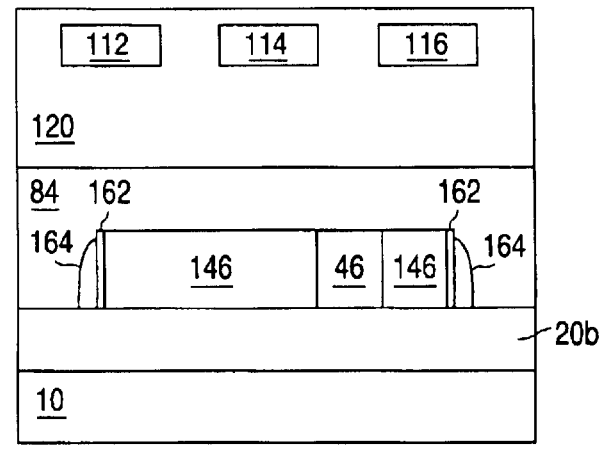
FIG. 6B is a cross sectional view of the completed strap region structure imaged by the line 6B—6B portion of the mask of FIG. 5.
Figure 6C:
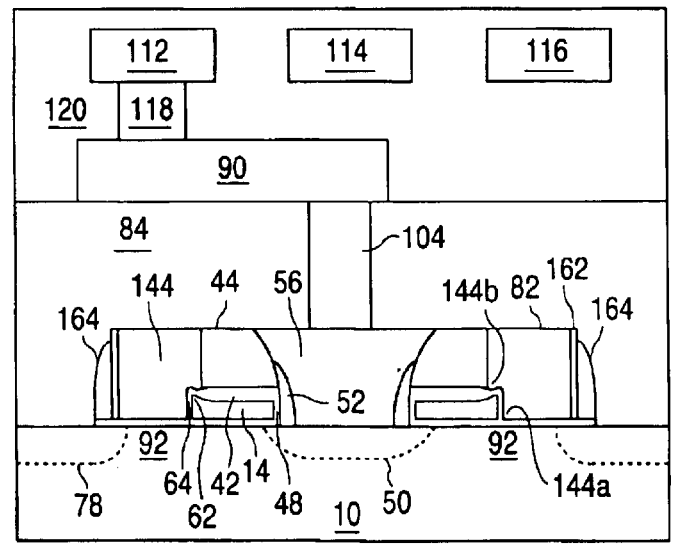
FIG. 6C is a cross sectional view of the completed strap region structure along the line 6C—6C of FIG. 7.
Figure 7:
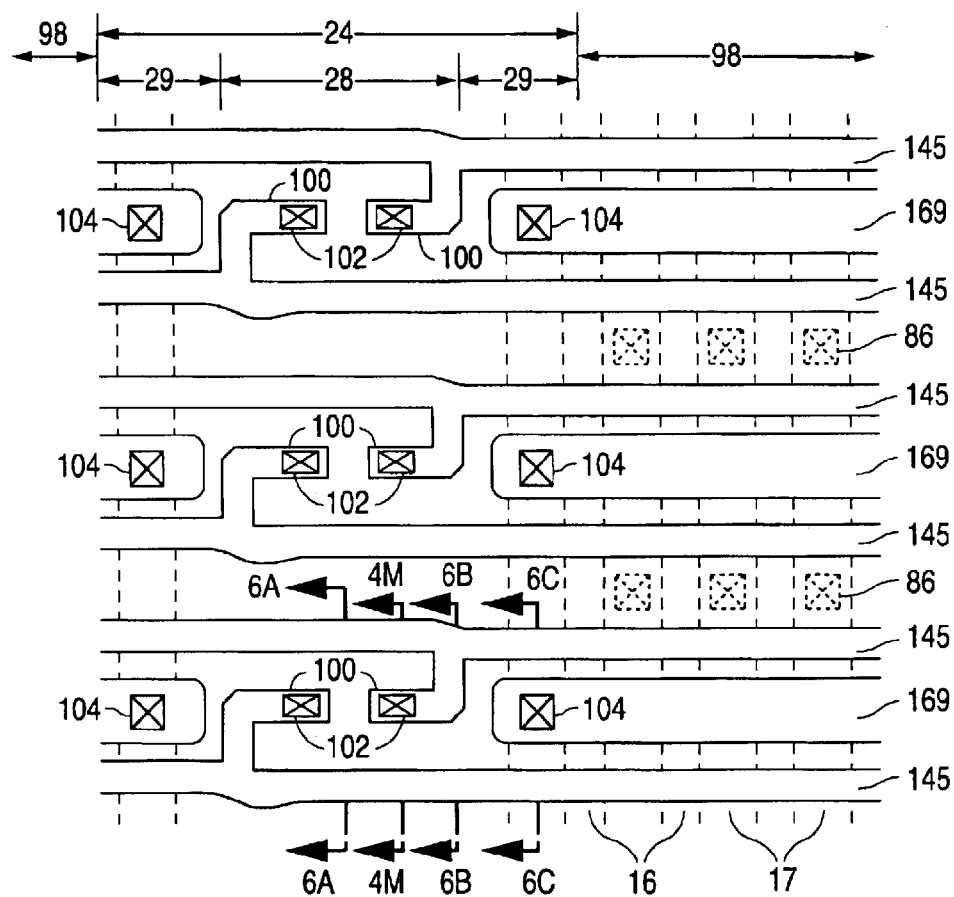
FIG. 7 is a top plan view of the strap cells and adjacent memory cell arrays of the present invention.

FIG. 4Y is the final cross sectional view of one portion of the 'H' shaped trench pattern formed strap region 24 (corresponding to line 4B—4B of the mask 30 in FIG. 5). FIGS. 6A, 6B and 6C illustrate cross sections of other portions of the trench pattern formed in strap region 24, corresponding to lines 6A—6A, 6B—6B and 6C—6C, respectively, of mask 30 in FIG. 5, and as shown in FIG. 7. These figures illustrate, given the proper dimensions of mask 30, that conductive polysilicon is generally formed on those strap region portions imaged under the opaque portions of mask region 32, and silicon dioxide is generally formed on those strap region portions imaged under the transparent aperture portions of mask region 32.

Thus, the final layout of the structure is illustrated in FIG. 7. Columns of strap regions 24 are interlaced with columns of memory cell arrays 98, where the memory cell arrays 98 include columns of active regions 17 interlaced with columns of isolation regions 16. Each row in each strap region 24 includes a WL strap cell 28 disposed between a pair of SL strap cells 29, all aligned with one of the memory cell rows. The active regions 17 immediately adjacent to the WL strap cells 28 are actually dummy regions that do not contain any active memory cells, but rather are part of the strap region 24 and used to form the SL strap cells 29.

The control gates 144 for each row of memory cells are continuously formed as a single word line 145 that connects together all the control gates 144 in that row of memory cells. Each of the word lines 145 pass through the strap regions 24. An 'L' shaped contact lead 100 (corresponding to one of the 'L' shaped members 35 of mask 30) extends from each of the word lines 145 toward the center of the WL strap cell 28, and terminates with the electrical contact 102 formed thereon. Each of the word line straps 114/116 extend parallel to one of the word lines 145, with intermittent electrical contact therebetween in the strap regions 24 by metal contacts 102, metal jumpers 90 and metal via's 118. The metal word line straps 114/116 ensure that a substantially even voltage is applied along the entire length of each of the word lines 145.

The metal blocks 168 (disposed over and in electrical contact with source regions 50) for each row of memory cells pairs are continuously formed as a single source line 169 that connects together all the metal blocks 168 (and source regions 50 connected thereto) in that row of memory cell pairs. Each of the source lines 169 terminate in the SL strap cells 29, and do not pass through the strap regions 24. Instead, each source line 169 terminates with an electrical contact 104 formed near the center of the SL strap cell 29 in a similar manner as the bit line contacts 86, as shown in FIG. 7. The metal source line straps 112 connect together the contacts 104 in the strap cells 29 through metal via 118 and metal strap jumper 90. In the preferred embodiment, the metal source line straps 112 each extend parallel to source lines 169, with contact to the underlying source line 169 by contacts 104 in strap cells 29. Alternately, source line straps 112 could simply extend from one SL strap cell 29, over or around the WL strap cell 28, to the other SL strap cell 29 in the same strap region 24. In any event, word line straps 114/116, source line straps 112, and bit lines 88 are all metal conduit that are three-dimensionally configured (lateral spacing and height above the memory cell array) in and above the oxide 120 so as to not interfere with each other, yet each connect between with the appropriate voltage source and strap regions with minimal space requirements.

Figure 8:
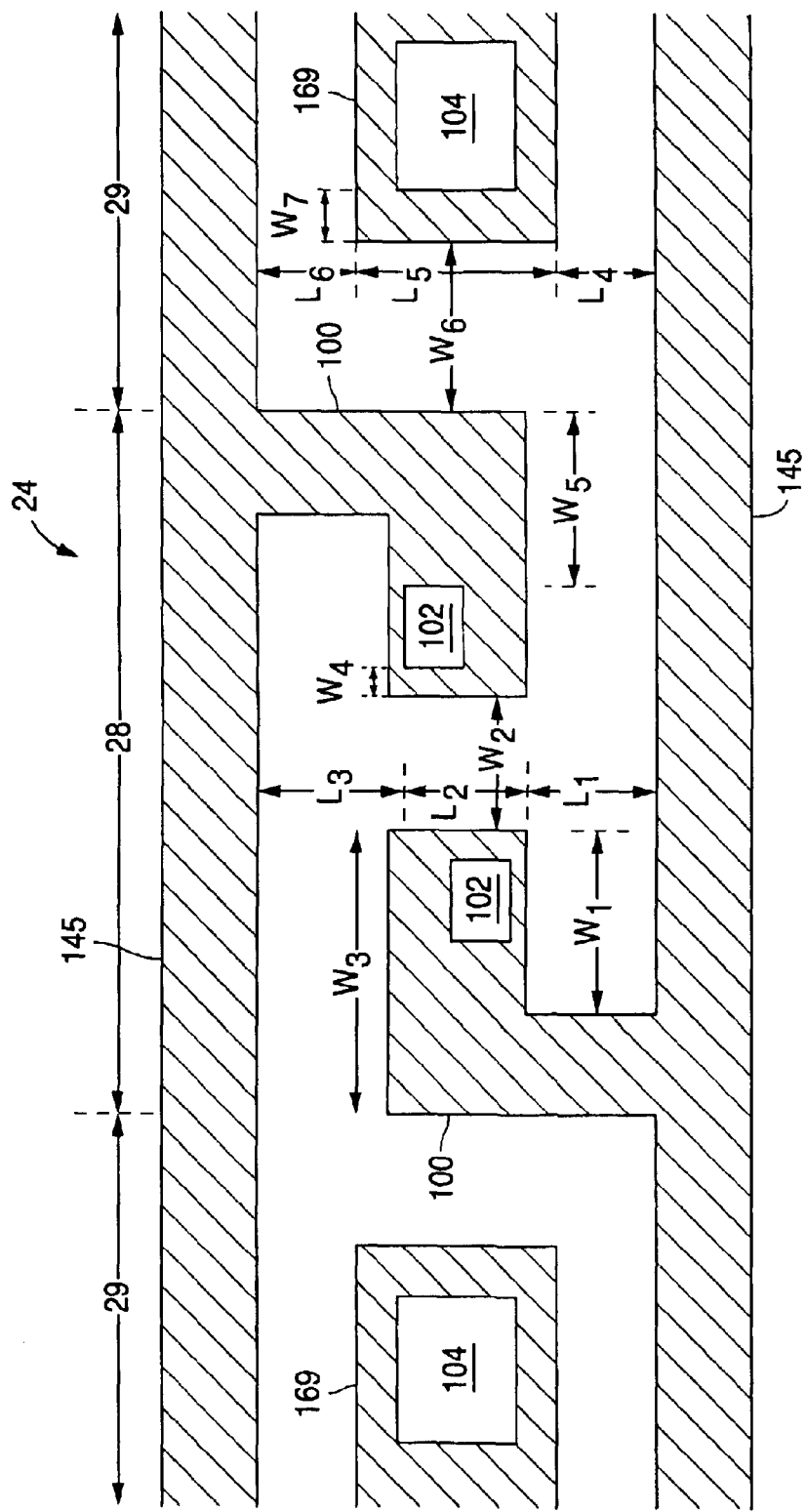
FIG. 8 is a top plan view of a WL strap cell and SL strap cell structure of the strap region of the present invention.

FIG. 8 illustrates various dimensions of the strap region 24 that can be optimized to best form electrical contacts 102 and 104 without shorting the word lines 145 to each other, or to the source line 169. W1 to W7 (and L1 to L6) are ideally set so any inadvertent horizontal (and/or vertical) shifts of any of the strap region elements would not result in an improperly formed contact or an inadvertent short. However, certain dimensions must be small enough to prevent the formation of the source line 169 in the strap region 24. For example, for many applications, the dimensions between conductive elements (e.g. L1, L3, W2) should be no greater than approximately twice the thickness T of the insulation layer deposited to form the insulation therebetween. Thus, the deposited insulation is not removed by subsequent etch steps to prevent the formation of conductive material in these regions.

Figure 1:
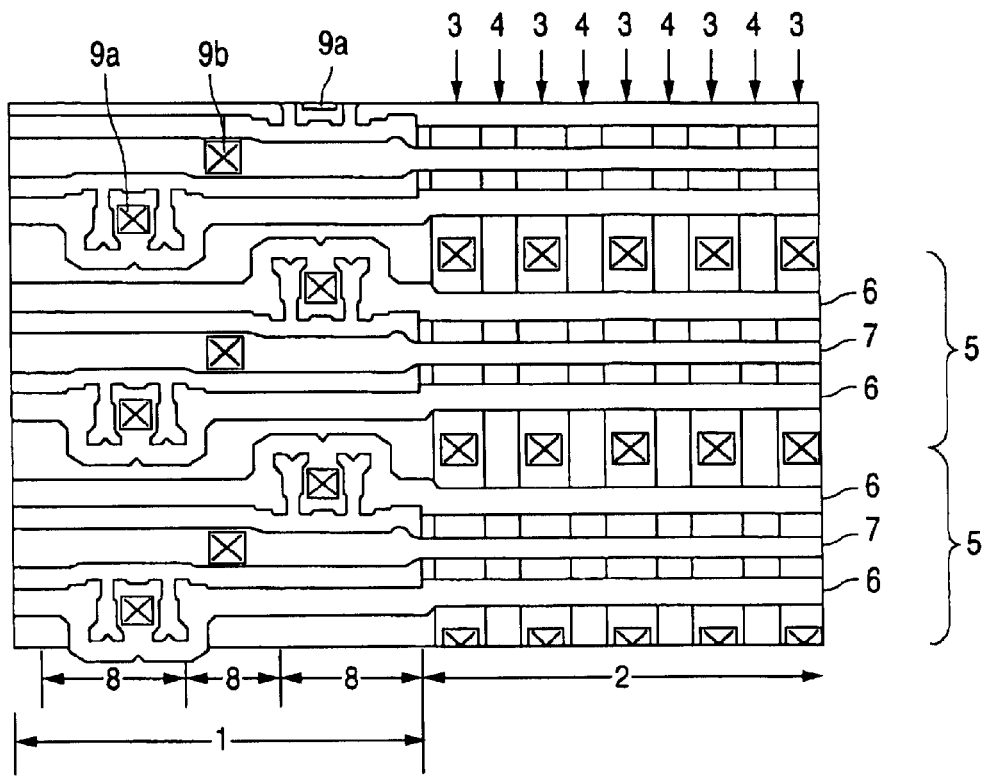
FIG. 1 is a top view of an array of non volatile memory cells, and a conventional strap region formed adjacent thereto.

With the present invention, additional room is made within the strap regions 24 because the source lines 169 do not traverse therethrough. This additional room allows the strap cells 28 and contacts formed therewith to be formed within the "effective width" of the memory cell row, and even along the row centerlines, as opposed to extending out toward adjacent memory cell rows as shown in FIG. 1. The "effective width" of a memory cell row is the distance (in the Y direction) taken up by the conductive memory cell components (e.g. floating gate, source line, control gate or control line, etc.) formed above the substrate. Thus, for the mirror cells illustrated in the figures, the "effective width" of each row is the distance between the two word lines 145 in each row of memory cells (distances $L_4$, $L_5$ and $L_6$) plus the widths of the two word lines 145 themselves. This is important because the word line electrical contacts 9a in FIG. 1 had to be formed outside of the effective width of the corresponding row of memory cells. As a result, the scaling down of the memory cell array along the "Y" direction was consequently prohibited because extra (wasted) space between memory cell rows was necessary to leave room for these electrical contacts. The present invention removes this constraint by allowing strap cells 28 to be formed within the effective width of the memory cell row, and in some embodiments even within the distance between pairs of word lines in each row, to form rows of memory cells in the array that are closer together (in the Y direction). Further, for any given size strap cell region 24, the extra room allows contacts 102 to be formed further apart to reduce the risk of shorting word or source lines together. Finally, the extra room within the strap regions 24 allows them, and the memory cell array as whole, to be safely scaled down in size in both the X (row) and Y (column) directions.

It should be noted that by following the same concepts as demonstration above, other configurations of mask 30 can be used to form strap regions 24 according to the present invention. For example, FIGS. 9A, 10A, 11A and 12A are alternate embodiments of mask 30, where the patterned aperture 31 resembles an 'S' shape (FIG. 9A), a '$' shape (FIG. 10A), an 'I' shape (FIG. 11A), or a modified 'S' shape (FIG. 12A).

Figure 9A:
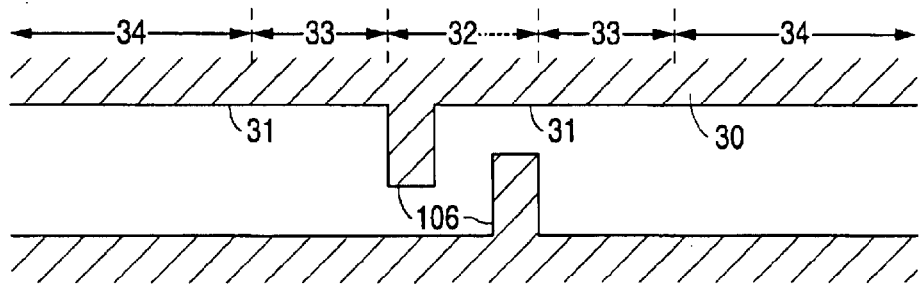
FIG. 9A is a top view of a first alternate embodiment of the mask, which is used to form the first trenches in the active regions and the 'S' shaped strap cell in the strap regions.
Figure 9B:
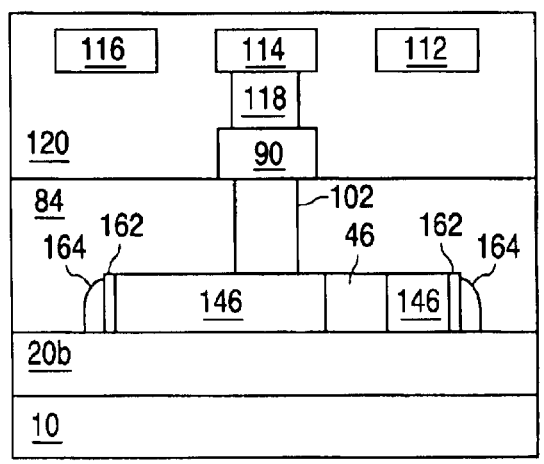
FIG. 9B is a cross sectional view of the 'S' shaped strap region structure along line 9B—9B in FIG. 9C.
Figure 9C:
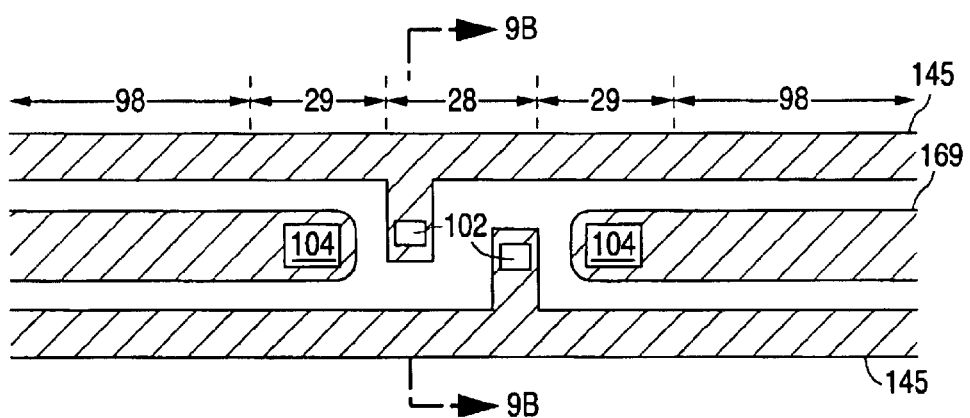
FIG. 9C is a top view of the 'S' shaped strap cell structure.

The 'S' shaped mask 30 of FIG. 9A includes a pair of tab members 106 that extend out from opposing sides of aperture 31 to form an 'S' shaped aperture. The cross-section of the resulting structure imaged under the tab members 106 is illustrated in FIG. 9B, and the resulting layout of the final structure is illustrated in FIG. 9C.

Figure 10A:
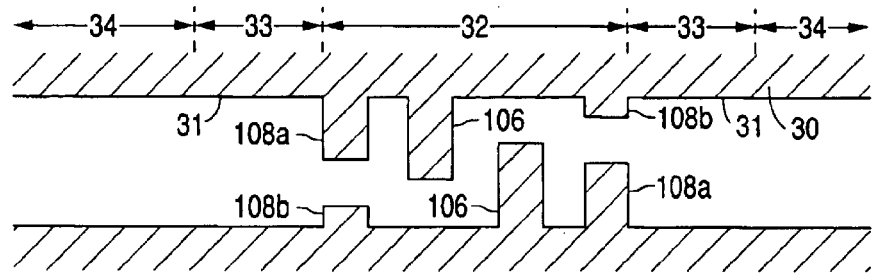
FIG. 10A is a top view of a second alternate embodiment of the mask, which is used to form the first trenches in the active regions and the '$' shaped strap cell in the strap regions.
Figure 10B:
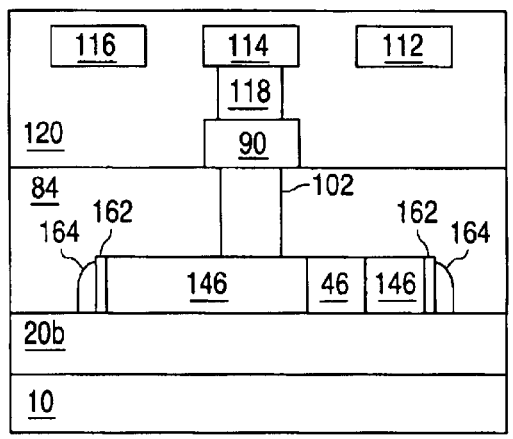
FIGS. 10B and 10C are cross sectional views of the '$' shaped strap region structure, along lines 10B—10B and 10C—10C respectively in FIG. 10D.
Figure 10C:
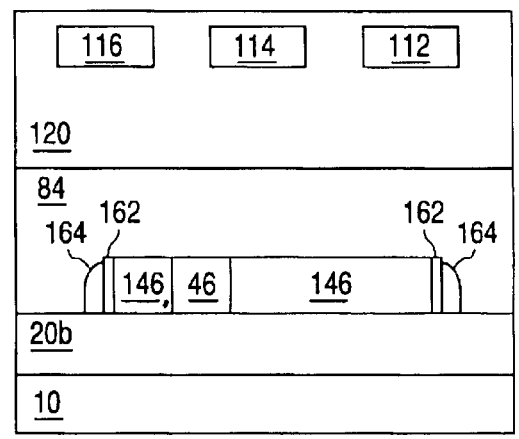
Figure 10D:
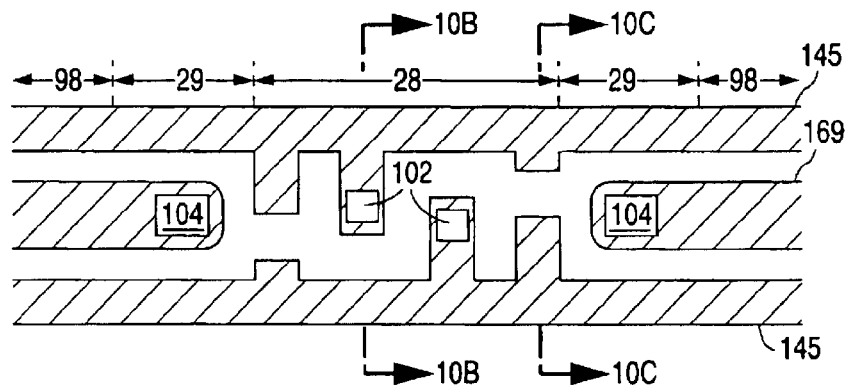
FIG. 10D is a top view of the '$' shaped strap cell structure.

The '$' shaped mask 30 of FIG. 10A is similar to that shown in FIG. 9A, but further includes opposing tab members 108a and 108b that extend out from opposing sides of aperture 31 to form a '$' shaped aperture 31. The cross-sections of the resulting structure imaged under the tab members 106 and under tab members 108a/b are illustrated in FIGS. 10B and 10C respectively, and the resulting layout of the final structure is illustrated in FIG. 10D.

Figure 11A:
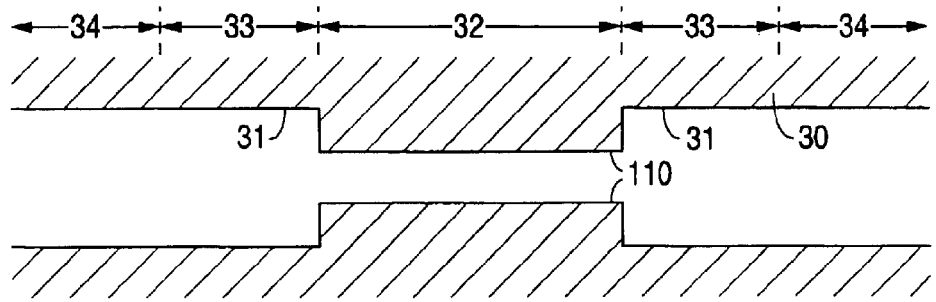
FIG. 11A is a top view of a third alternate embodiment of the mask, which is used to form the first trenches in the active regions and the 'I' shaped strap cell in the strap regions.
Figure 11B:
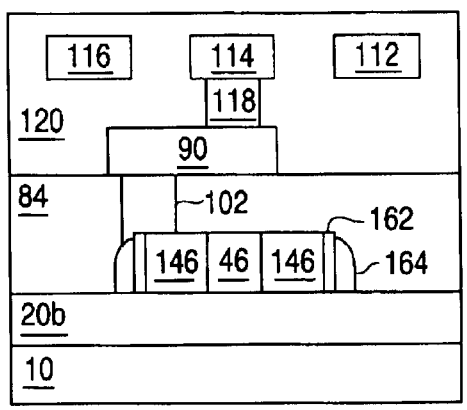
FIG. 11B is a cross sectional view of the 'I' shaped strap region structure, along line 11B—11B in FIG. 11C.
Figure 11C:
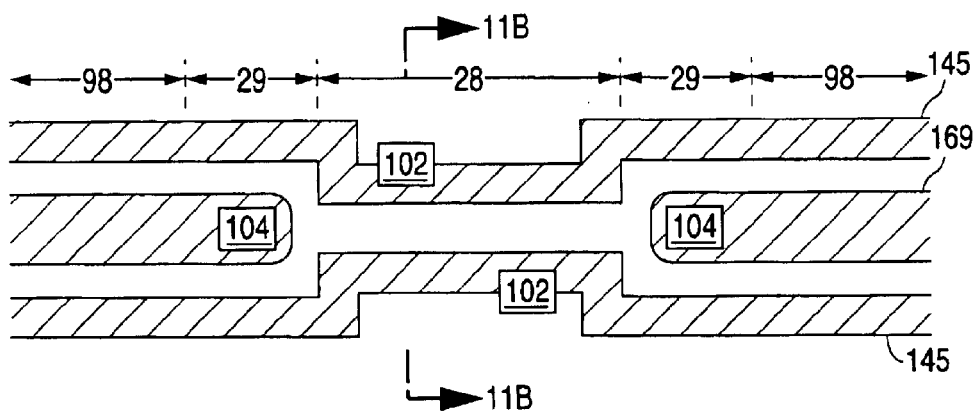
FIG. 11C is a top view of the 'I' shaped strap cell structure.
Figure 12A:
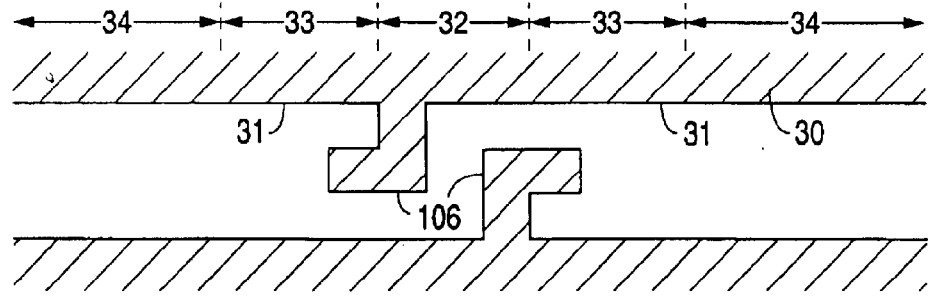
FIG. 12A is a top view of a fourth alternate embodiment of the mask, which is used to form the first trenches in the active regions and the 'S' shaped strap cell in the strap regions.

The 'I' shaped mask 30 of FIG. 11A includes a pair of directly opposing tab members 110 that extend out from opposing sides of aperture 31 to form an 'I' shaped aperture 31. The cross-section of the resulting structure imaged under the tab members 110 is illustrated in FIG. 1B, and the resulting layout of the final structure is illustrated in FIG. 1C.

Figure 12B:
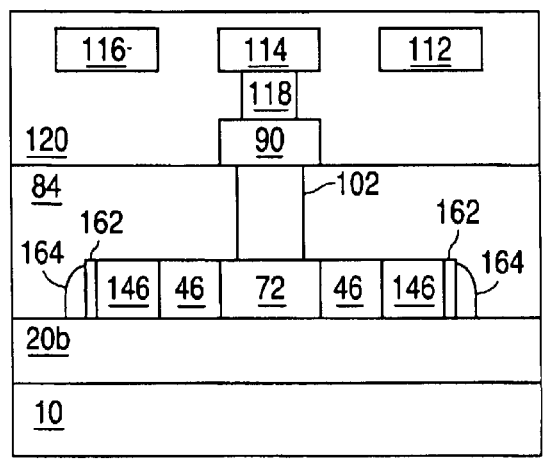
FIG. 12B is a cross sectional view of the 'S' shaped strap region structure, along line 12B—12B in FIG. 12C.
Figure 12C:
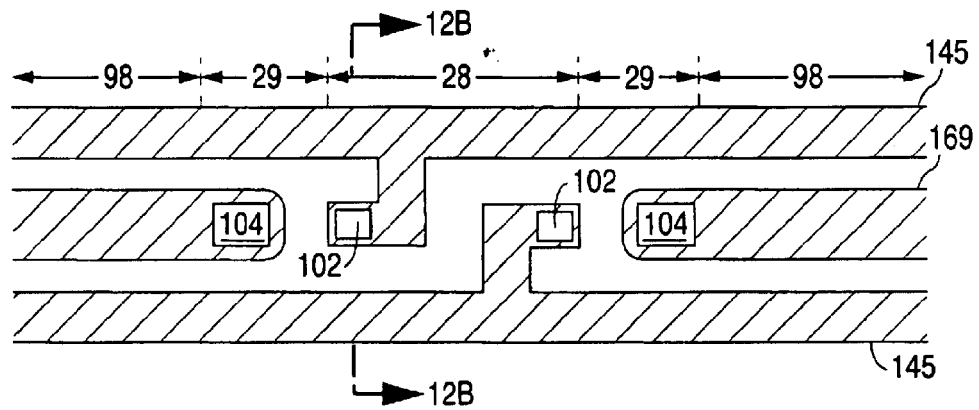
FIG. 12C is a top view of the 'S' shaped strap cell structure.

The modified 'S' shaped mask 30 of FIG. 12A includes a pair of 'L' shaped tab members 106 that are similar to the 'L' shaped tabs 35 shown in FIG. 5. The tabs 106 extend out from opposing sides of aperture 31, and then extend away from each other, to form an 'S' shaped aperture. The cross-section of the resulting structure imaged under the tab members 106 is illustrated in FIG. 12B, and the resulting layout of the final structure is illustrated in FIG. 12C.

Each of the masks shown in FIGS. 9A, 10A, 1A or 12A result in a strap region 24 which is not traversed by the source line 169, and provides locations for forming the word line and source line contacts 102/104 that are sufficiently spaced apart from each other and from other strap region elements.

First Alternate Embodiment

FIGS. 13A to 13E and 14A to 14E illustrate an alternate process for forming the memory cell structure similar to that illustrated in FIG. 3Y, whereby a self aligned contact scheme (SAC) is used to achieve a smaller cell length and size. This first alternate process begins with the same structure as shown in FIGS. 3V and 4V.

Before the dummy blocks of material 56 are removed from first trenches 26, a controlled poly etch is used to remove top portions of poly blocks 144 (in the active regions 17), and poly blocks 146 and 72 (in the strap regions 24), to a depth of approximately 800 to 1000 Å. The thin layer of oxide 162 is also etched down to the same depth either by the same etch process or by an optional oxide dip. The resulting structure is shown in FIGS. 13A and 14A.

A thick layer of nitride is deposited over the structure, followed by a nitride planarization process (e.g. nitride CMP), which removes all the deposited nitride except for nitride layer 174 disposed over poly blocks 144 (in the active regions 17), and poly blocks 146 and 72 (in the strap regions 24), as illustrated in FIGS. 13B and 14B.

The structure is then processed in a similar manner as described above with regard to FIGS. 3W to 3Y. Namely, the BSG dummy blocks of material 56 are removed from first trenches 26, as shown in FIG. 13C. The layer of TiN material 170 is preferably deposited over the structure, followed by the deposition and planarization of the metal material to form blocks 168 of conductive metal in first trenches 26, as shown in FIGS. 13D.

The oxide layer 84 (e.g. BP TEOS), is used to cover the structure. In this first alternate embodiment, a dual damascene metalization scheme is preferably used, which includes the application of a first contact mask leaving only the areas over poly blocks 72 (in strap regions 24) exposed, followed by an oxide etch and then a nitride etch to form contact openings through the oxide layer 84 and nitride layer 174 to expose poly blocks 72. A second contact mask is applied leaving only the areas over second regions 78 (in active regions 17) exposed, followed by an oxide etch to form contact openings through the oxide layer 84 to expose second regions 78. The contact openings are then filled with conductor metal contacts 86 and 102 by metal deposition and planarizing etch-back. The processing of the structure is completed using the same steps as described above with respect to FIG. 3Y, including the formation of the bit line 88, the strap jumper 90, the metal source line strap 112, the pair of metal word line straps 114 and 116, the metal via 118, and the insulation material 120. The final active region memory cell structure is illustrated in FIG. 13E, and the final strap region structure is illustrated in FIG. 14E.

The formation of contact 86 is referred to as a self aligned contact scheme (SAC) because the width of the contact is made wider than the separation between adjacent, facing nitride spacers 164, and thus is self aligned to the drain region 78. Part of the contact 86 is formed directly over poly block 144, but is insulated therefrom by nitride layer 174, thus ensuring that a good contact with the drain region 78 is achieved.

The self aligned contact scheme (SAC) removes an important constraint on the minimum spacing requirement between adjacent sets of paired memory cells, usually encountered in cells using non-self-aligned contact scheme, such as that used with the embodiment of FIG. 3Y. Specifically, while FIGS. 13E and 3Y illustrate the contact area (and thus conductors 86) perfectly centered over the drain regions 78, in reality it is very difficult to form the contact openings without some undesirable horizontal shift relative to the drain regions 78. With a non-self aligned contact scheme, such as that used with the embodiment illustrated in FIG. 3Y, where there is no protective layer of nitride over poly blocks 144, electrical shorts can occur if the contact 86 is shifted over and makes contact with poly block 144. To prevent electrical shorts in the non-self aligned contact scheme, the contact openings are formed sufficiently away from the nitride spacers 164 so that even with the maximum possible shift in the contact regions, they will not extend to nitride spacers 164 or beyond. This of course presents a constraint on the minimum distance between spacers 164 for the embodiment shown in FIG. 3Y, adding distance between adjacent sets of paired mirror cells to create a sufficient tolerance therebetween.

SAC as used in the first alternate embodiment eliminates this constraint by using a protective layer of material (nitride layer 174) over poly blocks 144. With this protective layer, the contact openings are formed in the oxide layer 84 with a sufficient width to ensure there is overlap of the contact opening with the drain regions 78, even if there is a significant horizontal shift of the contact opening during formation. Nitrite layer 174 allows portions of contact 86 to be formed over poly blocks 144 without any shorting therebetween. The wide contact opening guarantees that contacts 86 completely fill the very narrow spaces between spacers 164 of adjacent mirror cell sets, and make good electrical contact with drain regions 78. Thus, the width of contact regions between spacers 164 can be minimized, allowing the scaling down of the overall cell dimension. It should be noted that SAC can be utilized with any of the method embodiments illustrated in this application.

Second Alternate Embodiment

FIGS. 15A to 15C and 16A to 16C illustrate a second alternate process for forming the memory cell structure similar to that illustrated in FIG. 13E, whereby the source line blocks 168 are formed of a metalized polysilicon instead of pure metal. This second alternate process begins with the same structure as shown in FIGS. 13B and 14B.

The dummy blocks of material 56 are removed from first trenches 26. Next, instead of forming the layer of TiN material 170, a poly layer 176 is instead formed over the structure. A metalization process is then used to form a layer of metalized polysilicon 178 (polycide) over poly layer 176 by depositing a metal (e.g. tungsten, cobalt, titanium, nickel, platinum, or molybdenum) over the structure, which is then annealed to permit the hot metal to flow and to seep into the exposed top surface of poly layer 176 to form polycide 178. The thickness of polycide 178 is chosen so that first trenches 26 are filled (e.g. ~1000 Å thick). A polysilicon and polycide planarization process (e.g. CMP) is then used to remove the poly layer 176 and polycide 178, except for inside first trenches 26.

The processing steps described above with respect to FIG. 13E are performed to result in the final structure shown in FIGS. 15C and 16C. This embodiment is advantageous because the polycide process is a more mature process in semiconductor manufacturing, and it avoids the potential problem of inducing metal contamination on the floating gate when tungsten or other metals are used.

Third Alternate Embodiment

FIGS. 17A to 17D and 18A to 18D illustrate a third alternate process for forming the memory cell structure similar to that illustrated in FIG. 15C, whereby the poly layer 176 and metalized polysilicon blocks 178 extend further above source region 50. This third alternate process begins with the same structure as shown in FIGS. 15A and 16A.

Figure 17A:
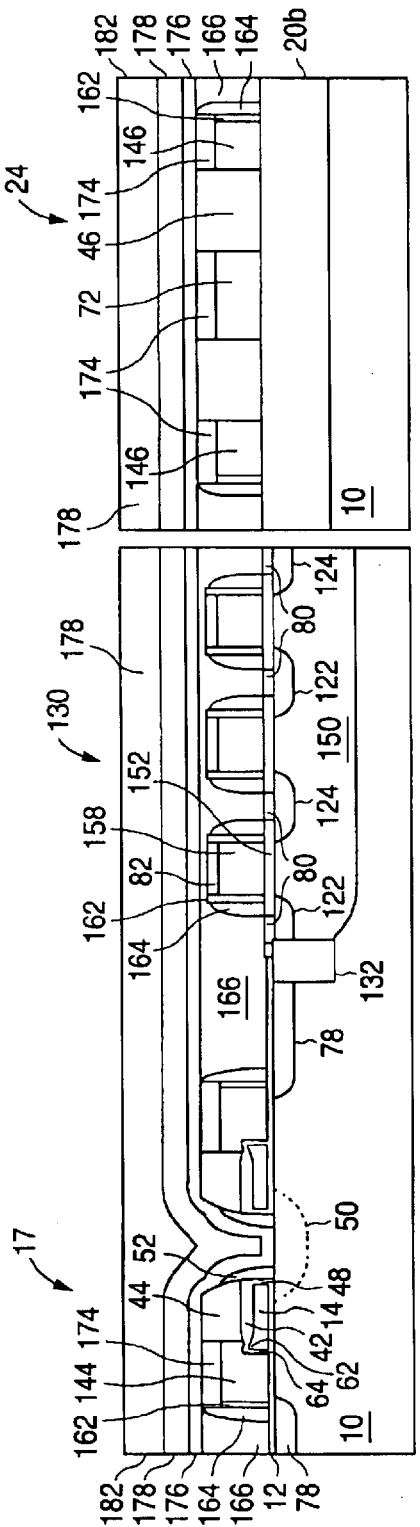
Figure 18A:
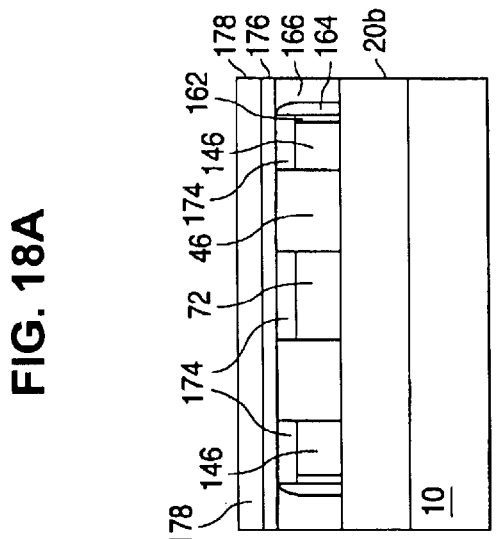

After poly layer 176 and polycide layer 178 are formed, a notch 180 in the upper surface of polycide layer 178 is left and is disposed over the now filled first trench 26. A layer of oxide 182 (e.g. BSG oxide) is formed over the polycide layer 178, filling the notch 180, as illustrated in FIGS. 17A and 18A.

Figure 17B:
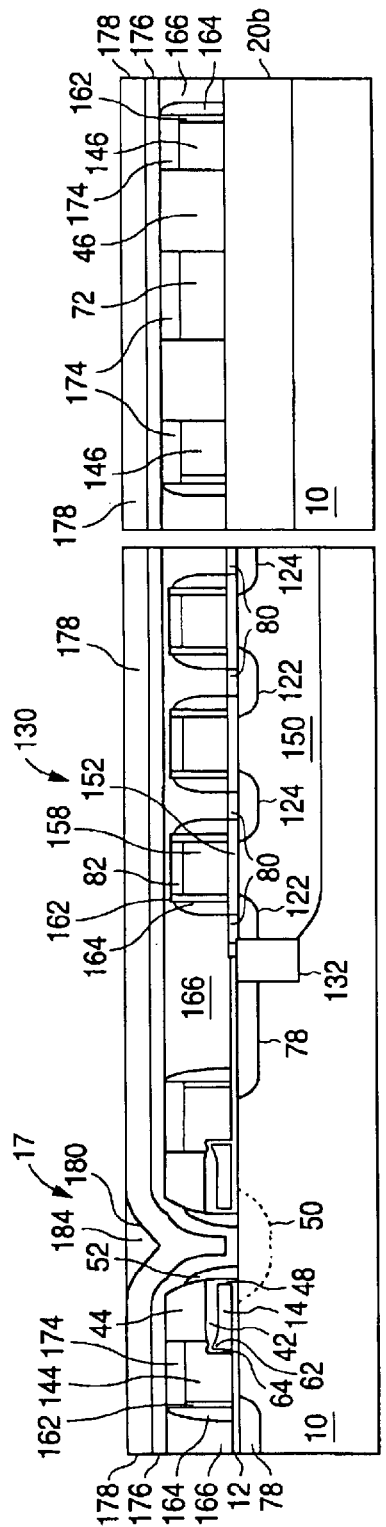
Figure 18B:
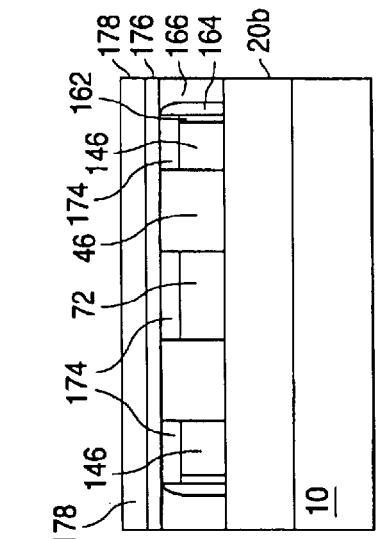

An oxide etch is then performed, using polycide layer 178 as an etch stop, to remove the oxide layer 182, except for a block of oxide 184 disposed in notch 180, as shown in FIGS. 17B and 18B. Anisotropic polycide and poly etches (e.g. RIE dry etch) are used to remove polycide layer 178 and poly layer 176, except for those portions of these layers disposed under and protected by oxide block 184, as illustrated in FIGS. 17C and 18C. Since oxide block 184 protects portions of polycide and poly layer 178/176 outside and above first trenches 26, the remaining portions of polycide and poly layers 178/176 extend well above the top surfaces of oxide blocks 44 and nitride layer 174.

Figures 17D, 18D:
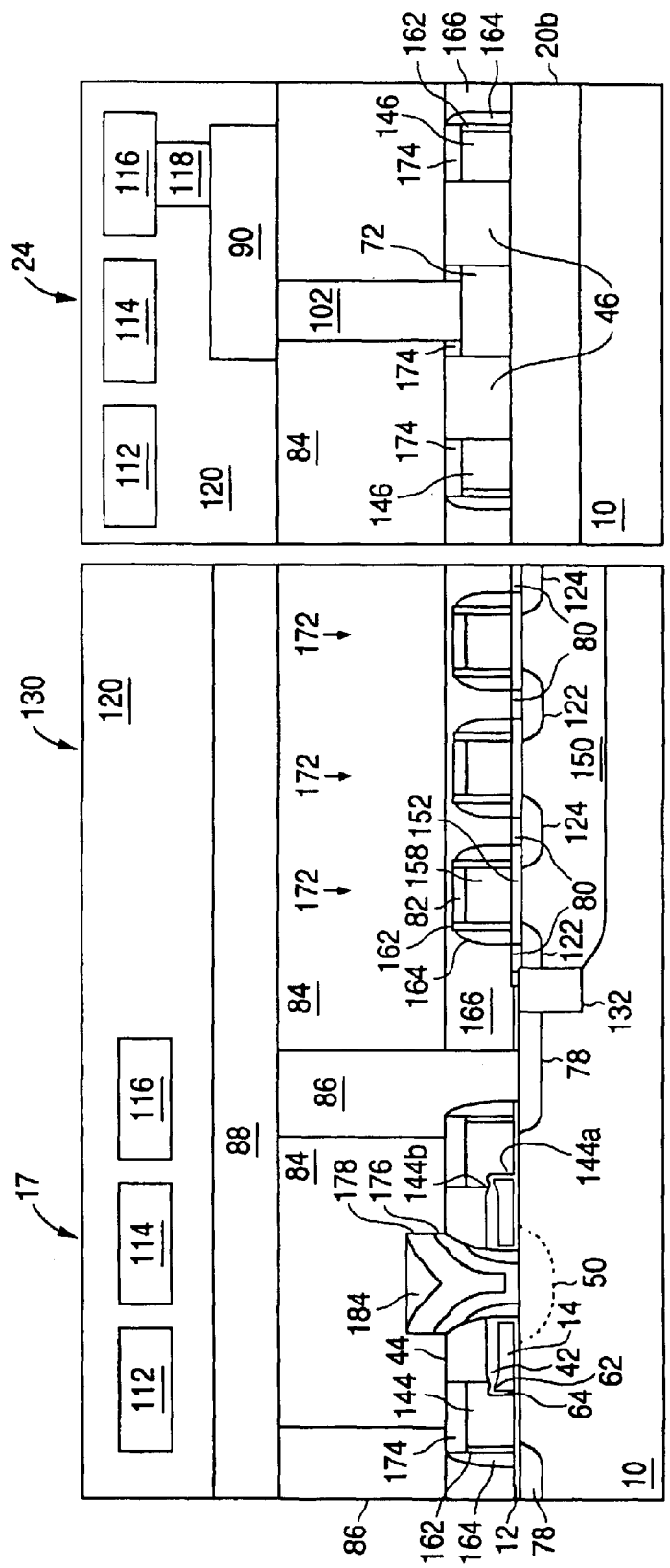

The processing steps described above with respect to FIG. 13E are performed to result in the final structure shown in FIGS. 17D and 18D. The advantage of this embodiment is that conductive polycide and poly layers 178/176 extend upwardly well above the top surfaces of oxide blocks 44, whereby the additional polycide and poly materials increase the conductivity and decrease the resistivity of the source line 169 formed thereby. Furthermore, this is a self aligned process, and no masking step is needed to define the source pattern.

Fourth Alternate Embodiment

FIGS. 19A to 19B and 20A to 20B illustrate a fourth alternate process for forming the memory cell structure similar to that illustrated in FIG. 3Y, whereby conductive polycide layers are formed over poly blocks 144, 146 and 72, and salicide is formed over second (drain) regions 78. This alternate process begins with the same structure as shown in FIGS. 3T and 4T, and follows closely the remaining processing steps of the preferred embodiment with just a few exceptions.

The formation of third and fourth regions 122/124, spacers 164, and second regions 78 are performed in the same manner as described above with respect to FIGS. 3U and 4U. However, the masking of the active and strap regions 17/24 is omitted, so that the thin anisotropic oxide etch used to expose poly blocks 158 additionally removes exposed portions of oxide layer 12 over the substrate 10 in the active region 17 (adjacent nitride spacers 164), as well as oxide layer 142 disposed over poly blocks 144 (in active region 17) and poly blocks 146/72 (in strap region 24). When the metal deposition and anneal steps are performed, the hot metal not only forms salicide and polycide regions 80/82 in the peripheral region 130, but additionally forms metalized silicon 80 (salicide) on the substrate over second regions 78, and metalized polysilicon 82 (polycide) on the exposed top portions of poly blocks 144 (active region 17) and poly blocks 146/72 (strap region 24). The resulting structure is shown in FIGS. 19A and 20A.

The processing steps described above with respect to FIGS. 3V/4V to 3Y/4Y are performed to result in the final structure shown in FIGS. 19B and 20B. The salicide layer 80 over second regions 78 facilitates conduction between the conductor contacts 86 and second regions 78. Polycide 82 over poly bocks 144 facilitates conduction in the row direction along the length of each of the wordlines 145. The polycide 82 over poly block 72 facilitates conduction between the conductor contact 102 and poly block 72. Lastly, polycide 82 over poly blocks 146 facilitates conduction along the length of these poly blocks.

Fifth Alternate Embodiment

FIGS. 21A to 21D and 22A to 22D illustrate a fifth alternate process for forming the memory cell structure similar to that illustrated in FIG. 13E, whereby the SAC metal contacts 86 are formed in the same processing step as the formation of the metal source line blocks 168. This fifth alternate process begins with the same structure as shown in FIGS. 13C and 14C, which is reproduced as FIGS. 21A and 22A.

A layer of photo-resist 186 (contact mask) is formed over the structure, including in first trench 26. A conventional photolithography step is used to define etching areas over second regions 78. Consistent with SAC, each etching area partially extends over spacer(s) 164, oxide layer 162 and/or poly block 144. After the photo resist is removed from the etching area, an anisotropic oxide etch is used to remove the portions of oxide layers 166 and 12 in the etching area to form contact opening 188 extending down to second region 78. The resulting structure is shown in FIGS. 21B and 22B.

The structure is then processed in a similar manner as described above with regard to FIGS. 13D and 13E. Namely, the layer of TiN material 170 is preferably deposited over the structure, followed by the deposition and planarization of the metal material to form the blocks 168 of conductive metal in first trenches 26. This process also forms a layer of the TiN material 170 and a block of the conductive metal material 168 in the contact openings 188, as shown in FIGS. 21C.

The oxide layer 84 (e.g. BP TEOS), is used to cover the structure. A first contact mask is applied leaving only the areas over poly blocks 72 (in strap regions 24) exposed, followed by an oxide etch and then a nitride etch to form contact openings through the oxide layer 84 and nitride layer 174 to expose poly blocks 72. A second contact mask is applied leaving only the areas over second regions 78 (in active regions 17) exposed, followed by an oxide etch to form contact openings through the oxide layer 84 to expose metal blocks 168 disposed over second regions 78. The contact openings over metal blocks 168 and poly blocks 72 are then filled with conductor metal contacts 86 and 102 by the same metal deposition and planarizing etch-back process steps. The processing of the structure is completed using the same steps as described above with respect to FIG. 3Y, including the formation of the bit line 88, the strap jumper 90, the metal source line strap 112, the pair of metal word line straps 114 and 116, the metal via 118, and the insulation material 120. The final active region memory cell structure is illustrated in FIG. 21D, and the final strap region structure is illustrated in FIG. 22D.

The advantage of this embodiment is that the contact hole depths for contacts 86/102 that reach down to metal blocks 168 and poly blocks 72 (in both the active and isolation regions 17/24) are similar, which facilitates contact hole etching and subsequent processing.

Sixth Alternate Embodiment

FIGS. 23A to 23S and 24A to 24S illustrate a sixth alternate process for forming the memory cell structure similar to that illustrated in FIG. 3Y, which utilizes a dummy liner in the first trenches 26. This sixth alternate process begins with the same structure as shown in FIGS. 3E and 4E.

Figure 23A:
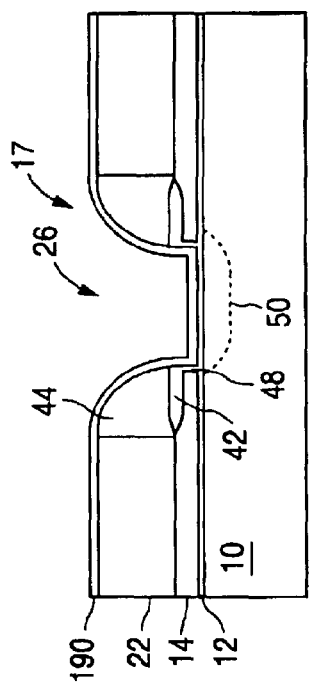
FIGS. 23A–23S are cross sectional views taken along the line 2—2 illustrating in sequence the steps in a sixth alternate processing of the structure shown in FIG. 3E to form the active and peripheral regions of the non volatile memory cell array of the present invention.

An oxidation step is performed, where in the active region 17, the sides of polysilicon layer 14 and the substrate surface that are exposed inside trenches 26 are oxidized to form oxide side walls 48 on the sides of poly layer 14 and to reform oxide layer 12 over the substrate 10 exposed inside trenches 26, as shown in FIG. 23A. A liner oxide layer 190 is then formed over the active/strap region structures (e.g. using an HTO process to form an approximately 100 Å thick oxide layer), including on sidewalls of first trench 26. Suitable ion implantation is then made across the entire surface of the structure to form the first (source) region 50 in the substrate 10 under first trenches 26. The resulting active/strap region structures are shown in FIGS. 23A/24A.

Figure 24A:
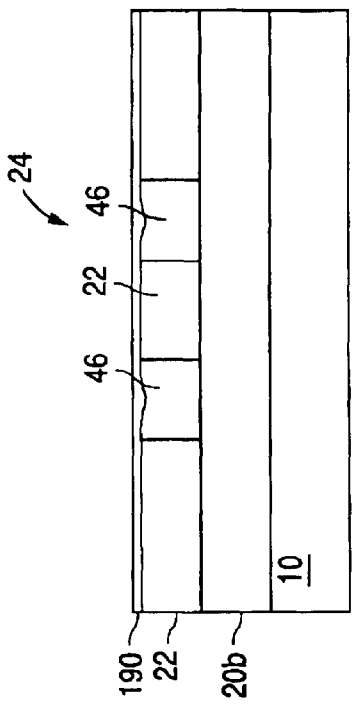
FIGS. 24A–24S are cross sectional views illustrating in sequence the steps in the sixth alternate processing of the structure shown in FIG. 4E to form the strap regions of the non volatile memory cell array of the present invention
Figure 24B:
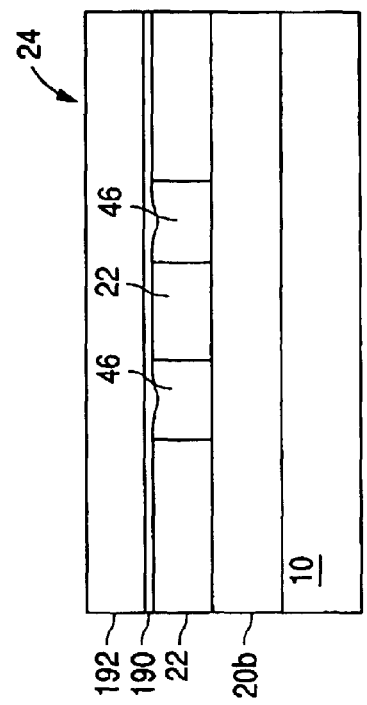
Figure 23B:
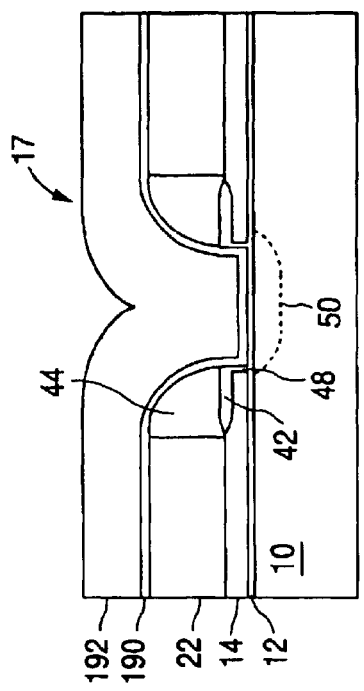
Figure 24C:
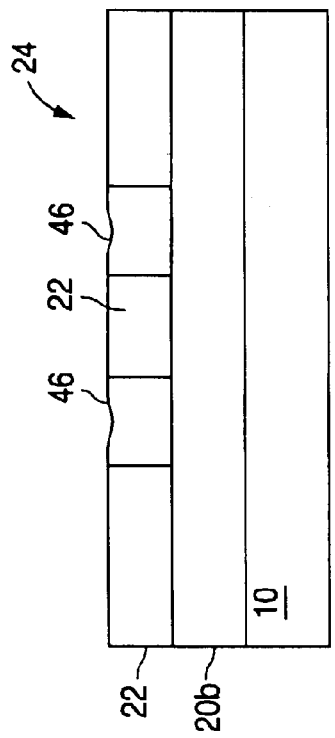
Figure 23C:
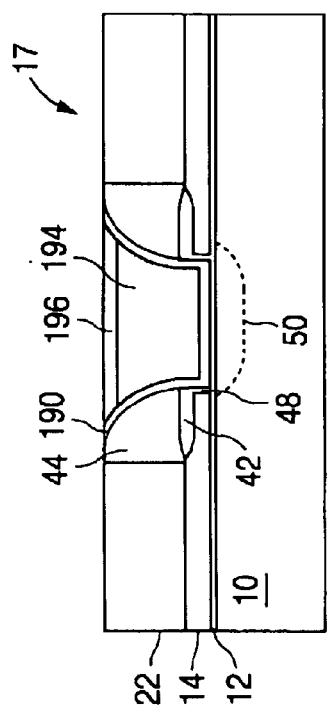

A thick poly layer is then formed over the active region 17 and strap region 24, as shown in FIGS. 23B and 24B, respectively. A poly planarization step follows (preferably CMP), which etches the poly layer 192 down even with nitride layer 22 and oxide spacers 44, leaving poly blocks 194 in first trenches 26 (in the active region 17). An optional poly etch-back step follows if necessary to clear any poly residue on nitride layer 22. Thermal oxidation is used next to form an oxide layer 196 on the exposed top surface of poly block 194. The resulting active region structure is shown in FIG. 23C, and the resulting strap region structure is shown in FIG. 24C.

Figure 24D:
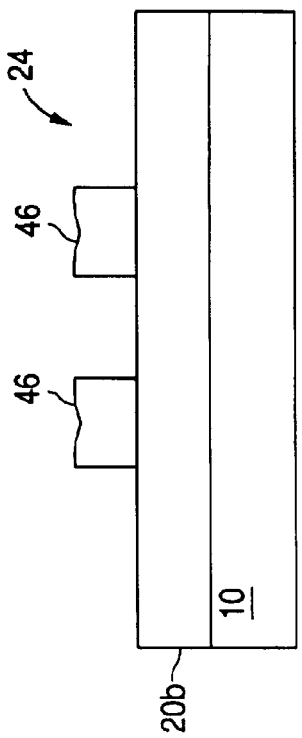
Figure 23D:
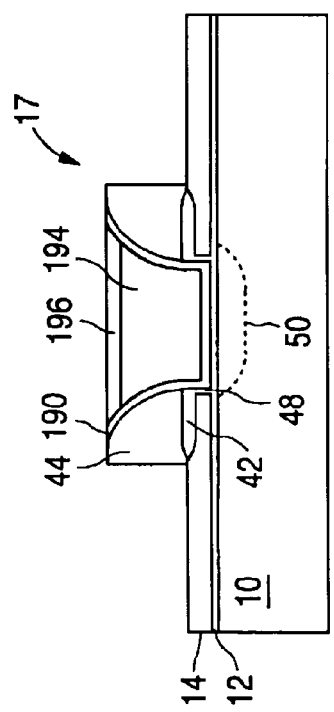
Figure 23E:
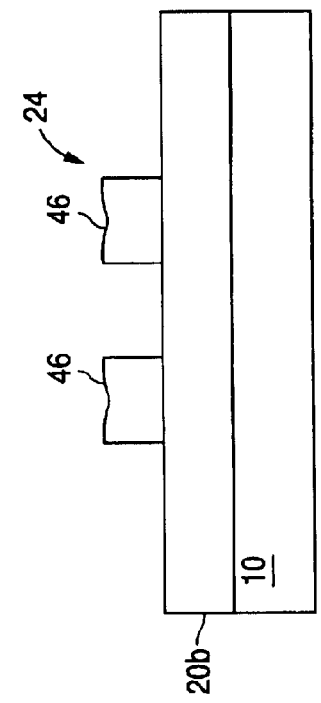
Figure 24E:
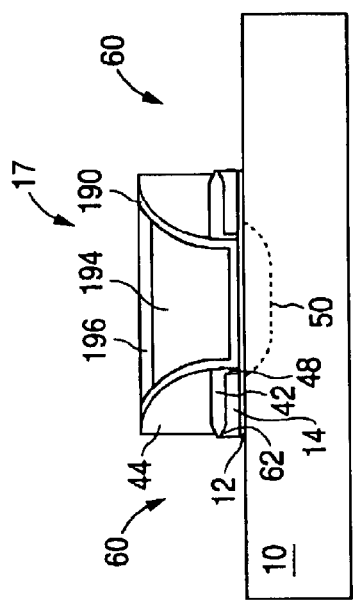

A nitride etch is then performed to remove nitride layer 22 from both the active region 17 and the strap region 24, as shown in FIGS. 23D and 24D. An anisotropic poly etch follows to remove the portion of poly layer 14 not covered by oxide spacers 44 in the active region 17 (FIG. 23E). The poly etch has no affect on the strap region 24 (FIG. 24E). The nitride and poly etch steps effectively create second trenches 60, one on either side of the mirror pair of memory cells in the active region 17, as well as upwardly projecting sharp edges 62 on side edges of poly layer 14. A controlled isotropic oxide etch is then performed, to remove exposed portions of oxide layer 12, and to remove a small portion of spacers 44 directly over the sharp edges 62. This oxide etch has a negligible effect on the strap region 24. The resulting structure is shown in FIGS. 23E and 24E.

Figure 23F:
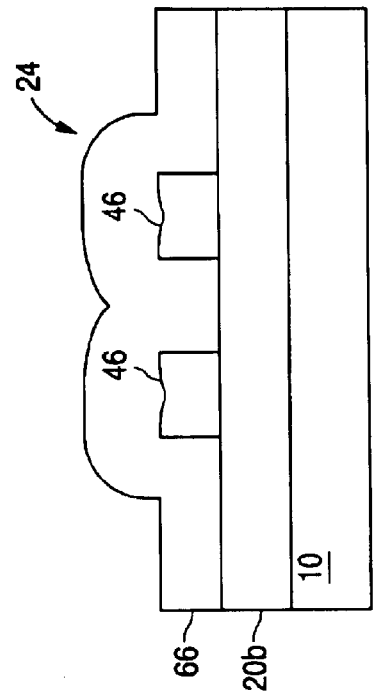
Figure 24F:
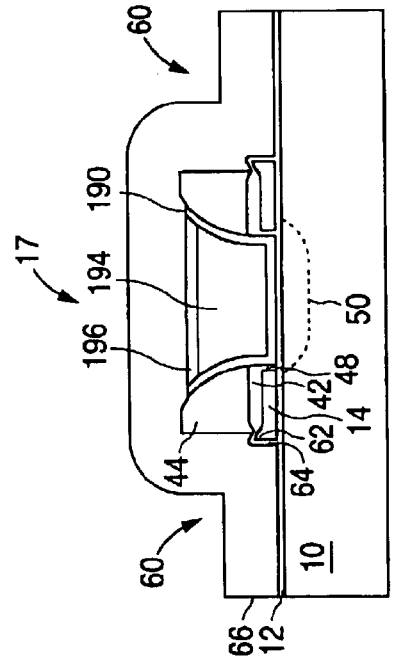

The next step is a thermal oxidation process, which forms an oxide layer 64 on the exposed ends of poly layer 14 (strap region 24 unaffected). Oxide layer 64 joins with oxide layer 42 in forming an insulation layer that is disposed laterally adjacent to and over the polysilicon layer 14. The sharp edges 62 and the thickness of the insulation layer formed by oxide layers 64/42, permit Fowler-Nordheim tunneling of charges therethrough. The oxidation process also re-forms oxide layer 12 over the exposed portions of the substrate 10. The deposition of a thick poly layer 66 over the active region and strap region structure follows, as illustrated in FIGS. 23F and 24F.

As shown starting with FIG. 23G, the peripheral region 130 is preferably separated from one of the active regions 17 by an isolation region 132 (such as STI isolation as described above) formed in the substrate 10. Poly layer 66 formed over the active region 17 extends over the peripheral region 130. A thick layer of dielectric material 198 (e.g. BSG layer of ~1500 Å thickness) is then formed over the structure, as shown in FIGS. 23G and 24G.

The BSG layer 198 is planarized (using BSG etch back with poly layer 66 as an etch stop), which exposes portions of poly layer 66 (adjacent the partially formed mirror pair of memory cells in the active regions 17 and adjacent to the oxide blocks 46 in the strap regions 24), as shown in FIGS. 23H and 24H. A controlled poly etch follows, which removes exposed portions of the poly layer 66, and forms semi-recessed trenches 200 adjacent to oxide spacers 44 in the active regions 17 and adjacent to oxide blocks 46 in the strap regions 24. This poly etch leaves poly block 72 between oxide blocks 46 in the strap regions 24. The resulting structure is shown in FIGS. 23I and 24I.

A layer of nitride 202 is deposited over the structure, which fills the semi-recessed trenches 200, as shown in FIGS. 23J and 24J. A nitride etch is used to remove nitride layer 202, except for those portions in the semi-recessed trenches 200, as illustrated in FIGS. 23K and 24K. As will become evident below, the remaining portions of nitride layer 202 in the active regions 17 are self aligned to the portions of poly layer 66 that will constitute the control gates of the memory cells.

A BSG etch (e.g. a wet etch) is used to remove the remaining portions of the BSG layer 198, as shown in FIGS. 23L and 24L. An anisotropic (dry) poly etch is then used to remove the exposed portions of poly layer 66 (i.e. those portions not protected by nitride layer portions 202), leaving poly blocks 144 adjacent the oxide blocks 44 (in active region 17) and poly blocks 146 adjacent oxide blocks 46 (in strap region 24), as shown in FIGS. 23M and 24M.

A nitride layer 148 is formed over the active, peripheral and strap regions 17/130/24. A masking step is used to protect active and strap regions 17/24 while a nitride etch is used to remove nitride layer 148 from the peripheral region 130 only (as shown in FIGS. 23N and 24N). An optional thin oxide layer (not shown) could additionally be formed before the nitride layer 148 is formed. Once the masking material is removed, a well region 150 is formed in the peripheral region 130 of substrate 10 by masking the structure except for the peripheral region 130, and performing suitable ion implantation through oxide layer 12 (i.e. well implant, punch through implant and $V_t$ implant) to form one or more well regions 150 as shown in FIG. 23N. The well region 150 is N type, for P-channel MOSFET transistors. Similar masking steps can be performed to form other types of wells (e.g. P type) for N-channel MOSFET transistors through conventional IC practice that well known in the art.

After the masking material is removed, logic devices 172 are formed in the peripheral regions using similar processing steps as described above with respect to FIGS. 3Q to 3U, namely the oxide etch to remove the exposed portion of oxide layer 12 from the peripheral region 130, the gate oxide layer 152 formation, the polysilicon deposition, the photo resist formation, the masking step and dry poly etch to form poly blocks 158, the new photo resist masking step to cover peripheral region 130 and the poly etch to remove polysilicon residue, the thermal oxidation step to form the oxide layers 162 on the exposed side portions of poly blocks 158, the ion implantation to form source and drain regions (third and fourth regions) 122/124 in the well region 150, the nitride etch to remove nitride layer 148, the nitride deposition with an anisotropic nitride etch to form spacers 164 against vertical portions of poly blocks 144/146 and against oxide layer 162 (adjacent poly blocks 158), the masking of the PFETs 172 in the peripheral region 130 and the ion implantation to form the second regions 78 and the source/drain regions of the NMOSFETs, the masking of the active and strap regions 17/24 and the thin anisotropic oxide etch to remove exposed portions of oxide layer 152, and the metal deposition and anneal step to form salicide regions 80 and polycide regions 82 in the peripheral region 130. After the residual metal and masking material is removed, the resulting structure is shown in FIGS. 23O and 24O.

The thick oxide layer 166 (e.g. PECVD oxide) is deposited over the structure, followed by an oxide planarization step (preferably CMP), which etches the oxide layer 166 down even with the top surfaces of nitride layer 202, and removes oxide layer 196 to expose poly block 194 underneath, as shown in FIGS. 23P and 24P.

The poly block 194 is then removed from first trench 26 using a conventional wet or dry poly etch process, as shown in FIG. 23Q. An anisotropic oxide etch follows, which removes oxide layers 190 and 12 from the bottom of first trench 26 (exposing substrate 10), and leaving portions of liner oxide layer 190 as spacers 191 on the sidewalls of first trench 26. A protection mask can be used to protect the strap region 24 during this etch process. A layer of TiN material 170 is preferably deposited over the structure, followed by the deposition of a thick layer of conductive metal (e.g. such as aluminum or tungsten). A metal planarization step follows (e.g. CMP), which etches the metal layer down even with the top surface of the first trenches 26, leaving blocks 168 of conductive metal in first trenches 26. An etch back process is preferably made to recess the TiN layer and the metal blocks 168 below the level of nitride layer 202. The strap regions 24 remain essentially unaffected. The resulting structure is shown in FIGS. 23R and 24R.

The remaining processing steps described above with respect to FIG. 3Y are performed to result in the final structure shown in FIGS. 23S and 24S. This embodiment uses dummy oxide layer 190 and dummy poly layer 194 which allows the metal block 168 to be formed much later in the process. In manufacturing, polysilicon is a mature processing material, which is ideal for making and later removing poly layer 194.

It is to be understood that the present invention is not limited to the embodiments described above and illustrated herein, but encompasses any and all variations falling within the scope of the appended claims. For example, although the foregoing method describes the use of appropriately doped polysilicon as the conductive material used to form the memory cell control gates, it should be clear to those having ordinary skill in the art that any appropriate conductive material can be used. In addition, any appropriate insulator can be used in place of silicon dioxide or silicon nitride. Moreover, any appropriate material whose etch property differs from silicon dioxide (or any insulator) and from polysilicon (or any conductor) can be used in place of silicon nitride. Further, as is apparent from the claims, not all method steps need be performed in the exact order illustrated or presented in the claims, but rather in any order that allows the proper formation of the memory cell of the present invention. Moreover, the masks shown and described herein are used in a positive masking step processes, where the material under the photo resist exposed to light via the patterned mask aperture 31 is eventually removed. However, negative photo resist processes are known and usable with the present invention, where the material under the photo resist not exposed to light via the patterned mask aperture is eventually removed. With such negative photo resist processes, the masks are reversed, where the opaque mask material replaces the transparent apertures, and vice versa. Source and drain regions, and/or source and bit lines, can be swapped. It should be understood that while the figures show the substrate uniformly doped, it is well known that any and/or all of the regions formed therein (source, drain, channel region, well region 150, etc.) can be formed in one or more well regions (of differently doped silicon). Finally, the strap cell method and design of the present invention is applicable to any type or design of memory cell array having lines of polysilicon extending along and connected to rows or columns of memory cells.

What is claimed is:

1. An array of electrically programmable and erasable memory devices comprising:
   a substrate of semiconductor material of a first conductivity type;
   spaced apart isolation regions formed on the substrate which are substantially parallel to one another and extend in a first direction, with an active region between each pair of adjacent isolation regions;
   each of the active regions including a plurality of memory cells, each of the memory cells including:
      first and second spaced apart regions in the substrate having a second conductivity type, with a channel region defined in the substrate therebetween,
      an electrically conductive floating gate disposed over and insulated from a portion of the channel region, and
      an electrically conductive control gate disposed over and insulated from a portion of the channel region;
   a plurality of source line blocks of metal material each extending across the active regions and isolation regions in a second direction substantially perpendicular to the first direction, wherein each of the source line blocks extends over and is electrically connected to one of the first regions in each of the active regions;
   a first plurality of parallel spaced apart lines of conductive material formed over the substrate and electrically connected to the control gates of the memory cells;
   a plurality of strap regions each formed on the substrate and disposed in an interlaced fashion between selected ones of the active regions, each of the strap regions including:
      first strap cells through which the first plurality of conductive material lines traverse, wherein the first plurality of conductive material lines completely traverse across the strap region,
      a first plurality of conductive metal contacts each of which is connected to one of the first plurality of conductive material lines in one of the first strap cells,
      second strap cells in which the source line blocks terminate without completely traversing across the strap region, and
      a second plurality of conductive metal contacts each of which is connected to one of the source line blocks in one of the second strap cells.

2. An array of electrically programmable and erasable memory devices comprising:
   a substrate of semiconductor material of a first conductivity type;
   spaced apart isolation regions formed on the substrate which are substantially parallel to one another and extend in a first direction, with an active region between each pair of adjacent isolation regions;
   each of the active regions including a plurality of memory cells, each of the memory cells including:
      first and second spaced apart regions in the substrate having a second conductivity type, with a channel regions defined in the substrate therebetween,
      an electrically conductive floating gate disposed over and insulated from a portion of the channel region, and
      an electrically conductive control gate disposed over and insulated from a portion of the channel region;
   a plurality of source line blocks of metal material each extending across the active regions and isolation regions in a second direction substantially perpendicular to the first direction, wherein each of the source line blocks extends over and is electrically connected to one of the first regions in each of the active regions;
   wherein for each of the memory cells, the control gate includes:
      a first portion disposed laterally adjacent to and insulated from the floating gate, a second portion extending over and insulated from a portion of the floating gate, and a substantially planar sidewall portion.

3. The array of claim 2, wherein each of the memory cells includes a conductive layer of TiN disposed between the first region and the source line block electrically connected thereto.

4. The array of claim 2, wherein each of the memory cells further comprises:

a conductive contact electrically connected to the second region, wherein the conductive contact includes a first portion disposed laterally adjacent to and insulated from the planar sidewall portion of the control gate, and a second portion disposed over and insulated from at least a portion of the control gate.

5. The array of claim 2, wherein each of the memory cells further comprises:

a layer of metalized silicon formed on the second region; and a layer of metalized polysilicon formed on a top surface of the control gate.

6. An array of electrically programmable and erasable memory devices comprising:

a substrate of semiconductor material of a first conductivity type;

spaced apart isolation regions formed on the substrate which are substantially parallel to one another and extend in a first direction, with an active region between each pair of adjacent isolation regions; and each of the active regions including a plurality of pairs of memory cells, each of the memory cell pairs including:

a first region and a pair of second regions spaced apart in the substrate having a second conductivity type, with channel regions defined in the substrate between the first region and the second regions, a pair of electrically conductive floating gates each disposed over and insulated from a portion of one of the channel regions, and a pair of electrically conductive control gates each disposed over and insulated from a portion of one of the channel regions; and a plurality of source line blocks of metal material each extending across the active regions and isolation regions in a second direction substantially perpendicular to the first direction, wherein each of the source line blocks extends over and is electrically connected to one of the first regions in each of the active regions.

7. The array of claim 6, wherein each of the memory cell pairs includes a conductive layer of TiN disposed between the first region and the source line block electrically connected thereto.

8. An array of electrically programmable and erasable memory devices comprising:

a substrate of semiconductor material of a first conductivity type;

spaced apart isolation regions formed on the substrate which are substantially parallel to one another and extend in a first direction, with an active region between each pair of adjacent isolation regions;

each of the active regions including a plurality of pairs of memory cells, each of the memory cell pairs including:

a first region and a pair of second regions spaced apart in the substrate having a second conductivity type, with channel regions defined in the substrate between the first region and the second regions, a pair of electrically conductive floating gates each disposed over and insulated from a portion of one of the channel regions, and a pair of electrically conductive control gates each disposed over and insulated from a portion of one of the channel regions;

a plurality of source line blocks of metal material each extending across the active regions and isolation regions in a second direction substantially perpendicular to the first direction, wherein each of the source line blocks extends over and is electrically connected to one of the first regions in each of the active regions;

a first plurality of parallel spaced apart lines of conductive material formed over the substrate and electrically connected to the control gates of the memory cells;

a plurality of strap regions each formed on the substrate and disposed in an interlaced fashion between selected ones of the active regions, each of the strap regions including:

first strap cells through which the first plurality of conductive material lines traverse, wherein the first plurality of conductive material lines completely traverse across the strap region, a first plurality of conductive metal contacts each of which is connected to one of the first plurality of conductive material lines in one of the first strap cells, second strap cells in which the source line blocks terminate without completely traversing across the strap region, and a second plurality of conductive metal contacts each of which is connected to one of the source line blocks in one of the second strap cells.

9. An array of electrically programmable and erasable memory devices comprising:

a substrate of semiconductor material of a first conductivity type;

spaced apart isolation regions formed on the substrate which are substantially parallel to one another and extend in a first direction, with an active region between each pair of adjacent isolation regions;

each of the active regions including a plurality of pairs of memory cells, each of the memory cell pairs including:

a first region and a pair of second regions spaced apart in the substrate having a second conductivity type, with channel regions defined in the substrate between the first region and the second regions, a pair of electrically conductive floating gates each disposed over and insulated from a portion of one of the channel regions, and a pair of electrically conductive control gates each disposed over and insulated from a portion of one of the channel regions;

a plurality of source line blocks of metal material each extending across the active regions and isolation regions in a second direction substantially perpendicular to the first direction, wherein each of the source line blocks extends over and is electrically connected to one of the first regions in each of the active regions;

wherein for each of the memory cell pairs, the control gates each include:

a first portion disposed laterally adjacent to and insulated from one of the floating gates, a second portion extending over and insulated from a portion of the one floating gate, and a substantially planar sidewall portion.

10. The array of claim 9, wherein each of the memory cell pairs further comprises:
- a pair of conductive contacts each electrically connected to one of the second regions, wherein each of the conductive contacts includes a first portion disposed laterally adjacent to and insulated from the planar sidewall portion of one of the control gates, and a second portion disposed over and insulated from at least a portion of the one control gate.

11. The array of claim 9, wherein each of the memory cell pairs further comprises:
- a layer of metalized silicon formed on each of the second regions; and
- a layer of metalized polysilicon formed on a top surface of each of the control gates.

12. An array of electrically programmable and erasable memory devices comprising:
- a substrate of semiconductor material of a first conductivity type;
- spaced apart isolation regions formed on the substrate which are substantially parallel to one another and extend in a first direction, with an active region between each pair of adjacent isolation regions;
- each of the active regions including a plurality of pairs of memory cells, each of the memory cell pairs including:
  - a first region and a pair of second regions spaced apart in the substrate having a second conductivity type, with channel regions defined in the substrate between the first region and the second regions,
  - a pair of electrically conductive floating gates each disposed over and insulated from a portion of one of the channel regions, and
  - a pair of electrically conductive control gates each disposed over and insulated from a portion of one of the channel regions; and
- a plurality of source line blocks of material each extending across the active regions and isolation regions in a second direction substantially perpendicular to the first direction, wherein each of the source line blocks:
  - extends over and is electrically connected to one of the first regions in each of the active regions, and
  - comprises a polysilicon layer of material and a metalized polysilicon layer of material.

13. The array of claim 12, wherein for each of the memory cell pairs, the source line block connected thereto extends from the first region to a height above the substrate that exceeds a height above the substrate of the control gates.

* * * * *